(12) United States Patent
Wennerstrom et al.

(10) Patent No.: US 11,817,254 B2
(45) Date of Patent: Nov. 14, 2023

(54) MAGNETIC PHASE ISOLATING HARMONIC FILTER FOR MULTI-PHASE POWER APPARATUS AND METHOD OF USE THEREOF

(71) Applicants: Hans Wennerstrom, Scottsdale, AZ (US); Grant A. MacLennan, Tempe, AZ (US)

(72) Inventors: Hans Wennerstrom, Scottsdale, AZ (US); Grant A. MacLennan, Tempe, AZ (US)

(*) Notice: Subject to any disclaimer, the term of this patent is extended or adjusted under 35 U.S.C. 154(b) by 436 days.

(21) Appl. No.: 17/235,733

(22) Filed: Apr. 20, 2021

(65) Prior Publication Data

US 2021/0241965 A1 Aug. 5, 2021

Related U.S. Application Data

(63) Continuation-in-part of application No. 16/727,861, filed on Dec. 26, 2019, which is a
(Continued)

(51) Int. Cl.
| | |
|---|---|
| *H05K 7/20* | (2006.01) |
| *H01F 27/28* | (2006.01) |
| *H01F 27/32* | (2006.01) |
| *H01F 27/10* | (2006.01) |
| *H01F 27/255* | (2006.01) |
| *H01F 27/08* | (2006.01) |
| *H02M 1/12* | (2006.01) |
| *H01F 27/30* | (2006.01) |
| *H01F 7/00* | (2006.01) |
| *H01F 27/26* | (2006.01) |

(Continued)

(52) U.S. Cl.
CPC .......... *H01F 27/2895* (2013.01); *H01F 7/00* (2013.01); *H01F 27/085* (2013.01); *H01F 27/10* (2013.01); *H01F 27/255* (2013.01); *H01F 27/266* (2013.01); *H01F 27/2823* (2013.01); *H01F 27/2876* (2013.01); *H01F 27/306* (2013.01); *H01F 27/324* (2013.01); *H02M 1/126* (2013.01); *H01F 1/24* (2013.01); *H01F 27/08* (2013.01); *H01G 4/38* (2013.01); *H01G 4/40* (2013.01); *H02M 1/123* (2021.05); *H03H 7/01* (2013.01); *Y02B 70/10* (2013.01)

(58) Field of Classification Search
CPC ............ G01D 5/3473; G01D 5/34792; G01D 5/34715; H02K 11/22
See application file for complete search history.

(56) References Cited

U.S. PATENT DOCUMENTS

2009/0109713 A1\* 4/2009 Schnetzka ........... H02M 5/4585
361/699

\* cited by examiner

*Primary Examiner* — Muhammad S Islam
(74) *Attorney, Agent, or Firm* — Kevin H. Hazer; Hazer Patent Group, LLC

(57) ABSTRACT

The invention comprises a harmonic filter apparatus and method of use thereof for magnetically isolating and filtering individual phases of three-phase power comprising a delta circuit that includes: (1) a first leg connecting to a second leg and a third leg and (2) first circuitry on the first leg matching second circuitry on the second leg, the first circuitry comprising at least two contactors electrically wired in parallel, the harmonic filter magnetically isolating individual phases of three-phase power, where inductor—coupled inductor pairs couple apexes of the delta circuit to individual phases of the three-phase power.

18 Claims, 55 Drawing Sheets

Related U.S. Application Data continuation-in-part of application No. 16/540,025, filed on Aug. 13, 2019, now Pat. No. 11,139,103, which is a continuation of application No. 15/635,113, filed on Jun. 27, 2017, now Pat. No. 10,535,462, which is a continuation-in-part of application No. 14/987,675, filed on Jan. 4, 2016, now Pat. No. 10,594,206, which is a continuation-in-part of application No. 14/260,014, filed on Apr. 23, 2014, now Pat. No. 9,590,486, and a continuation-in-part of application No. 13/954,887, filed on Jul. 30, 2013, now Pat. No. 9,257,895, which is a continuation-in-part of application No. 13/470,281, filed on May 12, 2012, now Pat. No. 8,902,034, which is a continuation-in-part of application No. 13/107,828, filed on May 13, 2011, now Pat. No. 8,373,530, which is a continuation-in-part of application No. 12/098,880, filed on Apr. 7, 2008, now Pat. No. 7,973,628.

(60) Provisional application No. 60/910,333, filed on Apr. 5, 2007.

(51) Int. Cl.
*H01F 1/24* (2006.01)
*H01G 4/40* (2006.01)
*H01G 4/38* (2006.01)
*H03H 7/01* (2006.01)

FIG. 62A  FIG. 62B  FIG. 62C

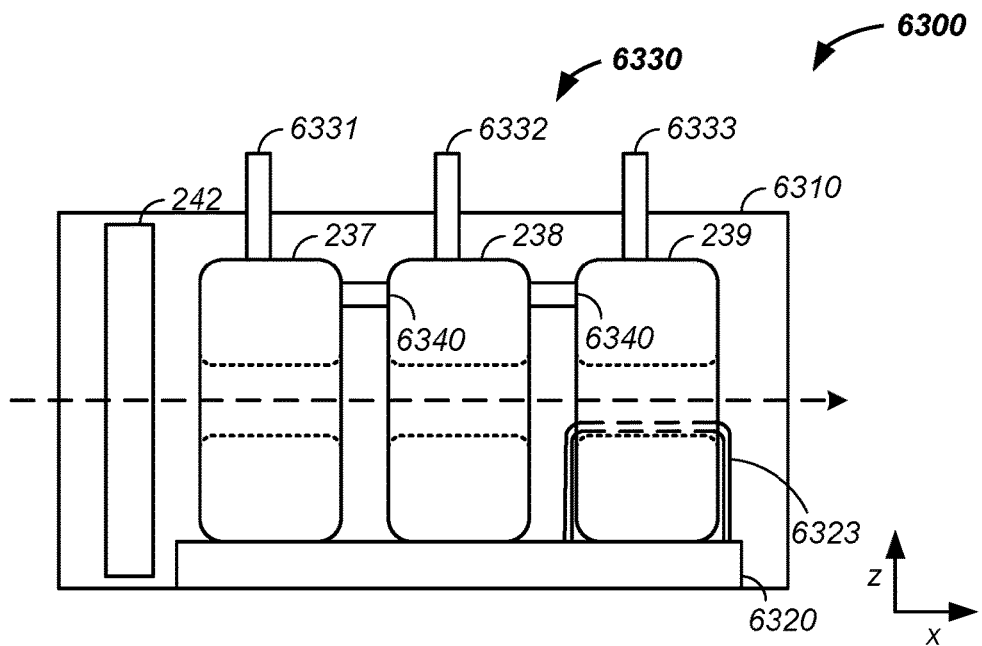
FIG. 63B
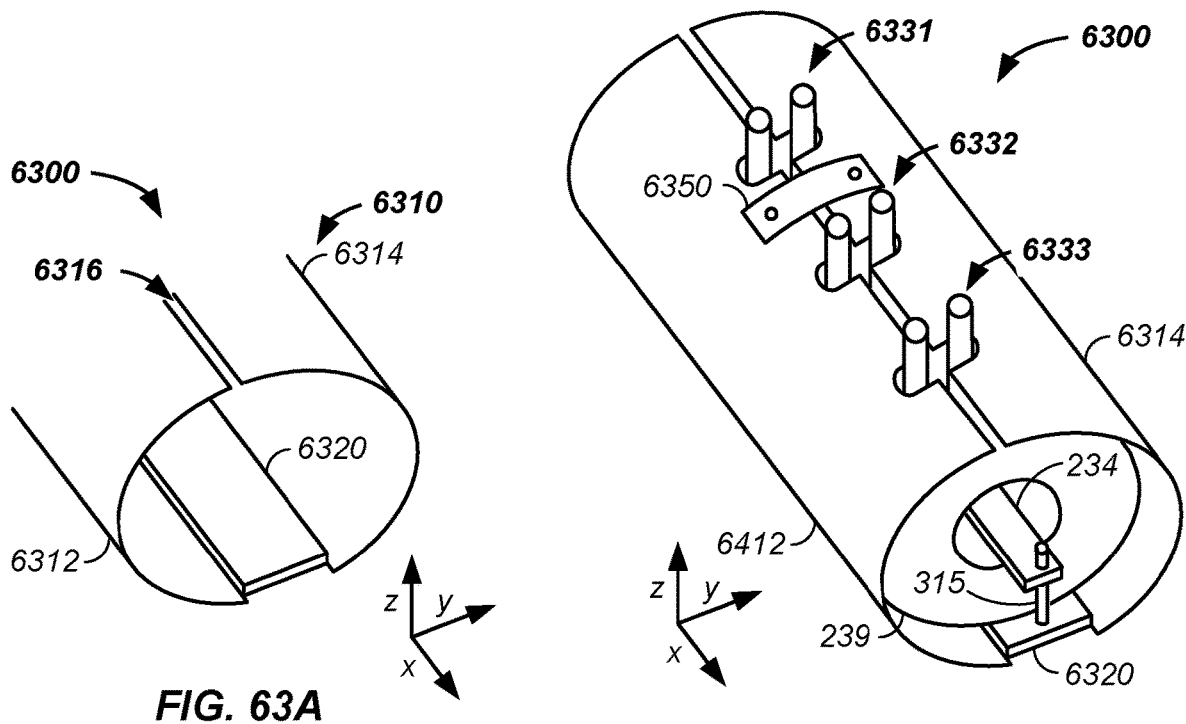
FIG. 63A
FIG. 63C

MAGNETIC PHASE ISOLATING HARMONIC FILTER FOR MULTI-PHASE POWER APPARATUS AND METHOD OF USE THEREOF

CROSS REFERENCES TO RELATED APPLICATIONS

This application is a continuation-in-part of U.S. patent application Ser. No. 16/727,861, filed Dec. 26, 2019, which is a continuation-in-part of U.S. patent application Ser. No. 16/540,025 filed Aug. 13, 2019, which is a continuation of U.S. patent application Ser. No. 15/635,113 filed Jun. 27, 2017, which is a continuation-in-part of U.S. patent application Ser. No. 14/987,675 filed Jan. 4, 2016, which is:
   a continuation-in-part of U.S. patent application Ser. No. 14/260,014 filed Apr. 23, 2015; and
   a continuation-in-part of U.S. patent application Ser. No. 13/954,887 filed Jul. 30, 2013, which is a continuation-in-part of U.S. patent application Ser. No. 13/470,281 filed May 12, 2012, which is a continuation-in-part of U.S. patent application Ser. No. 13/107,828 filed May 13, 2011, which is a continuation-in-part of U.S. patent application Ser. No. 12/098,880 filed Apr. 4, 2008, which claims benefit of U.S. provisional patent application No. 60/910,333 filed Apr. 5, 2007, all of which are incorporated herein in their entirety by this reference thereto.

BACKGROUND OF THE INVENTION

Field of the Invention

The invention relates to a magnetic phase isolating harmonic filter for processing multi-phase power.

Discussion of the Prior Art

Power is generated from a number of sources. The generated power is necessarily converted, such as before entering the power grid or prior to use. In many industrial applications, electromagnetic components, such as inductors and capacitors, are used in power filtering. Important factors in the design of power filtering methods and apparatus include cost, size, signal, noise, efficiency, resonant points, inductor impedance, inductance at desired frequencies, and/or inductance capacity.

For example, when a metal-oxide-semiconductor field-effect transistor (MOSFET) or an insulated gate bipolar transistor (IGBT) switches at high frequencies, output from the inverter going to a motor now has substantial frequencies in the 50-100 kHz range. The power cables exiting the drive or inverter going to a system load using standard industrial power cables were designed for 60 Hz current. When frequencies in the 50-100 kHz range are added to the current spectrum, the industrial power cables overheat because of the high frequency travels only on the outside diameter of the conductor causing a severe increase in AC resistance of the cable and resultant overheating of the cables and any associated device, such as a motor.

What is needed is a more efficient electrical filter apparatus and method of use thereof.

SUMMARY OF THE INVENTION

The invention comprises a magnetic phase isolating harmonic filter apparatus and method of use thereof.

BRIEF DESCRIPTION OF THE DRAWINGS

A more complete understanding of the present invention is derived by referring to the detailed description and described embodiments when considered in connection with the following illustrative figures. In the following figures, like reference numbers refer to similar elements and steps throughout the figures.

FIG. 62A illustrates a first winding sub-element/connector, FIG. 62B and FIG. 62C illustrate a second winding sub-element/wrap.

FIG. 63A illustrates a multi-inductor tube and FIG. 63B and FIG. 63C illustrate multiple inductors in the multi-inductor tube.

Figure 1A:
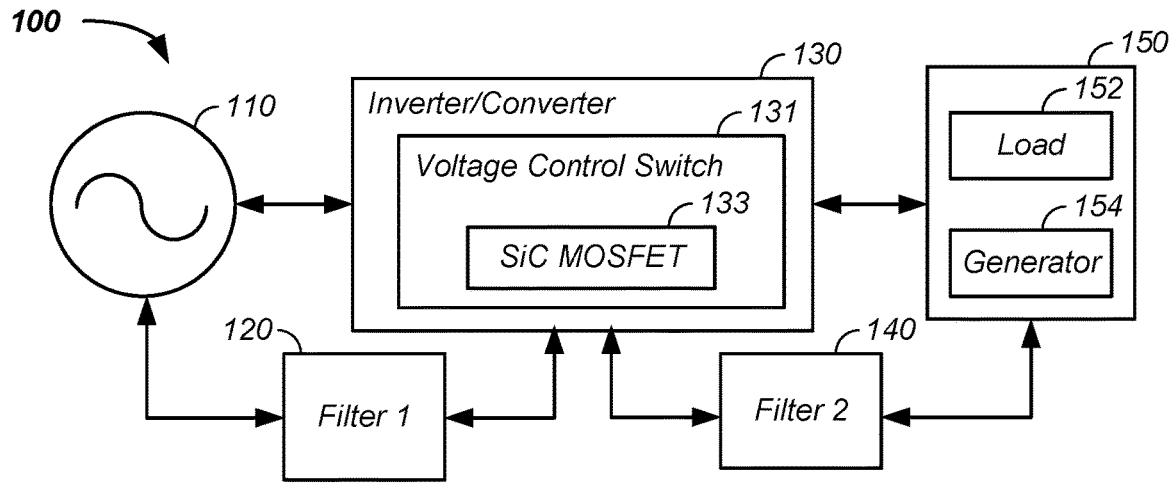
FIG. 1A illustrates a power filtering process.

Elements and steps in the figures are illustrated for simplicity and clarity and have not necessarily been rendered according to any particular sequence. For example, steps that are performed concurrently or in different order are illustrated in the figures to help improve understanding of embodiments of the present invention.

DETAILED DESCRIPTION OF EXEMPLARY EMBODIMENTS

The invention comprises a harmonic filter apparatus and method of use thereof for magnetically isolating and filtering individual phases of three-phase power comprising a delta circuit that includes: (1) a first leg connecting to a second leg and a third leg and (2) first circuitry on the first leg matching second circuitry on the second leg, the first circuitry comprising at least two contactors electrically wired in parallel, the harmonic filter magnetically isolating individual phases of three-phase power, where inductor—coupled inductor pairs couple apexes of the delta circuit to individual phases of the three-phase power.

The inductor is optionally used to filter/invert/convert power. The inductor optionally comprises a distributed gap core and/or a powdered core material. In one example, the minimum carrier frequency is above that usable by an iron-steel inductor, such as greater than ten kiloHertz at fifty or more amperes. Optionally, the inductor is used in an inverter/converter apparatus, where output power has a carrier frequency, modulated by a fundamental frequency, and a set of harmonic frequencies, in conjunction with a notched low-pass filter, a low pass filter combined with a notch filter and a high frequency roll off filter, and/or one or more of a silicon carbide, gallium arsenide, and/or gallium nitride based transistor.

In another example, the inductor is an element of an inductor-capacitor filter, where the filter comprises: an inductor with a distributed gap core and/or a powdered core in a notch filter circuit, such as a notched low-pass filter or a low pass filter combined with a notch filter and a high frequency roll off filter. The resulting distributed gap inductor based notch filter efficiently passes a carrier frequency of greater than 700, 800, or 1000 Hz while still sufficiently attenuating a fundamental frequency at 1500, 2000, or 2500 Hz, which is not achievable with a traditional steel based inductor due to the physical properties of the steel at high currents and voltages, such as at fifty or more amperes.

In another example, the inductor is used to filter/convert power, where the inductor comprises a distributed gap core and/or a powdered core. The inductor core is wound with one or more turns, where multiple turns are optionally electrically wired in parallel. In one example, a minimum carrier frequency is above that usable by traditional inductors, such as a laminated steel inductor, an iron-steel inductor, and/or a silicon steel inductor, for at least fifty amperes at at least one kHz, as the carrier frequency is the resonant point of the inductor and harmonics are thus not filtered using the iron-steel inductor core. In stark contrast, the distributed gap core allows harmonic removal/attenuation at greater than ten kiloHertz at fifty or more amperes. The core is optionally an annular core, a toroid core, a rod-shaped core, a straight core, a single core, or a core used for multiple phases, such as a 'C' or 'E' core. Herein, an annular core optionally refers to a doughnut shaped core. Optionally, the inductor is used in an inductor/converter apparatus, where output power has a carrier frequency, modulated by a fundamental frequency, and a set of harmonic frequencies, in conjunction with one or more of a silicon carbide, gallium arsenide, and/or gallium nitride based transistor, such as a metal-oxide-semiconductor field-effect transistor (MOSFET).

In yet another embodiment, an inverter and/or an inverter converter system yielding high frequency harmonics, referred to herein as a high frequency inverter, is coupled with a high frequency filter to yield clean power, reduced high frequency harmonics, and/or an enhanced energy processing efficiency system. In one case, a silicon carbide metal-oxide-semiconductor field-effect transistor (MOSFET) is used in the conversion of power from the grid and the MOSFET outputs current, voltage, energy, and/or high frequency harmonics greater than 60 Hz to an output filter, such as a distributed gap inductor, which filters the output of the MOSFET. In one illustrative example, a high frequency inductor and/or converter apparatus is coupled with a high frequency filter system, such as an inductor linked to a capacitor, to yield non-sixty Hertz output. In another illustrative example, an inductor/converter apparatus using a silicon carbide transistor outputs power having a carrier frequency, modulated by a fundamental frequency, and a set of harmonic frequencies. A filter, comprising the potted inductor having a distributed gap core material and optional magnet wires, receives power output from the inverter/converter and processes the power by passing the fundamental frequency while reducing amplitude of the harmonic frequencies.

In another embodiment, a high frequency inverter/high frequency filter system is used in combination with a distributed gap inductor, optionally for use with medium voltage power, apparatus and method of use thereof, is provided for processing harmonics from greater than 60, 65, 100, 1950, 2000, 4950, 5000, 6950, 7000, 10,000, 50,000, and/or 100,000 Hertz.

In another embodiment, an inductor-capacitor filter comprises: an inductor with a distributed gap core and/or a powdered core in a notch filter circuit, such as a notched low-pass filter or a low pass filter combined with a notch filter and a high frequency roll off filter. The resulting distributed gap inductor based notch filter efficiently passes a carrier frequency of greater than 700, 800, or 1000 Hz while still sufficiently attenuating a fundamental frequency at 1500, 2000, or 2500 Hz, which is not achievable with a traditional steel based inductor due to the physical properties of the steel at high currents and voltages, such as at fifty or more amperes.

In yet still another embodiment, a high frequency inverter/high frequency filter system is used in combination with an inductor mounting and cooling system.

In still yet another embodiment, a high frequency inverter/high frequency filter system is used in combination with a distributed gap material used in an inductor couple with an inverter and/or converter.

Methods and apparatus according to various embodiments preferably operate in conjunction with an inductor and/or a capacitor. For example, an inverter/converter system using at least one inductor and at least one capacitor optionally mounts the electromagnetic components in a vertical format, which reduces space and/or material requirements. In another example, the inductor comprises a substantially toroidal or annular core and a winding. The inductor is preferably configured for high current applications, such as at or above about 50, 100, or 200 amperes; for medium voltage power systems, such as power systems operating at about 2,000 to 5,000 volts; and/or to filter high frequencies, such as greater than about 60, 100, 1000, 2000, 3000, 4000, 5000, or 9000 Hz. In yet another example, a capacitor array is preferably used in processing a provided power supply. Optionally, the high frequency filter is used to selectively pass higher frequency harmonics.

Embodiments are described partly in terms of functional components and various assembly and/or operating steps. Such functional components are optionally realized by any number of components configured to perform the specified functions and to achieve the various results. For example, embodiments optionally use various elements, materials, coils, cores, filters, supplies, loads, passive components, and/or active components, which optionally carry out functions related to those described. In addition, embodiments described herein are optionally practiced in conjunction with any number of applications, environments, and/or passive circuit elements. The systems and components described herein merely exemplify applications. Further, embodiments described herein, for clarity and without loss of generality, optionally use any number of conventional techniques for manufacturing, assembling, connecting, and/or operation. Components, systems, and apparatus described herein are optionally used in any combination and/or permutation.

Electrical System

An electrical system preferably includes an electromagnetic component operating in conjunction with an electric current to create a magnetic field, such as with a transformer, an inductor, and/or a capacitor array.

Referring now to FIG. 1A, in one embodiment, the electrical system comprises an inverter/converter system configured to output: (1) a carrier frequency, the carrier frequency modulated by a fundamental frequency, and (2) a set of harmonic frequencies of the fundamental frequency. The inverter/converter 130 system optionally includes a voltage control switch 131, such as a silicon carbide insulated gate bipolar transistor 133. Optionally power output by the inverter/converter system is processed using a downstream-circuit electrical power filter, such as an inductor and a capacitor, configured to: substantially remove the carrier frequency, pass the fundamental frequency, and reduce amplitude of a largest amplitude harmonic frequency of the set of harmonic frequencies by at least ninety percent. A carrier frequency is optionally any of: a nominal frequency or center frequency of an analog frequency modulation, phase modulation, or double-sideband suppressed-carrier transmission, AM-suppressed carrier, or radio wave. For example a carrier frequency is an unmodulated electromagnetic wave or a frequency-modulated signal.

In another embodiment, the electrical system comprises an inverter/converter system having a filter circuit, such as a low-pass filter and/or a high-pass filter. The power supply or inverter/converter comprises any suitable power supply or inverter/converter, such as an inverter for a variable speed drive, an adjustable speed drive, and/or an inverter/converter that provides power from an energy device. Examples of an energy device include an electrical transmission line, a three-phase high power transmission line, a generator, a turbine, a battery, a flywheel, a fuel cell, a solar cell, a wind turbine, use of a biomass, and/or any high frequency inverter or converter system. The term three-phase power is often used to describe a common method of alternating current power generation, transmission, and distribution and is a type of polyphase system most commonly used by electric grids worldwide to transfer power.

The electrical system described herein is optionally adaptable for any suitable application or environment, such as variable speed drive systems, uninterruptible power supplies, backup power systems, inverters, and/or converters for renewable energy systems, hybrid energy vehicles, tractors, cranes, trucks and other machinery using fuel cells, batteries, hydrogen, wind, solar, biomass and other hybrid energy sources, regeneration drive systems for motors, motor testing regenerative systems, and other inverter and/or converter applications. Backup power systems optionally include, for example, superconducting magnets, batteries, and/or flywheel technology. Renewable energy systems optionally include any of: solar power, a fuel cell, a wind turbine, hydrogen, use of a biomass, and/or a natural gas turbine.

In various embodiments, the electrical system is adaptable for energy storage or a generation system using direct current (DC) or alternating current (AC) electricity configured to backup, store, and/or generate distributed power. Various embodiments described herein are particularly suitable for high current applications, such as currents greater than about one hundred amperes (A), currents greater than about two hundred amperes, and more particularly currents greater than about four hundred amperes. Embodiments described herein are also suitable for use with electrical systems exhibiting multiple combined signals, such as one or more pulse width modulated (PWM) higher frequency signals superimposed on a lower frequency waveform. For example, a switching element may generate a PWM ripple on a main supply waveform. Such electrical systems operating at currents greater than about one hundred amperes operate within a field of art substantially different than low power electrical systems, such as those operating at low-ampere levels or at about 2, 5, 10, 20, or 50 amperes.

Various embodiments are optionally adapted for high-current inverters and/or converters. An inverter produces alternating current from a direct current. A converter processes AC or DC power to provide a different electrical waveform. The term converter denotes a mechanism for either processing AC power into DC power, which is a rectifier, or deriving power with an AC waveform from DC power, which is an inverter. An inverter/converter system is either an inverter system or a converter system. Converters are used for many applications, such as rectification from AC to supply electrochemical processes with large controlled levels of direct current, rectification of AC to DC followed by inversion to a controlled frequency of AC to supply variable-speed AC motors, interfacing DC power sources, such as fuel cells and photoelectric devices, to AC distribution systems, production of DC from AC power for subway and streetcar systems, for controlled DC voltage for speed-control of DC motors in numerous industrial applications, and/or for transmission of DC electric power between rectifier stations and inverter stations within AC generation and transmission networks.

Filtering

Referring now to FIG. 1A, a power processing system 100 is provided. The power processing system 100 operates on current and/or voltage systems. FIG. 1A figuratively shows how power is moved from a grid 110 to a load and how power is moved from a generator 154 to the grid 110 through an inverter/converter system 130. Optionally, a first filter 120 is placed in the power path between the grid 100 and the inverter/converter system 130. Optionally, a second filter 140 is positioned between the inverter/converter system 130 and a load 152 or a generator 154. The second filter 140 is optionally used without use of the first filter 120. The first filter 120 and second filter 140 optionally use any number and configuration of inductors, capacitors, resistors, junctions, cables, and/or wires.

Still referring to FIG. 1A, in a first case, power or current from the grid 110, such as an AC grid, is processed to provide current or power 150, such as to a load 152. In a second case, the current or power 150 is produced by a generator and is processed by one or more of the second filter 140, inverter/converter system 130, and/or first filter 120 for delivery to the grid 110. In the first case, a first filter 120 is used to protect the AC grid from energy reflected from the inverter/converter system 130, such as to meet or exceed IEEE 519 requirements for grid transmission. Subsequently, the electricity is further filtered, such as with the second filter 140 or is provided to the load 152 directly. In the second case, the generated power 154 is provided to the inverter/converter system 130 and is subsequently filtered, such as with the first filter 120 before supplying the power to the AC grid. Examples for each of these cases are further described, infra.

Figure 1B:
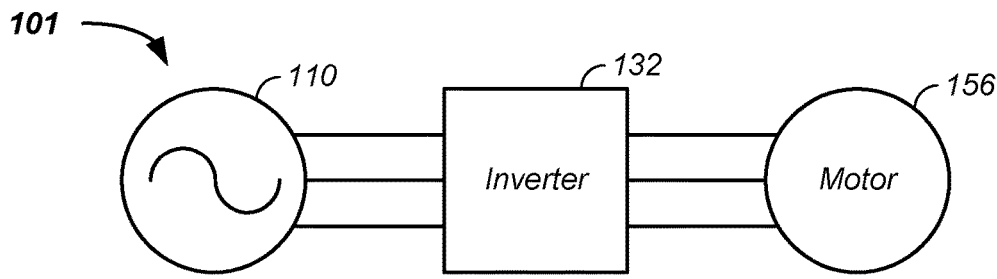
FIG. 1B illustrates a low frequency power system.

Referring now to FIG. 1B, a low frequency power processing system 101 is illustrated where power from the grid 110 is processed by a low frequency inverter 132 and the processed power is delivered to a motor 156. The low frequency power system 101 uses traditional 60 Hz/120V AC power and the low frequency inverter 132 yields output in the 30-90 Hz range, referred to herein as low frequency and/or standard frequency. If the low frequency inverter 132 outputs high frequency power, such as 60+ harmonics or higher frequency harmonics, such as about 2000, 5000, or 7000 Hz, then traditional silicon iron steel in low frequency inverters 132, low frequency inductors, and/or low frequency power lines overheat. These inductors overheat due to excessive core losses and AC resistance losses in the conductors in the circuit. The overheating is a direct result of the phenomenon known as skin loss, where the high frequencies only travel on the outside diameter of a conductor, which causes an increase in AC resistance of the cable, the resistance resultant in subsequent overheating.

Figure 1C:
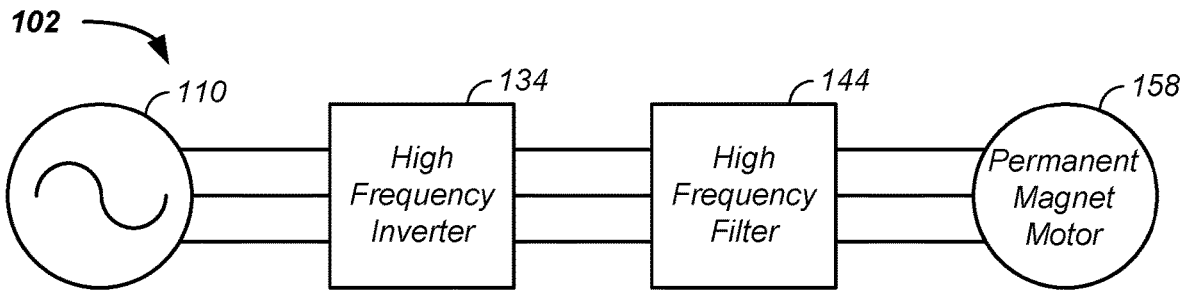
FIG. 1C illustrates a high frequency power processing system.

Referring now to FIG. 1C, a high frequency power processing system 102 is illustrated, where a high frequency filter 144 is inserted between the inverter/converter 130 and/or a high frequency inverter 134 and the load 152, motor 156, or a permanent magnet motor 158. For clarity of presentation and without limitation, the high frequency filter, a species of the second filter 140, is illustrated between a high frequency inverter 134 and the permanent magnet motor 158. The high frequency inverter 134, which is an example of the inverter converter 130, yields output power having frequencies or harmonics in the range of 2,000 to 100,000 Hz, such as at about 2000, 5000, and 7000 Hz.

In a first example, the high frequency inverter 134 is a MOSFET inverter that uses silicon carbide and is referred to herein as a silicon carbide MOSFET. In a second example, the high frequency filter 144 uses an inductor comprising at least one of: a distributed gap material, a magnetic material and a coating agent, Sendust, and/or any of the properties described, infra, in the "Inductor Core/Distributed Gap" section. In a preferred embodiment, output from the high frequency inverter 134 is processed by the high frequency filter 144 as the high frequency output filters described herein do not overheat due to the magnetic properties of the core and/or windings of the inductor and the higher frequency filter removes high frequency harmonics that would otherwise result in overheating of an electrical component. Herein, a reduction in high frequency harmonics is greater than a 20, 40, 60, 80, 90, and/or 95 percent reduction in at least one high frequency harmonic, such as harmonic of a fundamental frequency modulating a carrier frequency. Preferably, the inductor/capacitor combination described herein reduces amplitude of the largest 1, 2, 3, 4, 5, 6, 7, 8, 9, 10 or more largest harmonic frequencies by at least 10, 20, 30, 40, 50, 60, 70, 80, 90, 95, or 99 percent. In one particular case, the distributed gap material used in the inductor described herein, processes output from a silicon carbide MOSFET with significantly less loss than an inductor using silicon iron steel.

Herein, for clarity of presentation, silicon carbide and/or a compound of silicon and carbon is used to refer to any of the 250+ forms of silicon carbide, alpha silicon carbide, beta silicon carbide, a polytype crystal form of silicon carbide, and/or a compound, where at least 80, 85, 90, 95, 96, 97, 98, or 99 percent of the compound comprises silicon and carbon by weight, such as produced by the Lely method or as produced using silicon oxide found in plant matter. The compound and/or additives of silicon and carbon is optionally pure or contains substitutions/impurities of any of nitrogen, phosphorus, aluminum, boron, gallium, and beryllium. For example, doping the silicon carbide with boron, aluminum, or nitrogen is performed to enhance conductivity. Further, silicon carbide refers to the historically named carborundum and the rare natural mineral moissanite.

Insulated gate bipolar transistors are used in examples herein for clarity and without loss of generality. Generally, MOSFETs and insulate gate bipolar transistors (IGBTs) are examples of the switching devices, which also include free-wheeling diodes (FWDs) also known as freewheeling diodes. Further, a metal-oxide-semiconductor field-effect transistor (MOSFET) is optionally used in place or in combination with an IGBT. Both the IGBT and MOSFET are transistors, such as for amplifying or switching electronic signals and/or as part of an electrical filter system. While a MOSFET is used as jargon in the field, the metal in the acronym MOSFET is optionally and preferably a layer of polycrystalline silicon or polysilicon. Generally an IGBT or MOSFET uses a form of gallium arsenide, silicon carbide, and/or gallium nitride based transistor.

The use of the term silicon carbide MOSFET includes use of silicon carbide in a transistor. More generally, silicon carbide (SiC) crystals, or wafers are used in place of silicon (Si) and/or gallium arsenide (GaAs) in a switching device, such as a MOSFET, an IGBT, or a FWD. More particularly, a Si PiN diode is replaced with a SiC diode and/or a SiC Schottky Barrier Diode (SBD). In one preferred case, the IGBT or MOSFET is replaced with a SiC transistor, which results in switching loss reduction, higher power density modules, and cooler running temperatures. Further, SiC has an order of magnitude greater breakdown field strength compared to Si allowing use in high voltage inverters. For clarity of presentation, silicon carbide is used in examples, but gallium arsenide and/or gallium nitride based transistors are optionally used in conjunction with or in place of the silicon carbide crystals.

Still referring to FIG. 1C, silicon carbide MOSFETs have considerably lower switching losses than conventional MOSFET technologies. These lower losses allow the silicon carbide MOSFET module to switch at significantly higher switching frequencies and still maintain the necessary low switching losses needed for the efficiency ratings of the inverter system. In a preferred embodiment, three phase AC power is processed by an inverter/converter and further processed by an output filter before delivery to a load. The output filter optionally uses any of the inductor materials, windings, shapes, configurations, mounting systems, and/or cooling systems described herein.

Figure 1D:
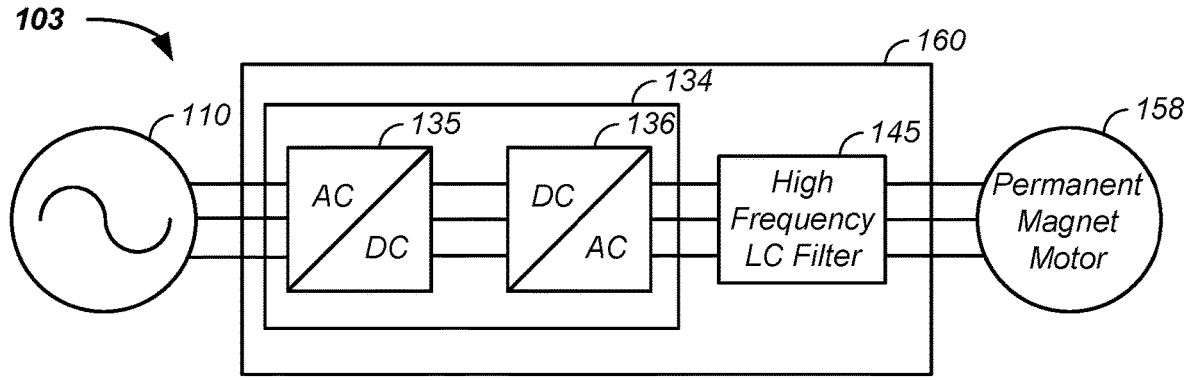
FIG. 1D illustrates a grid power filtering process.

Referring now to FIG. 1D, an example of the high frequency inverter 134 and a high frequency inductor-capacitor filter 145 in a single containing unit 160 or housing is figuratively illustrated in a combined power filtering system 103. In this example, the high frequency inverter 134 is illustrated as an alternating current to direct current converter 135 and as a direct current to alternating current converter 136, the second filter 140 is illustrated as the high frequency LC filter 145, and the load 152 is illustrated as a permanent magnet motor 158.

Herein, the permanent magnet motor operates using frequencies of 90-2000 Hz, such as greater than 100, 200, 500, or 1000 Hz and less than 2000, 1500, 1000, or 500 Hz. The inventor has determined that use of the single containing unit 160 to contain an inverter 132 and high frequency filter 145 is beneficial when AC drives begin to use silicon carbide MOSFET's and the switching frequency on high power drives goes up, such as to greater than 2000, 40,000, or 100,000 Hz. The inventor has further determined that when MOSFET's operate at higher frequencies an output filter, such as an L-C filter or the high frequency filter 144, is required because the cables overheat from high harmonic frequencies generated using a silicon carbide MOSFET if not removed.

Still referring to FIG. 1D, the alternating current to direct current converter 135 and the direct current to alternating current converter 136 are jointly referred to as an inverter, a variable speed drive, an adjustable speed drive, an adjustable frequency drive, and/or an adjustable frequency inverter. For clarity of presentation and without loss of generality, the term variable speed drive is used herein to refer to this class of drives. The inventor has determined that use of a distributed gap filter, as described supra, in combination with the variable speed drive is used to remove higher frequency harmonics from the output of the variable speed drive and/or to pass selected frequencies, such as frequencies from 90 to 2000 Hz to a permanent magnet motor. The inventor has further determined that the high frequency filter 144, such as the high frequency inductor-capacitor filter 145 is preferably coupled with the direct current to alternating current converter 136 of the inverter 132 or high frequency inverter 134.

Cooling the output filter is described, infra, however, the cooling units described, infra, preferably contain the silicon carbide MOSFET or a silicon carbide IGBT inverter so that uncooled output wires are not used between the silicon carbide inverter and the high frequency LC filter 145 where loss and/or failure due to heating would occur. Hence, the conductors from the inverter 145 are preferably cooled, in one container or multiple side-by-side containers, without leaving a cooled environment until processed by the high frequency filter 144 or high frequency LC filter 145.

Still referring to FIG. 1D, where the motor or load 152 is a long distance from an AC drive, the capacitance of the long cables amplifies the harmonics leaving the AC drive where the amplified harmonics hit the motor. A resulting corona on the motor windings causes magnet wire in the motor windings to short between turns, which results in motor failure. The high frequency filter 144 is used in these cases to remove harmonics, increase the life of the motor, enhance reliability of the motor, and/or increase the efficiency of the motor. Particularly, the silicon carbide MOSFET/high frequency filter 144 combination finds uses in electro submersible pumps, for lifting oil deep out of the ground, and/or in fracking applications. Further, the silicon carbide MOSFET/high frequency filter 144 combination finds use generally in permanent motor applications, which spin at much higher speeds and require an AC drive to operate. For example, AC motors used in large tonnage chillers and air compressors will benefit from the high frequency LC filter 145/silicon carbide MOSFET combination.

Figure 1E:
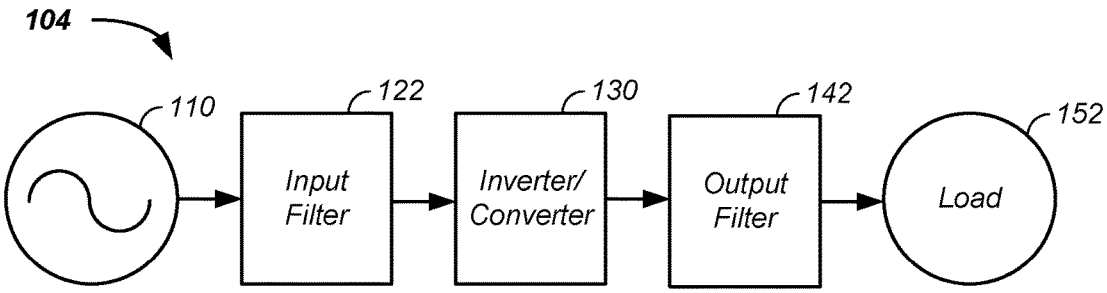
FIG. 1E illustrates an AC power processing system.

Referring now to FIG. 1E, an example of AC power processing system 104 processing AC power from the grid 110 is provided. In this case, electricity flows from the AC grid to the load 152. In this example, AC power from the grid 110 is passed through an optional input filter 122 to the inverter/converter system 130. The input filter 122 uses at least one inductor and optionally uses at least one capacitor and/or other electrical components. The input filter functions to protect quality of power on the AC grid from harmonics or energy reflected from the inverter/converter system 130 and/or to filter power from the grid 110. Output from the inverter/converter system 130 is subsequently passed through an output filter 142, which is an example of a second filter 140 in FIG. 1A. The output filter 142 includes at least one inductor and optionally includes one or more additional electrical components, such as one or more capacitors. Output from the output filter 142 is subsequently delivered to the load 152, such as to a motor, chiller, or pump. In a first instance, the load 152 is an inductor motor, such as an inductor motor operating at about 50 or 60 Hz or in the range of 30-90 Hz. In a second instance, the load 152 is a permanent magnet motor, such as a motor having a fundamental frequency range of about 90 to 2000 Hz or more preferably in the range of 250 to 1000 Hz.

Figure 1F:
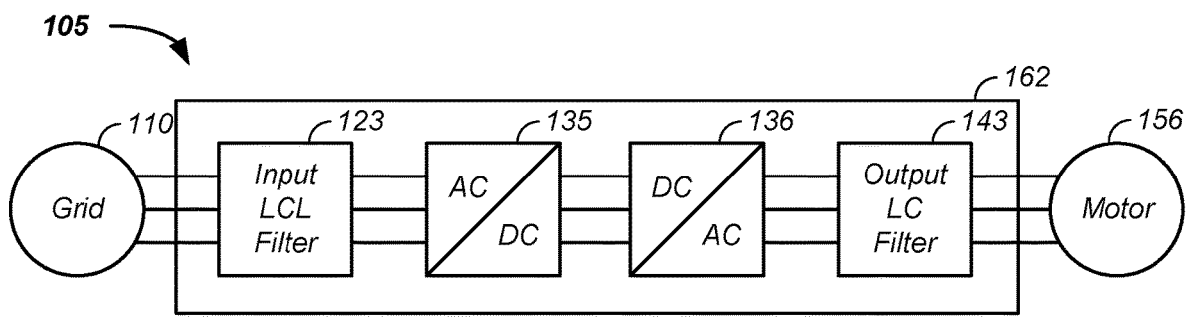
FIG. 1F illustrates an enclosed AC power processing system.

Referring now to FIG. 1F, an enclosed AC power processing system 105 is illustrated. In this example, the input filter 122, inverter/converter 130, and output filter 142 are enclosed in a single container 162, for cooling, weight, durability, and/or safety reasons. Optionally, the single container 162 is a series of 2, 3, 4 or more containers proximate each other, such as where closest sided elements are within less than 0.1, 0.5, 1, or 5 meters from each other or are joined to each other. In the illustrated case, the input filter 122 is an input inductor/capacitor/inductor filter 123, the output filter 142 is an output inductor/capacitor filter 143, and the load 152 is a motor 152.

Figure 1G:
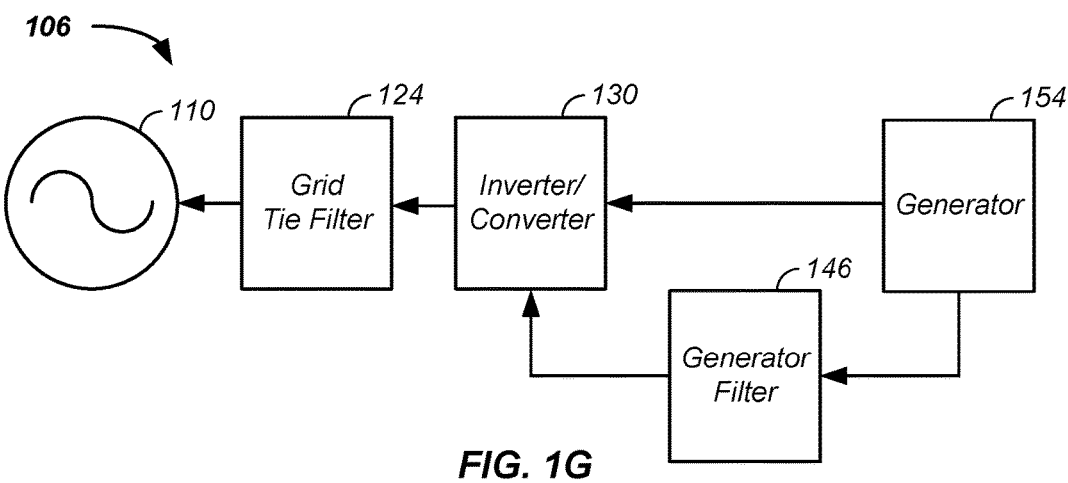
FIG. 1G illustrates a generated power processing system.
Figure 1H:
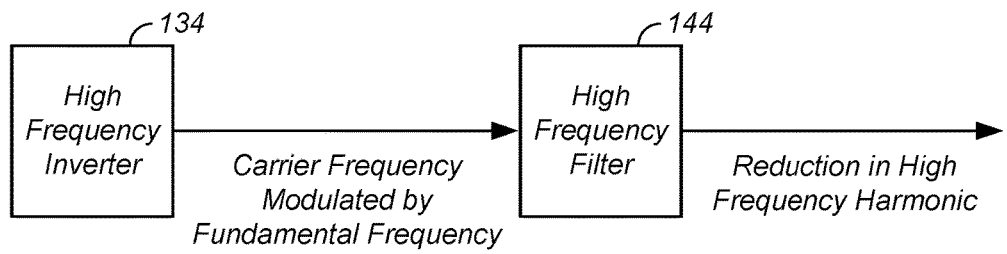
FIG. 1H illustrates a high frequency power processing system.

Referring now to FIG. 1G, an example of a generated power processing system 106 processing generated power from the generator 154 is provided. In this case, electricity flows from the generator 154 to the grid 110. The generator 154 provides power to the inverter/converter system 130. Optionally, the generated power is processed through a generator filter 146 before delivery to the inverter/converter system 130. Power from the inverter/converter system 130 is filtered with a grid tie filter 124, which includes at least one inductor and optionally includes one or more additional electrical components, such as a capacitor and/or a resistor. Output from the grid tie filter 124, which is an example of the first filter 120 in FIG. 1A, is delivered to the grid 110. A first example of a grid tie filter 124 is a filter using an inductor. A second example of a grid tie filter 124 is a filter using a first inductor, a capacitor, and a second inductor for each phase of power. Optionally, generated output from the generator 154 after processing with the inverter/converter system 130 is filtered using at least one inductor and passed directly to a load, such as a motor, without going to the grid 110.

In the power processing system 100, the power supply system or input power includes any other appropriate elements or systems, such as a voltage or current source and a switching system or element. The supply optionally operates in conjunction with various forms of modulation, such as pulse width modulation, resonant conversion, quasi-resonant conversion, and/or phase modulation.

Filter circuits in the power processing system 100 are configured to filter selected components from the supply signal. The selected components include any elements to be attenuated or eliminated from the supply signal, such as noise and/or harmonic components. For example, filter circuits reduce total harmonic distortion. In one embodiment, the filter circuits are configured to filter higher frequency harmonics over the fundamental frequency. Examples of fundamental frequencies include: direct current (DC), 50 Hz, 60 Hz, and/or 400 Hz signals. Examples of higher frequency harmonics include harmonics over about 300, 500, 600, 800, 1000, 2000, 5000, 7000, 10,000, 50,000 and 100,000 Hz in the supply signal, such as harmonics induced by the operating switching frequency of insulated gate bipolar transistors (IGBTs) and/or any other electrically operated switches, such as via use of a MOSFET. The filter circuit optionally includes passive components, such as an inductor-capacitor filter comprised of an inductor, a capacitor, and in some embodiments a resistor. The values and configuration of the inductor and the capacitor are selected according to any suitable criteria, such as to configure the filter circuits to a selected cutoff frequency, which determines the frequencies of signal components filtered by the filter circuit. The inductor is preferably configured to operate according to selected characteristics, such as in conjunction with high current without excessive heating or operating within safety compliance temperature requirements.

Power Processing System

The power processing system 100 is optionally used to filter single or multi-phase power, such as three phase power. Herein, for clarity of presentation AC input power from the grid 110 or input power is used in the examples. Though not described in each example, the components and/or systems described herein additionally apply generator systems, such as the system for processing generated power.

Figure 2:
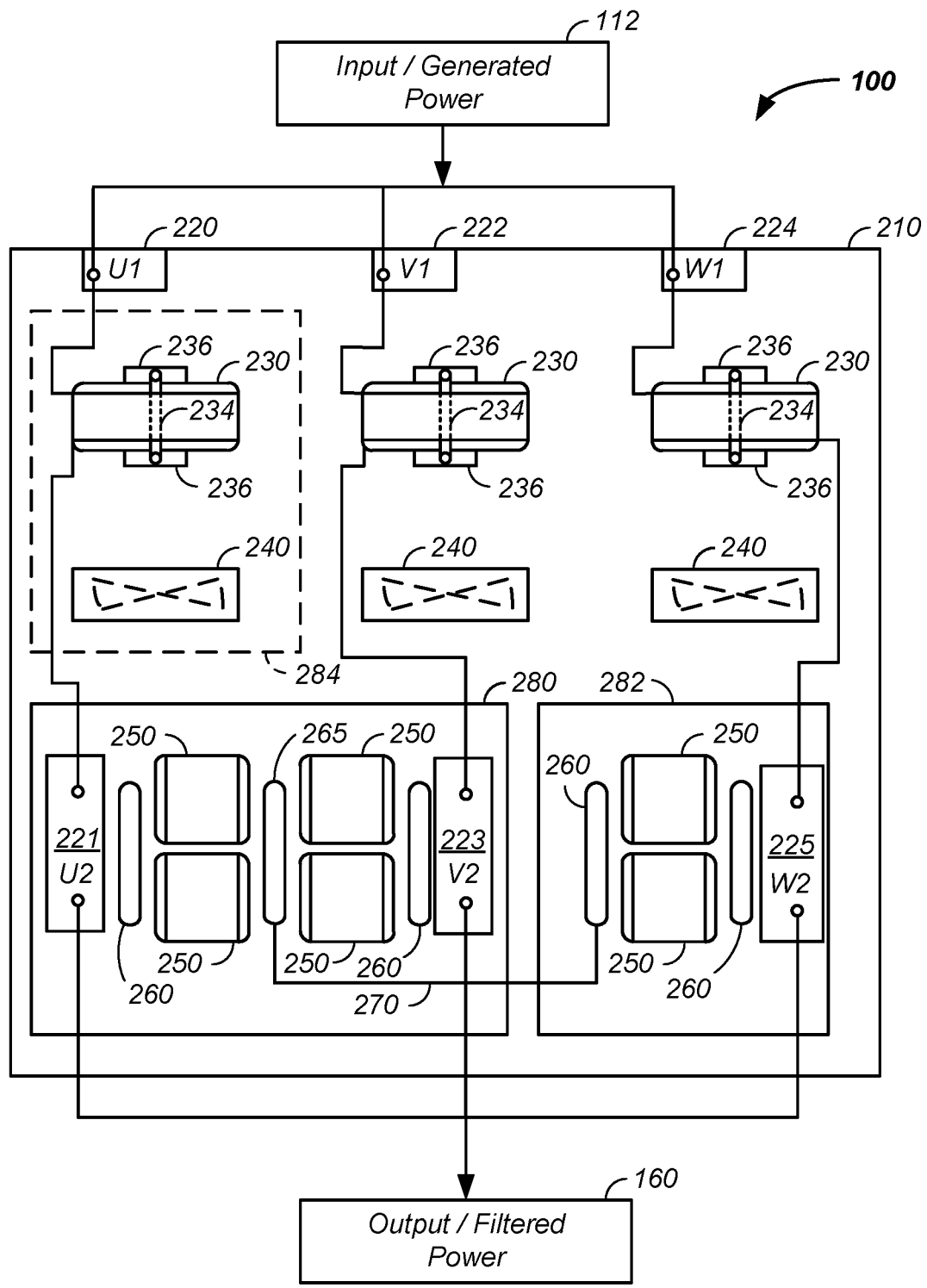
FIG. 2 illustrates multi-phase inductor/capacitor component mounting and a filter circuit for power processing.

Referring now to FIG. 2, an illustrative example of multi-phase power filtering is provided. Input power 112 is processed using the power processing system 100 to yield filtered and/or transformed output power 160. In this example, three-phase power is processed with each phase separately filtered with an inductor-capacitor filter. The three phases, of the three-phase input power, are denoted U1, V1, and W1. The input power 112 is connected to a corresponding phase terminal U1 220, V1 222, and/or W1 224, where the phase terminals are connected to or integrated with the power processing system 100. For clarity, processing of a single phase is described, which is illustrative of multi-phase power processing. The input power 112 is then processed by sequential use of an inductor 230 and a capacitor 250. The inductor and capacitor system is further described, infra. After the inductor/capacitor processing, the three phases of processed power, corresponding to U1, V1, and W1 are denoted U2, V2, and W2, respectively. The power is subsequently output as the processed and/or filtered power 150. Additional elements of the power processing system 100, in terms of the inductor 230, a cooling system 240, and mounting of the capacitors 250, are further described infra.

Isolators

Figure 3:
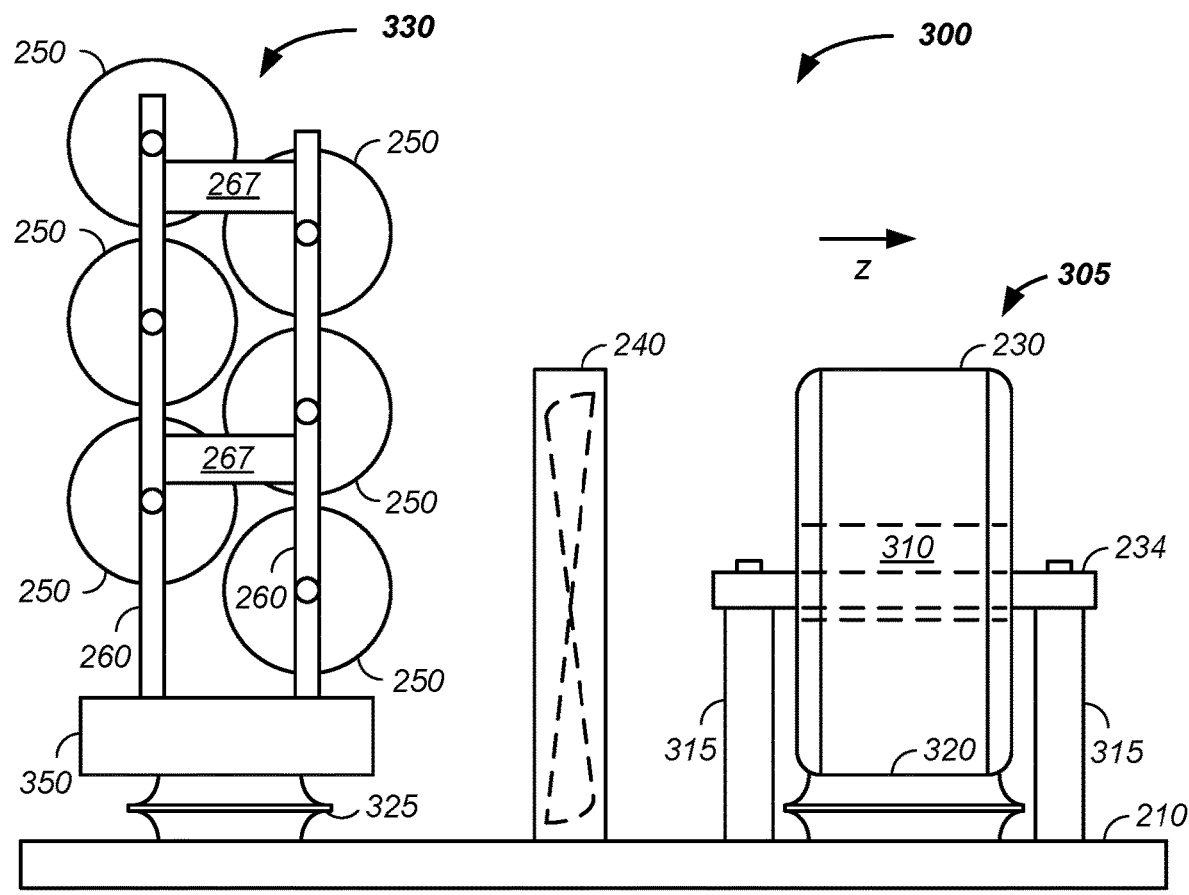
FIG. 3 further illustrates capacitor mounting.

Referring still to FIG. 2 and now to FIG. 3, in the power processing system 100, the inductor 230 is optionally mounted, directly or indirectly, to a base plate 210 via a mount 236, via an inductor isolator 320, and/or via a mounting plate 284. Preferably, the inductor isolator 320 is used to attach the mount 236 indirectly to the base plate 210. The inductor 230 is additionally preferably mounted using a cross-member or clamp bar 234 running through a central opening 310 in the inductor 230 which is clamped to the base plate 210 via ties 315. The capacitor 250 is preferably similarly mounted with a capacitor isolator 325 to the base plate 210. The isolators 320, 325 are preferably vibration, shock, and/or temperature isolators. The isolators 320, 325 are preferably a glass-reinforced plastic, a glass fiber-reinforced plastic, a fiber reinforced polymer made of a plastic matrix reinforced by fine fibers made of glass, and/or a fiberglass material, such as a Glastic® (Rochling Glastic Composites, Ohio) material.

Cooling System

Figure 4:
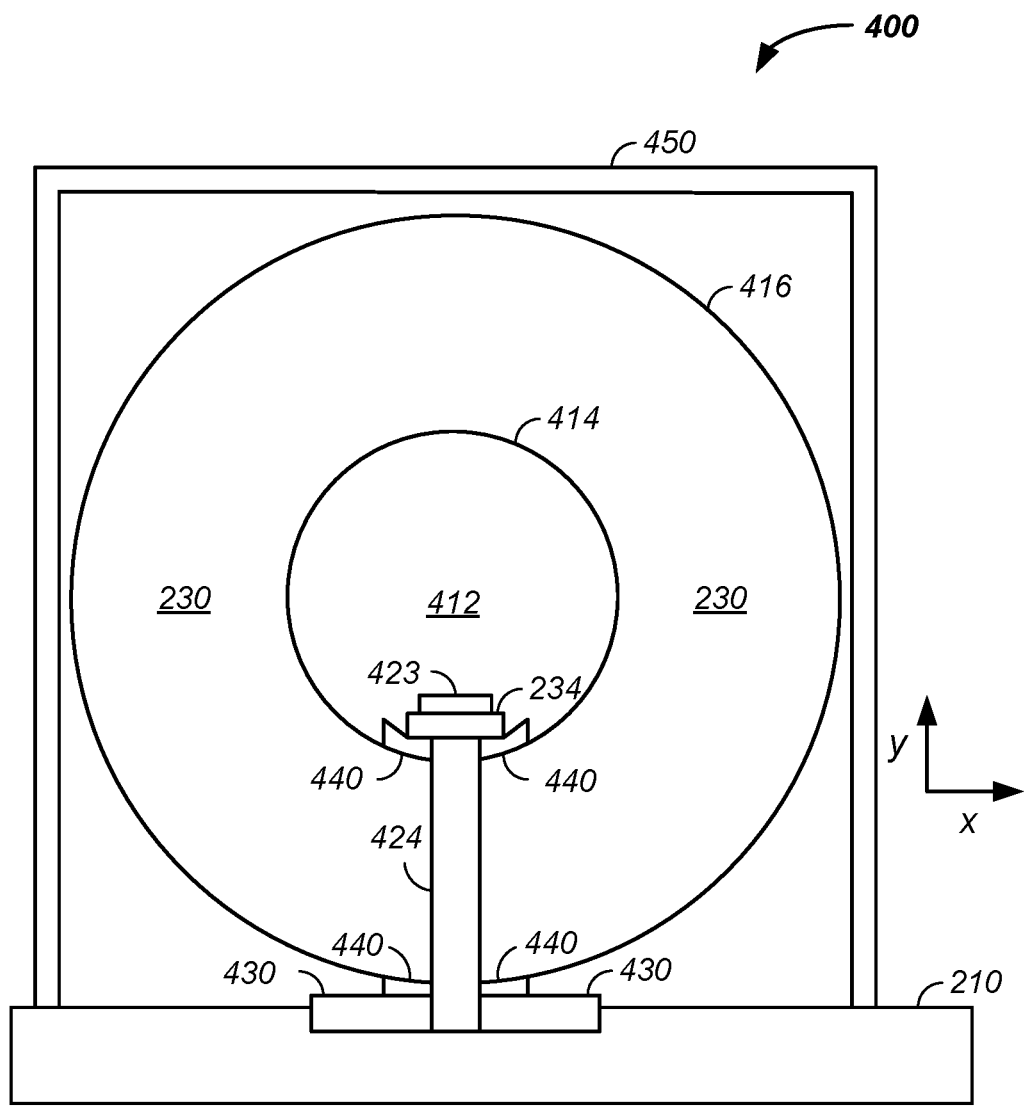
FIG. 4 illustrates a face view of an inductor.

Referring still to FIG. 2 and now to FIG. 4, an optional cooling system 240 is used in the power processing system 100. In the illustrated embodiment, the cooling system 240 uses a fan to move air across the inductor 230. The fan either pushes or pulls an air flow around and through the inductor 230. An optional air guide shroud 450 is placed over 1, 2, 3, or more inductors 230 to facilitate focused air movement resultant from the cooling system 240, such as airflow from a fan, around the inductors 230. The shroud preferably encompasses at least three sides of the one or more inductors. To achieve enhanced cooling, the inductor is preferably mounted on an outer face 416 of the toroid. For example, the inductor 230 is mounted in a vertical orientation using the clamp bar 234. Vertical mounting of the inductor is further described, infra. Optional liquid based cooling systems 240 are further described, infra.

Buss Bars

Referring again to FIG. 2 and FIG. 3, in the power processing system 100, the capacitor 250 is preferably an array of capacitors connected in parallel to achieve a specific capacitance for each of the multi-phases of the power supply 110. In FIG. 2, two capacitors 250 are illustrated for each of the multi-phased power supply U1, V1, and W1. The capacitors are mounted using a series of busbars or buss bars 260. A buss bar 260 carries power from one point to another or connects one point to another.

Common Neutral Buss bar

A particular type of buss bar 260 is a common neutral buss bar 265, which connects two phases. In one example of an electrical embodiment of a delta capacitor connection in a poly phase system, it is preferable to create a common neutral point for the capacitors. Still referring to FIG. 2, an example of two phases using multiple capacitors in parallel with a common neutral buss bar 265 is provided. The common neutral buss bar 265 functions as both a mount and a parallel bus conductor for two phases. This concept minimizes the number of parallel conductors, in a 'U' shape or in a parallel '| |' shape in the present embodiment, to the number of phases plus two. In a traditional parallel buss bar system, the number of buss bars 260 used is the number of phases multiplied by two or number of phases times two. Hence, the use of 'U' shaped buss bars 260 reduces the number of buss bars used compared to the traditional mounting system. Minimizing the number of buss bars required to make a poly phase capacitor assembly, where multiple smaller capacitors are positioned in parallel to create a larger capacitance, minimizes the volume of space needed and the volume of buss bar conductors. Reduction in buss bar 260 volume and/or quantity minimizes cost of the capacitor assembly. After the two phases that share a common neutral bus conductor are assembled, a simple jumper 270 bus conductor is optionally used to jumper those two phases to any quantity of additional phases as shown in FIG. 2. The jumper optionally includes as little as two connection points. The jumper optionally functions as a handle on the capacitor assembly for handling. It is also typical that this common neutral bus conductor is the same shape as the other parallel bus conductors throughout the capacitor assembly. This common shape theme, a 'U' shape in the present embodiment, allows for symmetry of the assembly in a poly phase structure as shown in FIG. 2.

Parallel Buss Bars Function as Mounting Chassis

Herein, the buss bars 260, 265 preferably mechanically support the capacitors 250. The use of the buss bars 260, 265 for mechanical support of the capacitors 250 has several benefits. The parallel conducting buss bar connecting multiple smaller value capacitors to create a larger value, which can be used in a 'U' shape, also functions as a mounting chassis. Incorporating the buss bar as a mounting chassis removes the requirement of the capacitor 250 to have separate, isolated mounting brackets. These brackets typically would mount to a ground point or metal chassis in a filter system. In the present embodiment, the capacitor terminals and the parallel buss bar support the capacitors and eliminate the need for expensive mounting brackets and additional mounting hardware for these brackets. This mounting concept allows for optimal vertical or horizontal packaging of capacitors.

Parallel Buss Bar

A parallel buss bar is optionally configured to carry smaller currents than an input/output terminal. The size of the buss bar 260 is minimized due to its handling of only the capacitor current and not the total line current, where the capacitor current is less than about 10, 20, 30, or 40 percent of the total line current. The parallel conducting buss bar, which also functions as the mounting chassis, does not have to conduct full line current of the filter. Hence the parallel conducting buss bar is optionally reduced in cross-section area when compared to the output terminal 350. This smaller sized buss bar reduces the cost of the conductors required for the parallel configuration of the capacitors by reducing the conductor material volume. The full line current that is connected from the inductor to the terminal is substantially larger than the current that travels through the capacitors. For example, the capacitor current is less than about 10, 20, 30, or 40 percent of the full line current. In addition, when an inductor is used that impedes the higher frequencies by about 20, 100, 200, 500, 1000, 1500, or 2000 KHz before they reach the capacitor buss bar and capacitors, this parallel capacitor current is lower still than when an inferior filter inductor, whose resonant frequency is below 5, 10, 20, 40, 50, 75, 100 KHz, is used which cannot impede the higher frequencies due to its high internal capacitive construction or low resonant frequency. In cases where there exist high frequency harmonics and the inductor is unable to impede these high frequencies, the capacitors must absorb and filter these currents which causes them to operate at higher temperatures, which decreases the capacitors usable life in the circuit. In addition, these un-impeded frequencies add to the necessary volume requirement of the capacitor buss bar and mounting chassis, which increases cost of the power processing system 100.

Staggered Capacitor Mounting

Use of a staggered capacitor mounting system reduces and/or minimizes volume requirements for the capacitors.

Referring now to FIG. 3, a filter system 300 is illustrated. The filter system 300 preferably includes a mounting plate or base plate 210. The mounting plate 210 attaches to the inductor 230 and a set of capacitors 330. The capacitors are preferably staggered in an about close packed arrangement having a spacing between rows and staggered columns of less than about 0.25, 0.5, or 1 inch. The staggered packaging allows optimum packaging of multiple smaller value capacitors in parallel creating a larger capacitance in a small, efficient space.

Figure 15:
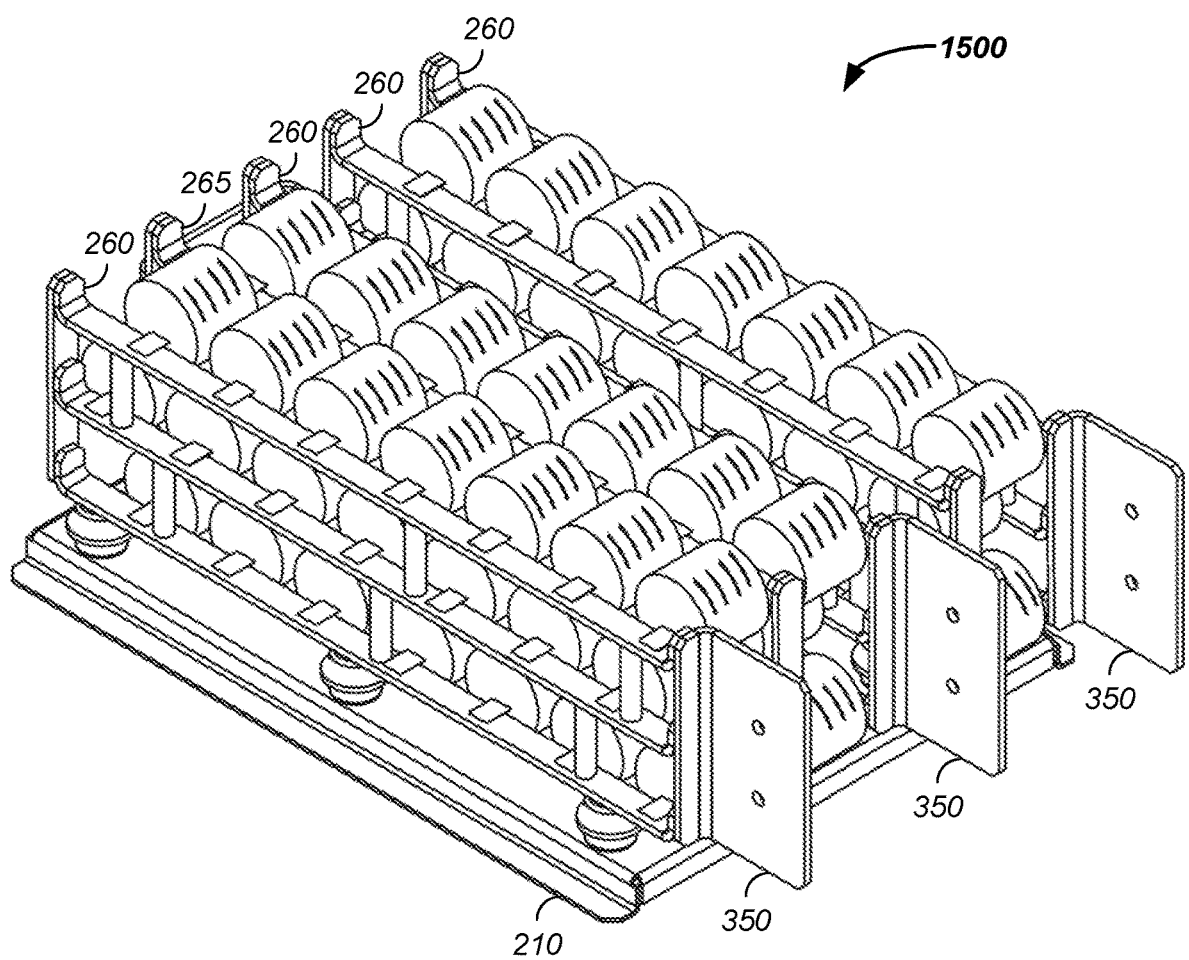
FIG. 15 illustrates a capacitor array.

Buss bars 260 are optionally used in a 'U' shape or a parallel '| |' shape to optimize packaging size for a required capacitance value. The 'U' shape with staggered capacitors 250 are optionally mounted vertically to the mounting surface, as shown in FIG. 3 or horizontally to the mounting surface as shown in FIG. 15. The 'U' shape buss bar is optionally two about parallel bars with one or more optional mechanical stabilizing spacers, 267, at selected locations to mechanically stabilize both about parallel sides of the 'U' shape buss bar as the buss bar extends from the terminal 350, as shown in FIG. 3 and FIG. 15.

In this example, the capacitor bus work 260 is in a 'U' shape that fastens to a terminal 350 attached to the base plate 210 via an insulator 325. The 'U' shape is formed by a first buss bar 260 joined to a second buss bar 260 via the terminal 350. The 'U' shape is alternatively shaped to maintain the staggered spacing, such as with an m by n array of capacitors, where m and n are integers, where m and n are each two or greater. The buss bar matrix or assembly contains neutral points 265 that are preferably shared between two phases of a poly-phase system. The neutral buss bars 260, 265 connect to all three-phases via the jumper 270. The shared buss bar 265 allows the poly-phase system to have x+2 buss bars where x is the number of phases in the poly-phase system instead of the traditional two buss bars per phase in a regular system. Optionally, the common buss bar 265 comprises a metal thickness of approximately twice the size of the buss bar 260. The staggered spacing enhances packaging efficiency by allowing a maximum number of capacitors in a given volume while maintaining a minimal distance between capacitors needed for the optional cooling system 240, such as cooling fans and/or use of a coolant fluid. Use of a coolant fluid directly contacting the inductor 230 is described, infra. The distance from the mounting surface 210 to the bottom or closest point on the body of the second closest capacitor 250, is less than the distance from the mounting surface 210 to the top or furthest point on the body of the closest capacitor. This mounting system is designated as a staggered mounting system for parallel connected capacitors in a single or poly phase filter system.

Module Mounting

In the power processing system 100, modular components are optionally used. For example, a first mounting plate 280 is illustrated that mounts three buss bars 260 and two arrays of capacitors 250 to the base plate 210. A second mounting plate 282 is illustrated that mounts a pair of buss bars 260 and a set of capacitors to the base plate 210. A third mounting plate 284 is illustrated that vertically mounts an inductor and optionally an associated cooling system 240 or fan to the base plate 210. Generally, one or more mounting plates are used to mount any combination of inductor 230, capacitor 240, buss bar 260, and/or cooling system 240 to the base plate 210.

Referring now to FIG. 3, an additional side view example of a power processing system 100 is illustrated. FIG. 3 further illustrates a vertical mounting system 305 for the inductor 230 and/or the capacitor 250. For clarity, the example illustrated in FIG. 3 shows only a single phase of a multi-phase power filtering system. Additionally, wiring elements are removed in FIG. 3 for clarity. Additional inductor 230 and capacitor 250 detail is provided, infra.

Inductor

Preferable embodiments of the inductor 230 are further described herein. Particularly, in a first section, vertical mounting of an inductor is described. In a second section, inductor elements are described.

For clarity, an axis system is herein defined relative to an inductor 230. An x/y plane runs parallel to an inductor face 417, such as the inductor front face 418 and/or the inductor back face 419. A z-axis runs through the inductor 230 perpendicular to the x/y plane. Hence, the axis system is not defined relative to gravity, but rather is defined relative to an inductor 230.

Vertical Inductor Mounting

FIG. 3 illustrates an indirect vertical mounting system of the inductor 230 to the base plate 210 with an optional intermediate vibration, shock, and/or temperature isolator 320. The isolator 320 is preferably a Glastic© material, described supra. The inductor 230 is preferably an edge mounted inductor with a toroidal core, described infra.

Figure 6A:
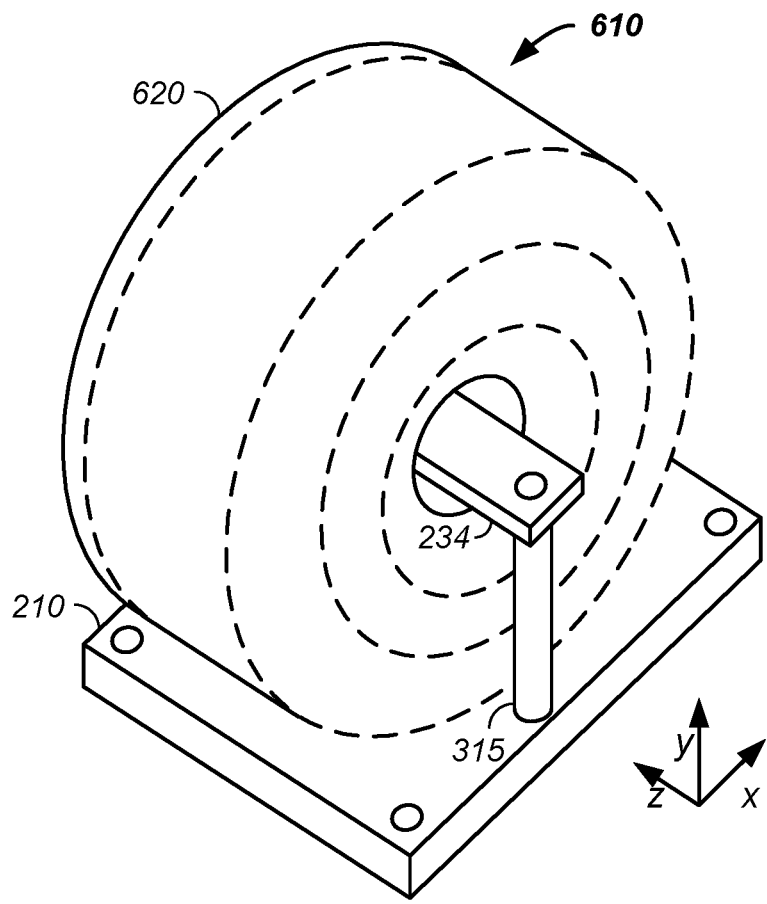
FIG. 6A illustrates an inductor core and an inductor winding and FIG. 6B illustrated inductor core particles.

Referring now to FIG. 6A, an inductor 230 optionally includes an inductor core 610 and a winding 620. The winding 620 is wrapped around the inductor core 610. The inductor core 610 and the winding 620 are suitably disposed on a base plate 210 to support the inductor core 610 in any suitable position and/or to conduct heat away from the inductor core 610 and the winding 620. The inductor 610 optionally includes any additional elements or features, such as other items required in manufacturing.

Figure 6B:
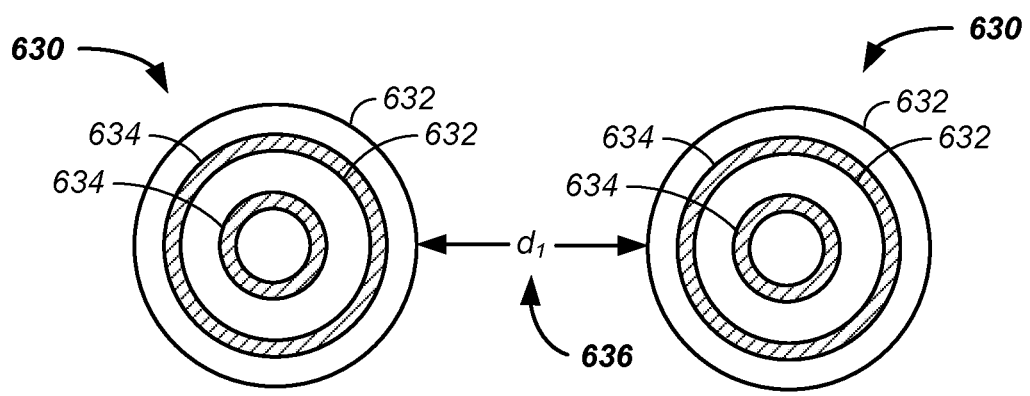

Referring now to FIG. 6B, an inductor core of the inductor 230 optionally and preferably comprises a distributed gap material of coated particles 630 than have alternating magnetic layers 632 and substantially non-magnetic layers 634, where the coated particles 630 are separated by an average distance, $d_1$.

Figure 5:
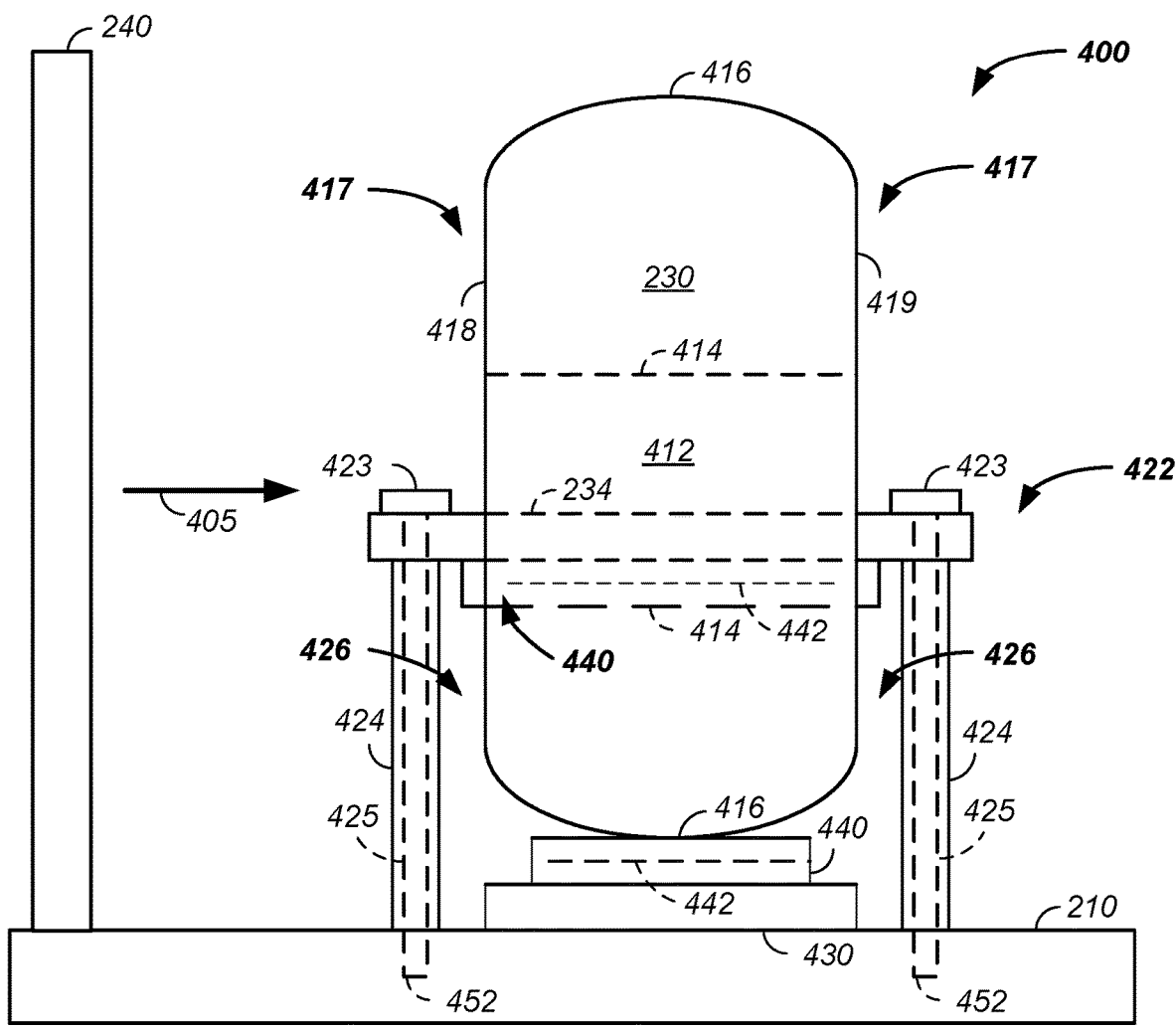
FIG. 5 illustrates a side view of an inductor.

In one embodiment, an inductor 230 or toroidal inductor is mounted on the inductor edge, is vibration isolated, and/or is optionally temperature controlled. Referring now to FIG. 4 and FIG. 5, an example of an edge mounted inductor system 400 is illustrated. FIG. 4 illustrates an edge mounted toroidal inductor 230 from a face view. FIG. 5 illustrates the inductor 230 from an edge view.

When looking through a center hole 412 of the inductor 230, the inductor 230 is viewed from its face. When looking at the inductor 230 along an axis-normal to an axis running through the center hole 412 of the inductor 230, the inductor 230 is viewed from the inductor edge. In an edge mounted inductor system, the edge of the inductor is mounted to a surface. In a face mounted inductor system, the face of the inductor 230 is mounted to a surface. Elements of the edge mounted inductor system 400 are described, infra.

Referring still to FIG. 4, the inductor 230 is optionally mounted in a vertical orientation, where a center line through the center hole 412 of the inductor runs along an axis 405 that is about horizontal or parallel to a mounting surface 430 or base plate 210. The mounting surface is optionally horizontal or vertical, such as parallel to a floor, parallel to a wall, or parallel to a mounting surface on a slope.

In FIG. 4, the inductor 230 is illustrated in a vertical position relative to a horizontal mounting surface with the axis 405 running parallel to a floor. While descriptions herein use a horizontal mounting surface to illustrate the components of the edge mounted inductor mounting system 400, the system is equally applicable to a vertical mounting surface. To further clarify, the edge mounted inductor system 400 described herein also applies to mounting the edge of the inductor to a vertical mounting surface or an angled mounting surface. The angled mounting surface is optionally angled at least 10, 20, 30, 40, 50, 60, 70, or 80 degrees off of horizontal. In these cases, the axis 405 still runs about parallel to the mounting surface, such as about parallel to the vertical mounting surface or about parallel to a sloped mounting surface 430, base plate 210, or other surface.

Still referring to FIG. 4 and to FIG. 5, the inductor 230 has an inner surface 414 surrounding the center opening, center aperture, or center hole 412; an outer edge 416 or outer edge surface; and two faces 417, including a front face 418 and a back face 419. An inductor section refers to a portion of the about annular inductor between a point on the inner surface 414 and a closest point on the outer edge 416. The surface of the inductor 230 includes: the inner surface 414, outer edge 416 or outer edge surface, and faces 417. The surface of the inductor 230 is typically the outer surface of the magnet wire windings surrounding the core of the inductor 230. Magnet wire or enameled wire is a copper or aluminium wire coated with a very thin layer of insulation. In one case, the magnet wire comprises a fully annealed electrolytically refined copper. In another case, the magnet wire comprises aluminum magnet wire. In still another case, the magnet wire comprises silver or another precious metal to further enhance current flow while reducing operating temperatures. Optionally, the magnet wire has a cross-sectional shape that is round, square, and/or rectangular. A preferred embodiment uses rectangular magnet wire to wind the annular inductor to increase current flow in the limited space in a central aperture within the inductor and/or to increase current density. The insulation layer includes 1, 2, 3, 4, or more layers of an insulating material, such as a polyvinyl, polyimide, polyamide, and/or fiberglass based material. The magnet wire is preferably a wire with an aluminum oxide coating for minimal corona potential. The magnet wire is preferably temperature resistant or rated to at least two hundred degrees Centigrade. The winding of the wire or magnet wire is further described, infra. The minimum weight of the inductor is optionally about 2, 5, 10, or 20 pounds.

Still referring to FIG. 4, an optional clamp bar 234 runs through the center hole 412 of the inductor 230. The clamp bar 234 is preferably a single piece, but is optionally composed of multiple elements. The clamp bar 234 is connected directly or indirectly to the mounting surface 430 and/or to a base plate 210. The clamp bar 234 is composed of a non-conductive material as metal running through the center hole of the inductor 230 functions as a magnetic shorted turn in the system. The clamp bar 234 is preferably a rigid material or a semi-rigid material that bends slightly when clamped, bolted, or fastened to the mounting surface 430. The clamp bar 234 is preferably rated to a temperature of at least 130 degrees Centigrade. Preferably, the clamp bar material is a fiberglass material, such as a thermoset fiberglass-reinforced polyester material, that offers strength, excellent insulating electrical properties, dimensional stability, flame resistance, flexibility, and high property retention under heat. An example of a fiberglass clamp bar material is Glastic©. Optionally the clamp bar 234 is a plastic, a fiber reinforced resin, a woven paper, an impregnated glass fiber, a circuit board material, a high performance fiberglass composite, a phenolic material, a thermoplastic, a fiberglass reinforced plastic, a ceramic, or the like, which is preferably rated to at least 150 degrees Centigrade. Any of the mounting hardware 422 is optionally made of these materials.

Still referring to FIG. 4 and to FIG. 5, the clamp bar 234 is preferably attached to the mounting surface 430 via mounting hardware 422. Examples of mounting hardware include: a bolt, a threaded bolt, a rod, a clamp bar 234, a mounting insulator 424, a connector, a metal connector, and/or a non-metallic connector. Preferably, the mounting hardware is non-conducting. If the mounting hardware 422 is conductive, then the mounting hardware 422 is preferably contained in or isolated from the inductor 230 via a mounting insulator 424. Preferably, an electrically insulating surface is present, such as on the mounting hardware. The electrically insulating surface proximately contacts the faces of the inductor 230. Alternatively, an insulating gap 426 of at least about one millimeter exists between the faces 417 of the inductor 230 and the metallic or insulated mounting hardware 422, such as a bolt or rod.

An example of a mounting insulator is a hollow rod where the outer surface of the hollow rod is non-conductive and the hollow rod has a center channel 425 through which mounting hardware, such as a threaded bolt, runs. This system allows a stronger metallic and/or conducting mounting hardware to connect the clamp bar 234 to the mounting surface 430. FIG. 5 illustrates an exemplary bolt head 423 fastening a threaded bolt into the base plate 210 where the base plate has a threaded hole. An example of a mounting insulator 424 is a mounting rod. The mounting rod is preferably composed of a material or is at least partially covered with a material where the material is electrically isolating.

The mounting hardware 422 preferably covers a minimal area of the inductor 230 to facilitate cooling with a cooling element 240, such as via one or more fans. In one case, the mounting hardware 422 does not contact the faces 417 of the inductor 230. In another case, the mounting hardware 422 contacts the faces 417 of the inductor 230 with a contact area. Preferably the contact area is less than about 1, 2, 5, 10, 20, or 30 percent of the surface area of the faces 417. The minimal contact area of the mounting hardware with the inductor surface facilitates temperature control and/or cooling of the inductor 230 by allowing airflow to reach the majority of the inductor 230 surface. Preferably, the mounting hardware is temperature resistant to at least 130 degrees centigrade. Preferably, the mounting hardware 422 comprises curved surfaces circumferential about its length to facilitate airflow around the length of the mounting hardware 422 to the faces 417 of the inductor 230.

Still referring to FIG. 5, the mounting hardware 422 connects the clamp bar 234, which passes through the inductor, to the mounting surface 430. The mounting surface is optionally non-metallic and is rigid or semi-rigid. Generally, the properties of the clamp bar 234 apply to the properties of the mounting surface 430. The mounting surface 430 is optionally (1) composed of the same material as the clamp bar 234 or is (2) a distinct material type from that of the clamp bar 234.

Still referring to FIG. 5, in one example the inductor 230 is held in a vertical position by the clamp bar 234, mounting hardware 422, and mounting surface 430 where the clamp bar 234 contacts the inner surface 414 of the inductor 230 and the mounting surface 430 contacts the outer edge 416 of the inductor 230.

Still referring to FIG. 5, in a second example one or more vibration isolators 440 are used in the mounting system. As illustrated, a first vibration isolator 440 is positioned between the clamp bar 234 and the inner surface 414 of the inductor 230 and a second vibration isolator 440 is positioned between the outer edge 416 of the inductor 230 and the mounting surface 430. The vibration isolator 440 is a shock absorber. The vibration isolator optionally deforms under the force or pressure necessary to hold the inductor 230 in a vertical position or edge mounted position using the clamp bar 234, mounting hardware 422, and mounting surface 430. The vibration isolator preferably is temperature rated to at least two hundred degrees Centigrade. Preferably the vibration isolator 440 is about ⅛, ¼, ⅜, or ½ inch in thickness. An example of a vibration isolator is silicone rubber. Optionally, the vibration isolator 440 contains a glass weave 442 for strength. The vibration isolator optionally is internal to the inductor opening or extends out of the inductor 230 central hole 412.

Still referring to FIG. 5, a common mounting surface 430 is optionally used as a mount for multiple inductors. Alternatively, the mounting surface 430 is connected to a base plate 210. The base plate 210 is optionally used as a base for multiple mounting surfaces connected to multiple inductors, such as three inductors used with a poly-phase power system where one inductor handles each phase of the power system. The base plate 210 optionally supports multiple cooling elements, such as one or more cooling elements per inductor. The base plate is preferably metal for strength and durability. The system reduces cost associated with the mounting surface 430 as the less expensive base plate 210 is used for controlling relative position of multiple inductors and the amount of mounting surface 430 material is reduced and/or minimized. Further, the contact area ratio of the mounting surface 430 to the inductor surface is preferably minimized, such as to less than about 1, 2, 4, 6, 8, 10, or 20 percent of the surface of the inductor 230, to facilitate efficient heat transfer by maximizing the surface area of the inductor 230 available for cooling by the cooling element 240 or by passive cooling.

Still referring to FIG. 4, an optional cooling system 240 is used to cool the inductor. In one example, a fan blows air about one direction, such as horizontally, onto the front face 418, through the center hole 412, along the inner edge 414 of the inductor 230, and/or along the outer edge 416 of the inductor 230 where the clamp bar 234, vibration isolator 440, mounting hardware 422, and mounting surface 430 combined contact less than about 1, 2, 5, 10, 20, or 30 percent of the surface area of the inductor 230, which yields efficient cooling of the inductor 230 using minimal cooling elements and associated cooling element power due to a large fraction of the surface area of the inductor 230 being available for cooling. To aid cooling, an optional shroud 450 about the inductor 230 guides the cooling air flow about the inductor 230 surface. The shroud 450 optionally circumferentially encloses the inductor along 1, 2, 3, or 4 sides. The shroud 450 is optionally any geometric shape.

Preferably, mounting hardware 422 is used on both sides of the inductor 230. Optionally, the inductor 230 mounting hardware 422 is used beside only one face of the inductor 230 and the clamp bar 234 or equivalent presses down or hooks over the inductor 230 through the hole 412 or over the entire inductor 230, such as over the top of the inductor 230.

In yet another embodiment, a section or row of inductors 230 are elevated in a given airflow path. In this layout, a single airflow path or thermal reduction apparatus is used to cool a maximum number of toroid filter inductors in a filter circuit, reducing additional fans or thermal management systems required as well as overall packaging size. This increases the robustness of the filter with fewer moving parts to degrade as well as minimizes cost and packaging size. The elevated layout of a first inductor relative to a second inductor allows air to cool inductors in the first row and then to also cool inductors in an elevated rear row without excessive heating of the air from the front row and with a single airflow path and direction from the thermal management source. Through elevation, a single fan is preferably used to cool a plurality of inductors approximately evenly, where multiple fans would have been needed to achieve the same result. This efficient concept drastically reduces fan count and package size and allows for cooling airflow in a single direction.

An example of an inductor mounting system is provided. Preferably, the pedestal or non-planar base plate, on which the inductors are mounted, is made out of any suitable material. In the current embodiment, the pedestal is made out of sheet metal and fixed to a location behind and above the bottom row of inductors. Multiple orientations of the pedestal and/or thermal management devices are similarly implemented to achieve these results. In this example, toroid inductors mounted on the pedestal use a silicone rubber shock absorber mounting concept with a bottom plate, base plate, mounting hardware 122, a center hole clamp bar with insulated metal fasteners, or mounting hardware 122 that allows them to be safe for mounting at this elevated height. The mounting concept optionally includes a non-conductive material of suitable temperature and mechanical integrity, such as Glastic©, as a bottom mounting plate. The toroid sits on a shock absorber of silicone rubber material of suitable temperature and mechanical integrity. In this example, the vibration isolator 440, such as silicone rubber, is about 0.125 inch thick with a woven fiber center to provide mechanical durability to the mounting. The toroid is held in place by a center hole clamp bar of Glastic® or other non-conductive material of suitable temperature and mechanical integrity. The clamp bar fits through the center hole of the toroid and preferably has a minimum of one hole on each end, two total holes, to allow fasteners to fasten the clamp bar to the bottom plate and pedestal or base plate. Beneath the center clamp bar is another shock absorbing piece of silicone rubber with the same properties as the bottom shock absorbing rubber. The clamp bar is torqued down on both sides using fasteners, such as standard metal fasteners. The fasteners are preferably an insulated non-conductive material of suitable temperature and mechanical integrity. The mounting system allows for mounting of the elevated pedestal inductors with the center hole parallel to the mounting chassis and allows the maximum surface area of the toroid to be exposed to the moving air, thus maximizing the efficiency of the thermal management system. In addition, this mounting system allows for the two shock absorbing rubber or equivalent materials to both hold the toroid inductor in an upright position. The shock absorbing material also absorbs additional shock and vibration resulting during operation, transportation, or installation so that core material shock and winding shock is minimized.

Inductor Elements

The inductor 230 is further described herein. Preferably, the inductor includes a pressed powder highly permeable and linear core having a BH curve slope of about 11 ΔB/ΔH surrounded by windings and/or an integrated cooling system.

Referring now to FIG. 6, the inductor 230 comprises a inductor core 610 and a winding 620. The inductor 230 preferably includes any additional elements or features, such as other items required in manufacturing. The winding 620 is wrapped around the inductor core 610. The inductor core 610 provides mechanical support for the winding 620 and is characterized by a permeability for storing or transferring a magnetic field in response to current flowing through the winding 620. Herein, permeability is defined in terms of a slope of AB/AH. The inductor core 610 and winding 620 are suitably disposed on or in a mount or housing 210 to support the inductor core 610 in any suitable position and/or to conduct heat away from the inductor core 610 and the winding 620.

The inductor core optionally provides mechanical support for the inductor winding and comprises any suitable core for providing the desired magnetic permeability and/or other characteristics. The configuration and materials of the inductor core 610 are optionally selected according to any suitable criteria, such as a BH curve profile, permeability, availability, cost, operating characteristics in various environments, ability to withstand various conditions, heat generation, thermal aging, thermal impedance, thermal coefficient of expansion, curie temperature, tensile strength, core losses, and/or compression strength. For example, the inductor core 610 is optionally configured to exhibit a selected permeability and BH curve.

For example, the inductor core 610 is configured to exhibit low core losses under various operating conditions, such as in response to a high frequency pulse width modulation or harmonic ripple, compared to conventional materials. Conventional core materials are laminated silicon steel or conventional silicon iron steel designs. The inventor has determined that the core preferably comprises an iron powder material or multiple materials to provide a specific BH curve, described infra. The specified BH curve allows creation of inductors having: smaller components, reduced emissions, reduced core losses, and increased surface area in a given volume when compared to inductors using the above described traditional materials.

BH Curve

There are two quantities that physicists use to denote magnetic field, B and H. The vector field, H, is known among electrical engineers as the magnetic field intensity or magnetic field strength, which is also known as an auxiliary magnetic field or a magnetizing field. The vector field, H, is a function of applied current.

The vector field, B, is known as magnetic flux density or magnetic induction and has the international system of units (SI units) of Teslas (T). Thus, a BH curve is induction, B, as a function of the magnetic field, H.

Inductor Core/Distributed Gap

In one exemplary embodiment, the inductor core 610 comprises at least two materials. In one example, the core includes two materials, a magnetic material and a coating agent. In one case, the magnetic material includes a first transition series metal in elemental form and/or in any oxidation state. In a second case, the magnetic material is a form of iron. The second material is optionally a non-magnetic material and/or is a highly thermally conductive material, such as carbon, a carbon allotrope, and/or a form of carbon. A form of carbon includes any arrangement of elemental carbon and/or carbon bonded to one or more other types of atoms.

In one case, the magnetic material is present as particles and the particles are each coated with the coating agent to form coated particles. For example, particles of the magnetic material are each substantially coated with one, two, three, or more layers of a coating material, such as a form of carbon. The carbon provides a shock absorber affect, which minimized high frequency core loss from the inductor 230. In a preferred embodiment, particles of iron, or a form thereof, are coated with multiple layers of carbon to form carbon coated particles. The coated particles are optionally combined with a filler, such as a thermosetting polymer or an epoxy. The filler provides an average gap distance between the coated particles.

In another case, the magnetic material is present as a first layer in the form of particles and the particles are each at least partially coated, in a second layer, with the coating agent to form coated particles. The coated particles 630 are subsequently coated with another layer of a magnetic material, which is optionally the first magnetic material, to form a three layer particle. The three layer particle is optionally coated with a fourth layer of a non-magnetic material, which is optionally the non-magnetic material of the second layer. The process is optionally repeated to form particles of n layers, where n is a positive integer, such as about 2, 3, 4, 5, 10, 15, or 20. The n layers optionally alternate between a magnetic layer 632 and a non-magnetic layer 634. Optionally, the innermost particle of each coated particle is a non-magnetic particle.

Optionally, the magnetic material of one or more of the layers in the coated particle is an alloy. In one example, the alloy contains at least 70, 75, 80, 85, or 90 percent iron or a form of iron, such as iron at an oxidation state or bound to another atom. In another example, the alloy contains at least 1, 2, 3, 4, 5, 6, 7, 8, 9, or 10 percent aluminum or a form of aluminum. Optionally, the alloy contains a metalloid, such as boron, silicon, germanium, arsenic, antimony, and/or tellurium. An example of an alloy is sendust, which contains about eighty-five percent iron, nine percent silicon, and six percent aluminum. Sendust exhibits about zero magnetostriction.

The coated particles preferably have, with a probability of at least ninety percent, an average cross-sectional length of less than about one millimeter, one-tenth of a millimeter (100 μm), and/or one-hundredth of a millimeter (10 μm). While two or more coated particles in the core are optionally touching, the average gap distance, $d_1$, 636 between two coated particles is optionally a distance greater than zero and less than about one millimeter, one-tenth of a millimeter (100 μm), one-hundredth of a millimeter (10 μm), and/or one-thousandth of a millimeter (1 μm). With a large number of coated particles in the inductor 230, there exist a large number of gaps between two adjacent coated particles that are about evenly distributed within at least a portion of the inductor. The about evenly distributed gaps between particles in the inductor is optionally referred to as a distributed gap.

In one exemplary manufacturing process, the carbon coated particles are mixed with a filler, such as an epoxy. The resulting mixture is optionally pressed into a shape, such as an inductor shape, an about toroidal shape, a toroid shape, an about annular shape, or an about doughnut shape. Optionally, during the pressing process, the filler or epoxy is melted out. The magnetic path in the inductor goes through the distributed gaps. Small air pockets optionally exist in the inductor 230, such as between the coated particles. In use, the magnetic field goes from coated particle to coated particle through the filler gaps and/or through the air gaps.

The distributed gap nature of the inductor 230 yields an about even Eddy loss, gap loss, or magnetic flux loss. Substantially even distribution of the bonding agent within the iron powder of the core results in the equally distributed gap of the core. The resultant core loss at the switching frequencies of the electrical switches substantially reduces core losses when compared to silicon iron steel used in conventional iron core inductor design.

Further, conventional inductor construction requires gaps in the magnetic path of the steel lamination, which are typically outside the coil construction and are, therefore, unshielded from emitting flux, causing electromagnetically interfering radiation. The electromagnetic radiation can adversely affect the electrical system.

The distributed gaps in the magnetic path of the present inductor core 610 material are microscopic and substantially evenly distributed throughout the inductor core 610. The smaller flux energy at each gap location is also surrounded by a winding 620 which functions as an electromagnetic shield to contain the flux energy. Thus, a pressed powder core surrounded by windings results in substantially reduced electromagnetic emissions.

Figure 7:
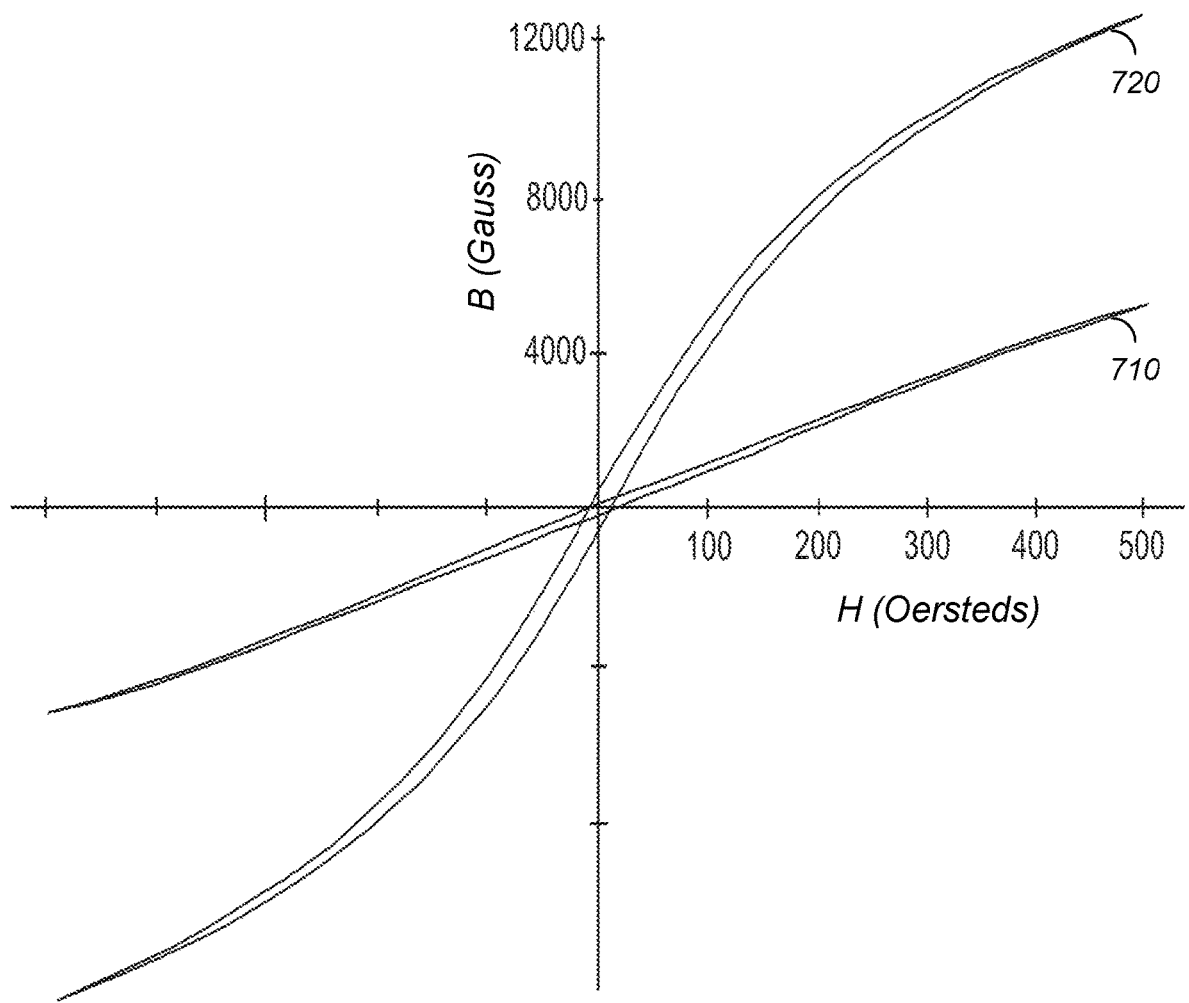
FIG. 7 provides exemplary BH curve results.

Referring now to FIG. 7 and to Table 1, preferred inductance, B, levels as a function of magnetic force strength are provided. The inductor core 610 material preferably comprises: an inductance of about −4400 to 4400 B over a range of about −400 to 400 H with a slope of about 11 AB/AH. Herein, permeability refers to the slope of a BH curve and has units of AB/AH. Core materials having a substantially linear BH curve with AB/AH in the range of ten to twelve are usable in a preferred embodiment. Less preferably, core materials having a substantially linear BH curve with a permeability, AB/AH, in the range of nine to thirteen are acceptable. Two exemplary BH curves 710, 720 are provided in FIG. 7.

TABLE 1

BH Response
(Permeability of Eleven)

| B (Tesla/Gauss) | H (Oersted) |
| --- | --- |
| −4400 | −400 |
| −2200 | −200 |
| −1100 | −100 |
| 1100 | 100 |
| 2200 | 200 |
| 4400 | 400 |

Optionally, the inductor 230 is configured to carry a magnetic field of at least one of:
less than about 2000, 2500, 3000, or 3500 Gauss at an absolute Oersted value of at least 100;
less than about 4000, 5000, 6000, or 7000 Gauss at an absolute Oersted value of at least 200;
less than about 6000, 7500, 9000, or 10,500 Gauss at an absolute Oersted value of at least 300; and
less than about 8000, 10,000, 12,000, or 14,000 Gauss at an absolute Oersted value of at least 400.

In one embodiment, the inductor core 610 material exhibits a substantially linear flux density response to magnetizing forces over a large range with very low residual flux, $B_R$. The inductor core 610 preferably provides inductance stability over a range of changing potential loads, from low load to full load to overload.

The inductor core 610 is preferably configured in an about toroidal, about circular, doughnut, or annular shape where the toroid is of any size. The configuration of the inductor core 610 is preferably selected to maximize the inductance rating, $A_L$, of the inductor core 610, enhance heat dissipation, reduce emissions, facilitate winding, and/or reduce residual capacitances.

Medium Voltage

Herein, a corona potential is the potential for long term breakdown of winding wire insulation due to high electric potentials between winding turns winding a mid-level power inductor in a converter system. The high electric potential creates ozone, which breaks down insulation coating the winding wire and results in degraded performance or failure of the inductor.

Herein, power is described as a function of voltage. Typically, homes and buildings use low voltage power supplies, which range from about 100 to 690 volts. Large industry, such as steel mills, chemical plants, paper mills, and other large industrial processes optionally use medium voltage filter inductors and/or medium voltage power supplies. Herein, medium voltage power refers to power having about 1,500 to 35,000 volts or optionally about 2,000 to 5,000 volts. High voltage power refers to high voltage systems or high voltage power lines, which operate from about 20,000 to 150,000 volts.

In one embodiment, a power converter method and apparatus is described, which is optionally part of a filtering method and apparatus. The inductor is configured with inductor winding spacers, such as a main inductor spacer and/or inductor segmenting winding spacers. The spacers are used to space winding turns of a winding coil about an inductor. The insulation of the inductor spacer minimizes energy transfer between windings and thus minimizes corona potential, formation of corrosive ozone through ionization of oxygen, correlated breakdown of insulation on the winding wire, and/or electrical shorts in the inductor.

More particularly, the inductor configured with winding spacers uses the winding spacers to separate winding turns of a winding wire about the core of the inductor, which reduces the volts per turn. The reduction in volts per turn minimizes corona potential of the inductor. Additional electromagnetic components, such as capacitors, are integrated with the inductor configured with winding spacers to facilitate power processing and/or power conversion. The inductors configured with winding spacers described herein are designed to operate on medium voltage systems and to minimize corona potential in a mid-level power converter. The inductors configured with winding spacers, described infra, are optionally used on low and/or high voltage systems.

Inductor Winding Spacers

In still yet another embodiment, the inductor 230 is optionally configured with inductor winding spacers. Generally, the inductor winding spacers or simply winding spacers are used to space winding turns to reduce corona potential, described infra.

For clarity of presentation, initially the inductor winding is described. Subsequently, the corona potential is further described. Then the inductor spacers are described. Finally, the use of the inductor spacers to reduce corona potential through controlled winding with winding turns separated by the insulating inductor spacers is described.

Inductor Winding

The inductor 230 includes a inductor core 610 that is wound with a winding 620. The winding 620 comprises a conductor for conducting electrical current through the inductor 230. The winding 620 optionally comprises any suitable material for conducting current, such as conventional wire, foil, twisted cables, and the like formed of copper, aluminum, gold, silver, or other electrically conductive material or alloy at any temperature.

Preferably, the winding 620 comprises a set of wires, such as copper magnet wires, wound around the inductor core 610 in one or more layers. Preferably, each wire of the set of wires is wound through a number of turns about the inductor core 610, where each element of the set of wires initiates the winding at a winding input terminal and completes the winding at a winding output terminal. Optionally, the set of wires forming the winding 620 nearly entirely covers the inductor core 610, such as a toroidal shaped core. Leakage flux is inhibited from exiting the inductor 230 by the winding 620, thus reducing electromagnetic emissions, as the windings 620 function as a shield against such emissions. In addition, the soft radii in the geometry of the windings 620 and the inductor core 610 material are less prone to leakage flux than conventional configurations. Stated again, the toroidal or doughnut shaped core provides a curved outer surface upon which the windings are wound. The curved surface allows about uniform support for the windings and minimizes and/or reduced gaps between the winding and the core.

Corona Potential

A corona potential is the potential for long term breakdown of winding wire insulation due to the high electric potentials between winding turns near the inductor 230, which creates ozone. The ozone breaks down insulation coating the winding wire, results in degraded performance, and/or results in failure of the inductor 230.

Inductor Spacers

The inductor 230 is optionally configured with inductor winding spacers, such as a main inductor spacer 810 and/or inductor segmenting winding spacers 820. Generally, the spacers are used to space winding turns, described infra. Collectively, the main inductor spacer 810 and segmenting winding spacers 820 are referred to herein as inductor spacers. Generally, the inductor spacer comprises a non-conductive material, such as air, a plastic, or a dielectric material. The insulation of the inductor spacer minimizes energy transfer between windings and thus minimizes or reduces corona potential, formation of corrosive ozone through ionization of oxygen, correlated breakdown of insulation on the winding wire, and/or electrical shorts in the inductor 230.

A first low power example, of about 690 volts, is used to illustrate need for a main inductor spacer 810 and lack of need for inductor segmenting winding spacers 820 in a low power transformer. In this example, the inductor 230 includes a inductor core 610 wound twenty times with a winding 620, where each turn of the winding about the core is about evenly separated by rotating the inductor core 610 about eighteen degrees (360 degrees/20 turns) for each turn of the winding. If each turn of the winding 620 about the core results in 34.5 volts, then the potential between turns is only about 34.5 volts, which is not of sufficient magnitude to result in a corona potential. Hence, inductor segmentation winding spacers 820 are not required in a low power inductor/conductor system. However, potential between the winding input terminal and the winding output terminal is about 690 volts (34.5 volts times 20 turns). More specifically, the potential between a winding wire near the input terminal and the winding wire near the output terminal is about 690 volts, which can result in corona potential. To minimize the corona potential, an insulating main inductor spacer 810 is placed between the input terminal and the output terminal. The insulating property of the main inductor spacer 810 minimizes or prevents shorts in the system, as described supra.

A second medium power example illustrates the need for both a main inductor spacer 810 and inductor segmenting winding spacers 820 in a medium power system. In this example, the inductor 230 includes a inductor core 610 wound 20 times with a winding 620, where each turn of the winding about the core is about evenly separated by rotating the inductor core 610 about 18 degrees (360 degrees/20 turns) for each turn of the winding. If each turn of the winding 620 about the core results in about 225 volts, then the potential between individual turns is about 225 volts, which is of sufficient magnitude to result in a corona potential. Placement of an inductor winding spacer 820 between each turn reduces the corona potential between individual turns of the winding. Further, potential between the winding input terminal and the winding output terminal is about 4500 volts (225 volts times 20 turns). More specifically, the potential between a winding wire near the input terminal and the winding wire near the output terminal is about 4500 volts, which results in corona potential. To minimize the corona potential, an insulating main inductor spacer 810 is placed between the input terminal and the output terminal. Since the potential between winding wires near the input terminal and output terminal is larger (4500 volts) than the potential between individual turns of wire (225 volts), the main inductor spacer 810 is preferably wider and/or has a greater insulation than the individual inductor segmenting winding spacers 820.

In a low power system, the main inductor spacer 810 is optionally about 0.125 inch in thickness. In a mid-level power system, the main inductor spacer is preferably about 0.375 to 0.500 inch in thickness. Optionally, the main inductor spacer 810 thickness is greater than about 0.125, 0.250, 0.375, 0.500, 0.625, or 0.850 inch. The main inductor spacer 810 is preferably thicker, or more insulating, than the individual segmenting winding spacers 820. Optionally, the individual segmenting winding spacers 820 are greater than about 0.0312, 0.0625, 0.125, 0.250, 0.375 inches thick. Generally, the main inductor spacer 810 has a greater thickness or cross-sectional width that yields a larger electrically insulating resistivity versus the cross-section or width of one of the individual segmenting winding spacers 820. Preferably, the electrical resistivity of the main inductor spacer 810 between the first turn of the winding wire proximate the input terminal and the terminal output turn proximate the output terminal is at least about 10, 20, 30, 40, 50, 60, 70, 80, 90, or 100 percent greater than the electrical resistivity of a given inductor segmenting winding spacer 820 separating two consecutive turns of the winding 620 about the inductor core 610 of the inductor 230. The main inductor spacer 810 is optionally a first material and the inductor segmenting spacers are optionally a second material, where the first material is not the same material as the second material. The main inductor spacer 810 and inductor segmenting winding spacers 820 are further described, infra.

In yet another example, the converter operates at levels exceeding about 2000 volts at currents exceeding about 400 amperes. For instance, the converter operates at above about 1000, 2000, 3000, 4000, or 5000 volts at currents above any of about 500, 1000, or 1500 amperes. Preferably the converter operates at levels less than about 15,000 volts.

Figure 8:
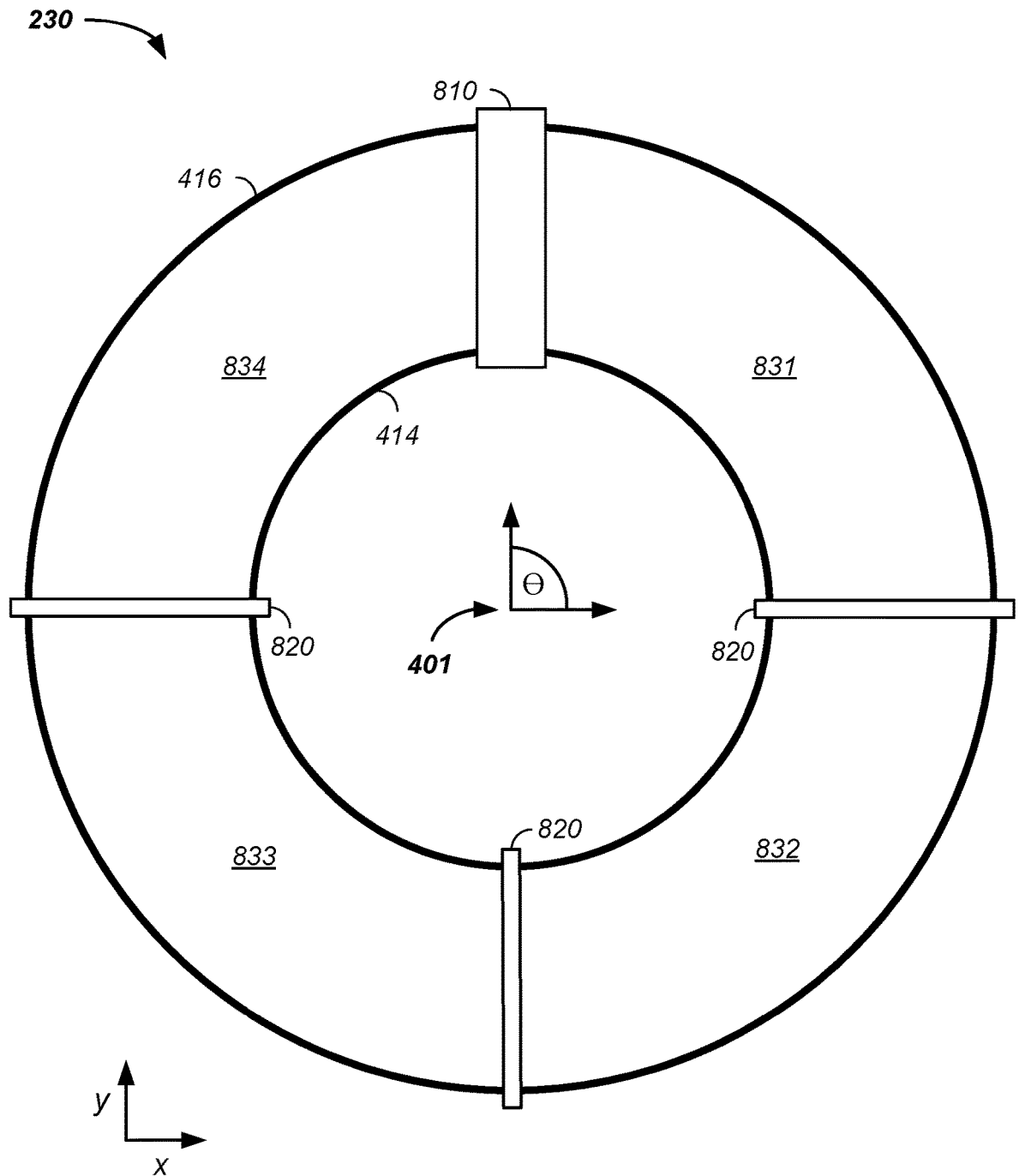
FIG. 8 illustrates a sectioned inductor.

Referring now to FIG. 8, an example of an inductor 230 configured with four spacers is illustrated. For clarity, the main inductor spacer 810 is positioned at the twelve o'clock position and the inductor segmenting winding spacers 820 are positioned relative to the main inductor winding spacer. The clock position used herein are for clarity of presentation. The spacers are optionally present at any position on the inductor and any coordinate system is optionally used. For example, referring still to FIG. 8, the three illustrated inductor segmenting winding spacers 820 are positioned at about the three o'clock, six o'clock, and nine o'clock positions. However, the main inductor spacer 810 is optionally present at any position and the inductor segmenting winding spacers 820 are positioned relative to the main inductor spacer 810. As illustrated, the four spacers segment the toroid into four sections. Particularly, the main inductor spacer 810 and the first inductor segmenting winding spacer at the three o'clock position create a first inductor section 831. The first of the inductor segmenting winding spacers at the three o'clock position and a second of the inductor segmenting winding spacers at the six o'clock position create a second inductor section 832. The second of the inductor segmenting winding spacers at the six o'clock position and a third of the inductor segmenting winding spacers at the nine o'clock position create a third inductor section 833. The third of the inductor segmenting winding spacers at the nine o'clock position and the main inductor spacer 810 at about the twelve o'clock position create a fourth inductor section 834. In this system, preferably a first turn of the winding 620 wraps the inductor core 610 in the first inductor section 831, a second turn of the winding 620 wraps the inductor core 610 in the second inductor section 832, a third turn of the winding 620 wraps the inductor core 610 in the third inductor section 833, and a fourth turn of the winding 620 wraps the inductor core 610 in the fourth inductor section 834. Generally, the number of inductor spacers 810 is set to create 2, 3, 4, 5, 6, 7, 8, 9, 10, 11, 12, 13, 14, 15, 16, 17, 18, 19, 20, or more inductor sections. Generally, the angle theta is the angle between two inductor sections from a central point 401 of the inductor 230. Each of the spacers 810, 820 is optionally a ring about the inductor core 610 or is a series of segments about forming a circumferential ring about the inductor core 610.

Inductor spacers provide an insulating layer between turns of the winding. Still referring to FIG. 8, an individual spacer 810, 820 preferably circumferentially surrounds the inductor core 610. Preferably, the individual spacers 810, 820 extend radially outwardly from an outer surface of the inductor core 610. The spacers 810, 820 optionally contact and/or proximally contact the inductor core 610, such as via an adhesive layer or via a spring loaded fit.

Figure 9:
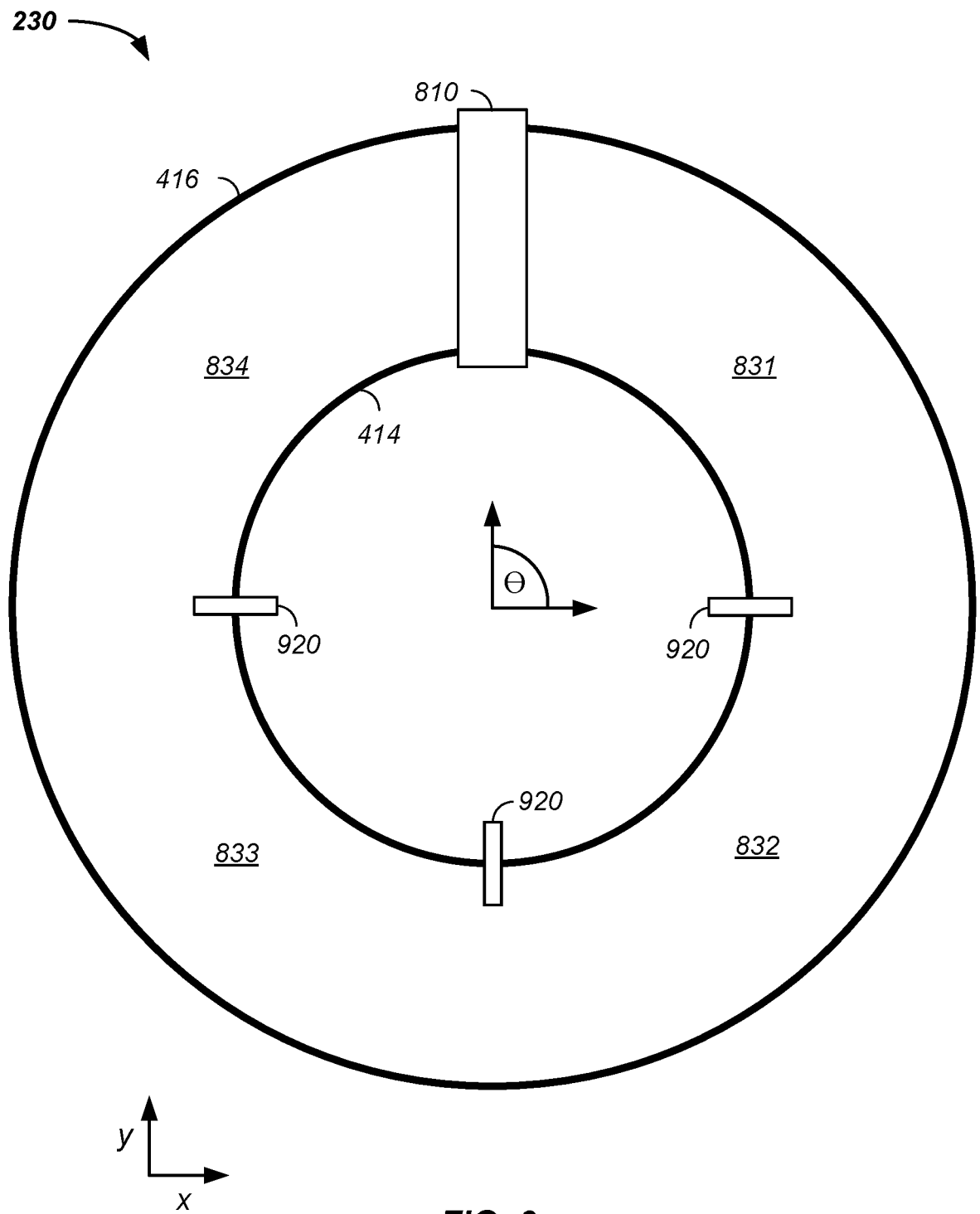
FIG. 9 illustrates partial circumferential inductor winding spacers.

Referring now to FIG. 9, optionally one or more of the spacers do not entirely circumferentially surround the inductor core 610. For example, short spacers 920 separate the individual turns of the winding at least in the central aperture 412 of the inductor core 610. In the illustrated example, the short spacers 920 separate the individual turns of the winding in the central aperture 412 of the inductor core 610 and along a portion of the inductor faces 417, where geometry dictates that the distance between individual turns of the winding 620 is small relative to average distance between the wires at the outer face 416.

Figure 10:
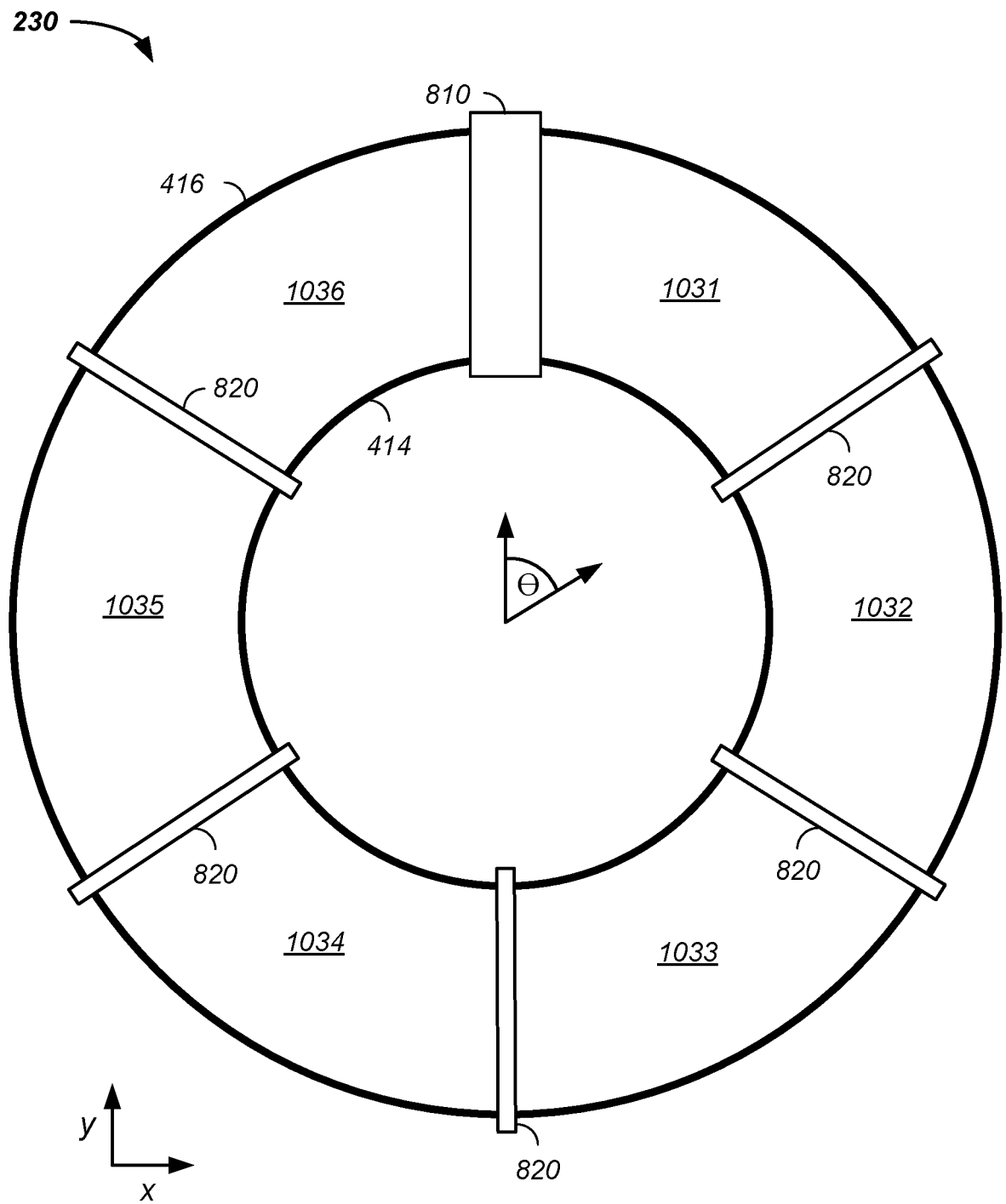
FIG. 10 illustrates an inductor with multiple winding spacers.
Figure 11:
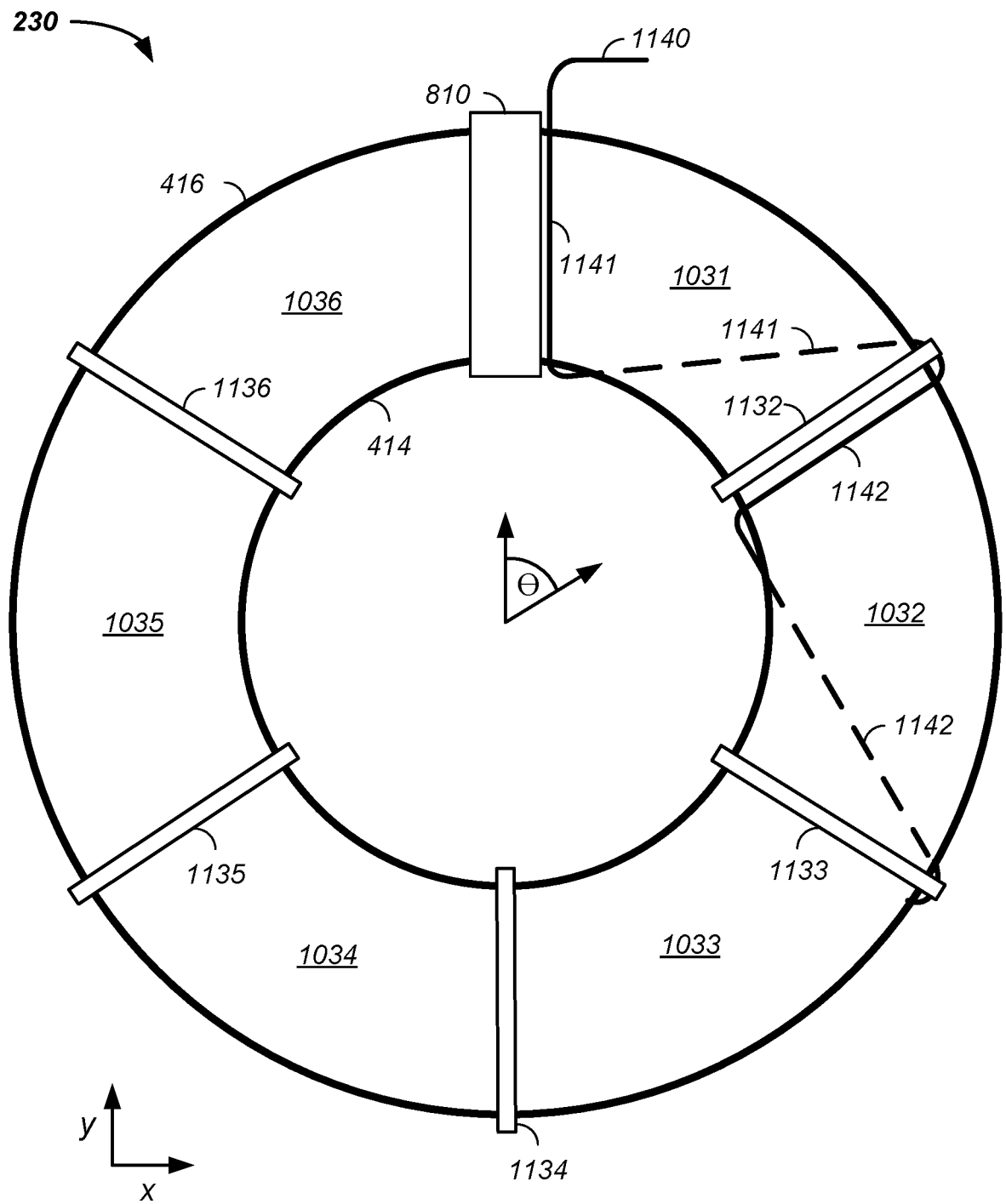
FIG. 11 illustrates two winding turns on an inductor.
Figure 12:
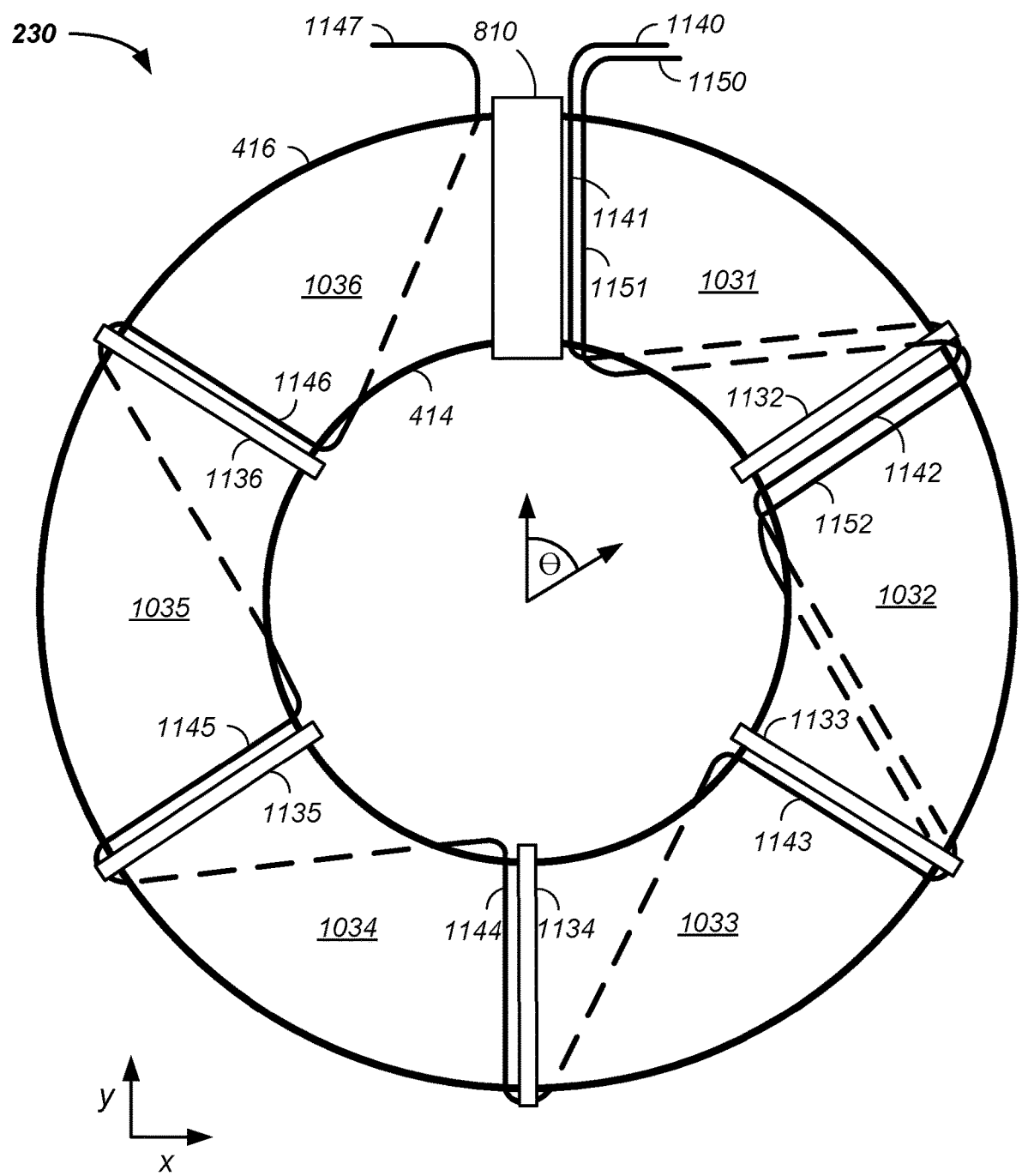
FIG. 12 illustrates multiple wires winding an inductor.

Referring now to FIGS. 10, 11, and 12, an example of an inductor 230 segmented into six sections using a main inductor spacer 810 and a set of inductor segmenting winding spacers 820 is provided. Referring now to FIG. 10, the main inductor spacer 810 and five inductor segmenting winding spacers 820 segment the periphery of the core into six regions 1031, 1032, 1033, 1034, 1035, and 1036.

Referring now to FIG. 11, two turns of a first winding are illustrated. A first winding wire 1140 is wound around the first region core 1031 in a first turn, such as a first wire turn 1141. Similarly, the winding 620 is continued in a second turn, such as a second wire turn 1142 about a second region of the core 1032. The first wire turn 1141 and the second wire turn 1142 are optionally separated by a first segmenting winding spacer 1132.

Referring now to FIG. 12, six turns of a first winding are illustrated. Continuing from FIG. 11, the winding 620 is continued in a third turn, such as a third wire turn 1143; a fourth turn, such as a fourth wire turn 1144; a fifth turn, such as a fifth wire turn 1145; and a sixth turn, such as a sixth wire turn 1146. As illustrated, optional segmenting spacers are used to separate turns. The first and second wire turns 1141, 1142 are separated by the first segmenting winding spacer 1132, the second and third wire turns 1142, 1143 are separated by the second segmenting winding spacer 1133, the third and fourth wire turns 1143, 1144 are separated by the third segmenting winding spacer 1134, the fourth and fifth wire turns 1144, 1145 are separated by the fourth segmenting winding spacer 1135, and the fifth and sixth wire turns 1145, 1146 are separated by the fifth segmenting winding spacer 1136. Further, the first and sixth wire turns 1141, 1146 are separated by the main inductor spacer 810. Similarly, the first two turns 1151, 1152 of a second winding wire 1150 are illustrated, that are separated by the first segmenting winding spacer 1132. Generally, any number of winding wires are wrapped or layered to form the winding 620 about the inductor core 610 of the inductor 230. An advantage of the system is that in a given inductor section, such as the first inductor section 1031, each of the winding wires are at about the same potential, which yields essentially no risk of corona potential within a given inductor section. Generally, an $m^{th}$ turn of an $n^{th}$ wire are within about 5, 10, 15, 30, 45, or 60 degrees of each other at any position on the inductor, such as at about the six o'clock position.

For a given winding wire, the first turn of the winding wire, such as the first wire turn 1141, proximate the input terminal is referred to herein as an initial input turn. For the given wire, the last turn of the wire before the output terminal, such as the sixth wire turn 1146, is referred to herein as the terminal output turn. The initial input turn and the terminal output turn are preferably separated by the main inductor spacer.

A given inductor segmenting winding spacer 820 optionally separates two consecutive winding turns of a winding wire winding the inductor core 610 of the inductor 230.

Figure 13:
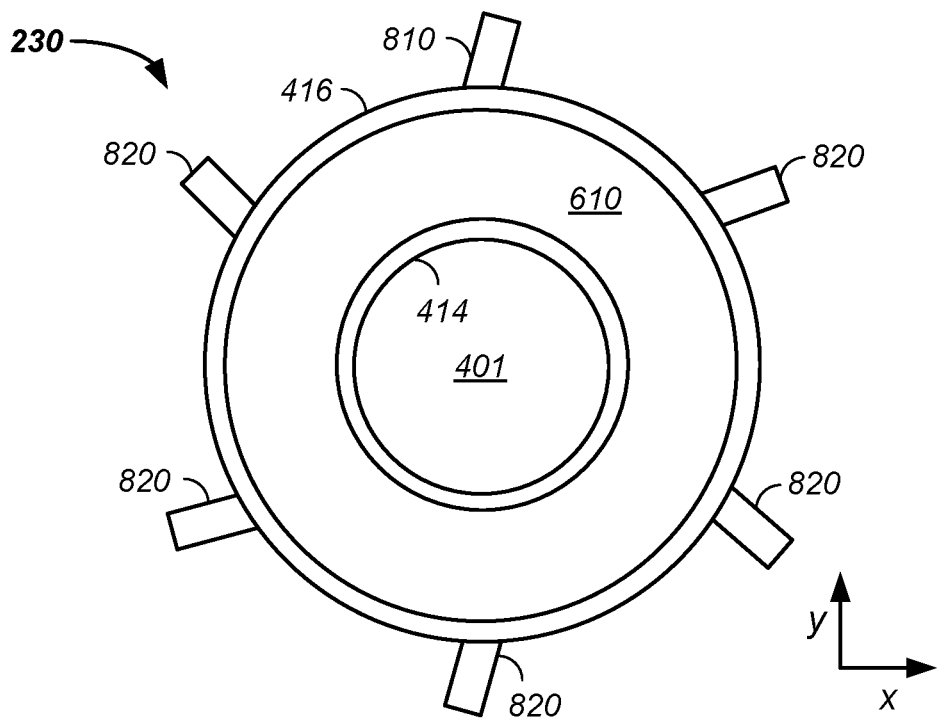
FIG. 13 illustrates tilted winding spacers on an inductor.

Referring now to FIG. 13, one embodiment of manufacture rotates the inductor core 610 as one or more winding wires are wrapped about the inductor core 610.

For example, for a four turn winding, the core is rotated about 90 degrees with each turn. During the winding process, the inductor core 610 is optionally rotated at an about constant rate or is rotated and stopped with each turn. To aid in the winding process, the spacers are optionally tilted, rotated, or tilted and rotated.

Figure 14:
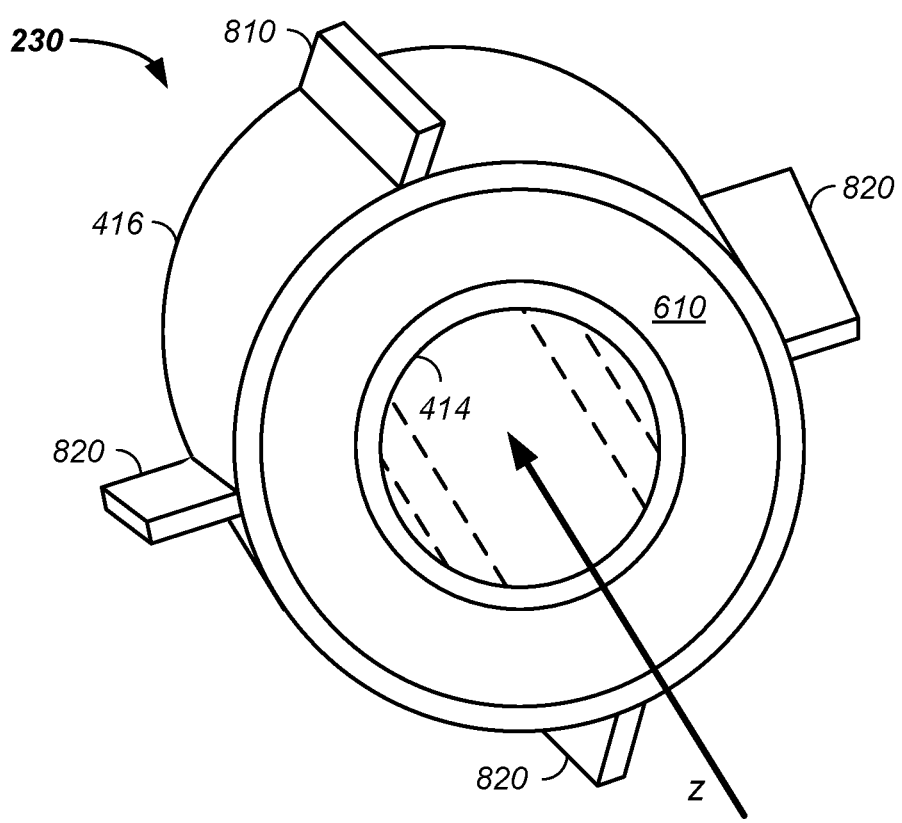
FIG. 14 illustrates tilted and rotated winding spacers on an inductor.

Referring now to FIG. 13, inductor spacers 810, 820 are illustrated that are tilted relative to a spacer about parallel to the outer face 416 of the inductor 230. For clarity of presentation, the inductor spacers are only illustrated on the outer edge of the inductor core 610. Tilted spacers on the outer edge of the inductor 230 have a length that is aligned with the z-axis, but are tilted along the x- and/or y-axes. More specifically, as the spacer 810, 820 extends radially outward from the inductor core 610, the spacer 810, 820 position changes in terms of both the x- and y-axes locations. Referring now to FIG. 14, inductor spacers are illustrated that are both tilted and rotated. For clarity of presentation, the inductor spacers are only illustrated on the outer edge of the inductor core 610. Tilted and rotated spacers on the outer edge of the inductor core 610 have both a length that is rotated relative to the z-axis and a height that is tilted relative to the x- and/or y-axes, as described supra.

Capacitor

Referring again to FIG. 2, capacitors 250 are used with inductors 230 to create a filter to remove harmonic distortion from current and voltage waveforms. A buss bar carries power from one point to another. The capacitor buss bar 260 mounting system minimizes space requirements and optimizes packaging. The buss bars use a toroid/heat sink integrated system solution, THISS®, (CTM Magnetics, Tempe, AZ) to filter output power 150 and customer generated input power 154. The efficient filter output terminal layout described herein minimizes the copper cross section necessary for the capacitor buss bars 260. The copper cross section is minimized for the capacitor buss bar by sending the bulk of the current directly to the output terminals 221, 223, 225. In these circuits, the current carrying capacity of the capacitor bus conductor is a small fraction of the full approximate line frequency load or fundamental frequency current sent to the output load via the output terminals 221, 223, 225. The termination of the THISS® technology filter inductor is integrated to the capacitor bank for each phase of the system. These buss bars are optionally manufactured out of any suitable material and are any suitable shape. For instance, the buss bars are optionally a flat strip or a hollow tube. In one example, flat strips of tinned copper with threaded inserts or tapped threaded holes are used for both mounting the capacitors mechanically as well as providing electrical connection to each capacitor. This system optimizes the packaging efficiency of the capacitors by mounting them vertically and staggering each capacitor from each side of the buss bar for maximum density in the vertical dimension. A common neutral buss bar or flex cable 265 is used between two phases to further reduce copper quantity and to minimize size. A jumper buss bar connects this common neutral point to another phase efficiently, such as through use of an about flat strip of copper. Connection fittings designed to reduce radio-frequency interference and power loss are optionally used. The buss bars are optionally designed for phase matching and for connecting to existing transmission apparatus. The buss bars optionally use a mechanical support spacer, 270, made from non-magnetic, non-conductive material with adequate thermal and mechanical properties, such as a suitable epoxy and glass combination, a Glastic® or a Garolite material. The integrated output terminal buss bars provide for material handling of the filter assembly as well as connection to the sine wave filtered load or motor. Though a three phase implementation is displayed, the implementation is readily adapted to integrate with other power systems.

Referring now to FIG. 15, an additional example of a capacitor bank 1500 is provided. In this example, a three phase system containing five total buss bars 260 including a common neutral buss bar 265 is provided. The illustrated system contains seven columns and three rows of capacitors 250 per phase or twenty-one capacitors per phase for each of three phases, U1, V1, W1. Spacers maintain separation of the component capacitors. A shared neutral point 270 illustrates two phases sharing a single shared neutral bus.

Cooling

In still yet another embodiment, the inductor 230 is cooled with a cooling system 240, such as with a fan, forced air, a heat sink, a heat transfer element or system, a thermal transfer potting compound, a liquid coolant, and/or a chill plate. Each of these optional cooling system elements are further described, infra. While, for clarity, individual cooling elements are described separately, the cooling elements are optionally combined into the cooling system in any permutation and/or combination.

Heat Sink

A heat sink 1640 is optionally attached to any of the electrical components described herein. Optionally, a heat sink 1640 or a heat sink fin is affixed to an internal surface of a cooling element container, where the heat sink fin protrudes into an immersion coolant, an immersion fluid, and/or into a potting compound to enhance thermal transfer away from the inductor 230 to the housing element.

Fan

In one example, a cooling fan is used to move air across any of the electrical components, such as the inductor 230 and/or the capacitor 250. The air flow is optionally a forced air flow. Optionally, the air flow is directed through a shroud 450 encompassing one, two, three or more inductors 230. Optionally, the shroud 450 encompasses one or more electrical components of one, two, three or more power phases. Optionally, the shroud 450 contains an air flow guiding element between individual power phases.

Thermal Grease

Any of the inductor components, such as the inductor core, inductor winding, a coating on the inductor core, and/or a coating on the inductor winding is optionally coated with a thermal grease to enhance thermal transfer of heat away from the inductor.

Bundt Cooling System

Figure 16:
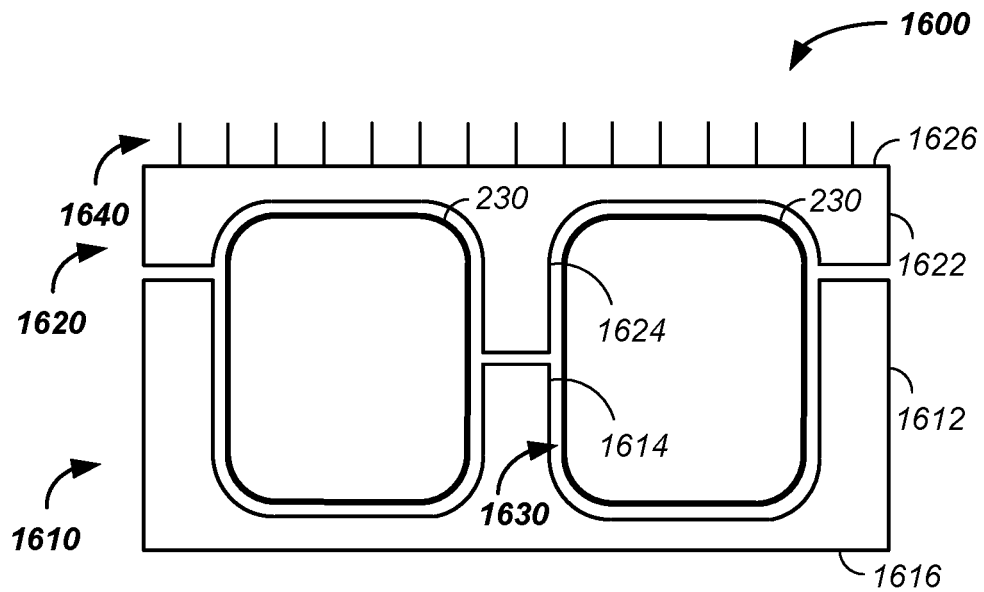
FIG. 16 illustrates a Bundt pan inductor cooling system.

In another example, a Bundt pan style inductor cooling system 1600 is described. Referring now to FIG. 16, a cross-section of a Bundt pan style cooling system is provided. A first element, an inductor guide 1610, optionally includes: an outer ring 1612 and/or an inner cooling segment 1614, elements of which are joined by an inductor positioning base 1616 to form an open inner ring having at least an outer wall. The inductor 230 is positioned within the inner ring of the inductor guide 1610 with an inductor face 417, such as the inductor front face 418, proximate the inductor positioning base 1616. The inductor guide 1610 is optionally about joined and/or is proximate to an inductor key 1620, where the inductor guide 1610 and the inductor key 1620 combine to form an inner ring cavity for positioning of the inductor 230. The inductor key 1620 optionally includes an outside ring 1622, a middle post 1624, and/or an inductor lid 1626.

During use, the inductor lid 1626 is proximate an inductor face 417, such as the inductor back face 419. The inductor base 1610, inductor 230, and inductor lid 1620 are optionally positioned in any orientation, such as to mount the inductor 230 horizontally, vertically, or at an angle relative to gravity.

The Bundt style inductor cooling system 1600 facilitates thermal management of the inductor 230. The inductor guide 1610 and/or the inductor lid 1620 is at least partially made of a thermally transmitting material, where the inductor guide 1610 and/or the inductor lid 1620 draws heat away from the inductor 230. A thermal transfer agent 1630, such as a thermally conductive potting compound, a thermal grease, and/or a heat transfer liquid is optionally placed between an outer surface of the inductor 230 and an inner surface of the inductor guide 1610 and/or the inductor lid 1620. One or more heat sinks 1640 or heat sink fins are optionally attached to any surface of the inductor base 1610 and/or the inductor lid 1620. In one case, not illustrated, the heat sink fins function as a mechanical stand under the inductor guide 1610 through which air or a liquid coolant optionally flows. More generally, a heat sink 1640 is optionally attached to any of the electrical components described herein.

Potting Material

Figure 17A:
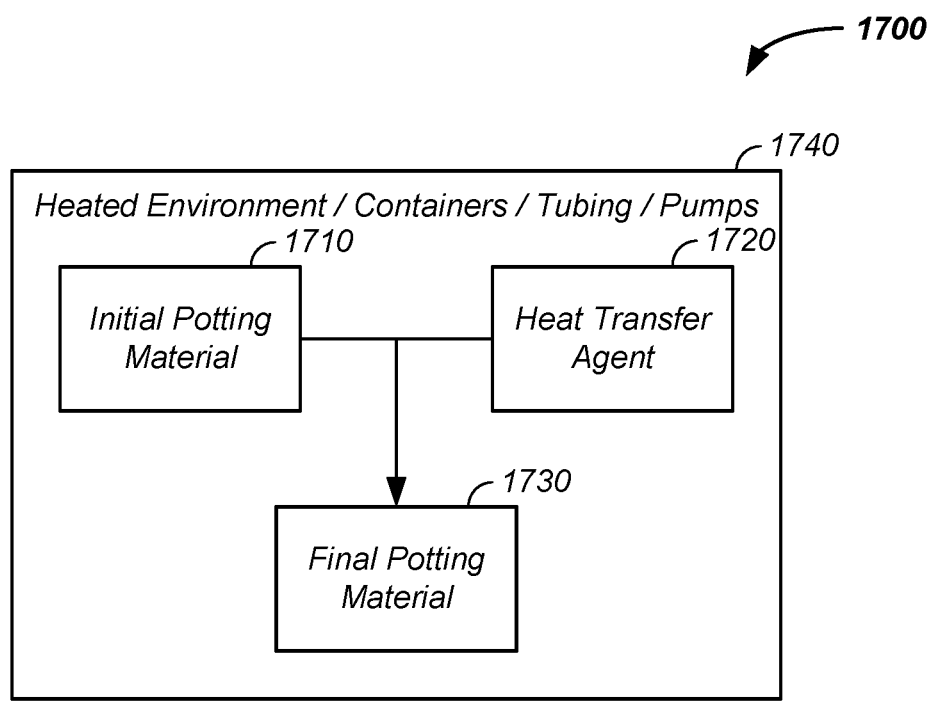
FIG. 17A illustrates formation of a heat transfer enhanced potting material.

Referring now to FIGS. 17 (A-C), the potting material 1760/potting compound/potting agent optionally and preferably comprises one or more of: a high thermal transfer coefficient; resistance to fissure when the mass of the inductor/conductor system has a large internal temperature change, such as greater than about 50, 100, or 150 degrees Centigrade; flexibility so as not to fissure with temperature variations, such as greater than 100 degrees Centigrade, in the potting mass; low thermal impedance between the inductor 230 and heat dissipation elements; sealing characteristics to seal the inductor assembly from the environment such that a unit can conform to various outdoor functions, such as exposure to water and salts; and/or mechanical integrity for holding the heat dissipating elements and inductor 230 together as a single module at high operating temperatures, such as up to about 150 or 200 degrees Centigrade. Examples of potting materials include: an electrical insulating material, a polyurethane; a urethane; a multi-part urethane; a polyurethane; a multi-component polyurethane; a polyurethane resin; a resin; a polyepoxide; an epoxy; a varnish; an epoxy varnish; a copolymer; a thermosetting polymer; a thermoplastic; a silicone based material; Conathane® (Cytec Industries, West Peterson, NJ), such as Conathane EN-2551, 2553, 2552, 2550, 2534, 2523, 2521, and EN 7-24; Insulcast® (ITW Insulcast, Roseland, NJ), such as Insulcast 333; Stycast® (Emerson and Cuming, Billerica, MA), such as Stycast 281; and/or an epoxy varnish potting compound. As described supra, the initial potting material 1710 is optionally mixed with a heat transfer agent 1720, such as silica sand or aluminum oxide. Preferable concentration by weight of the heat transfer agent 1720 in the final potting material 1730 is greater than twenty and less than eighty percent by weight. For example, the potting material 1760/potting agent/potting compound is about 25, 30, 35, 40, 45, 50, 55, 60, 65, or 70 percent silica sand and/or aluminum oxide by volume, yielding a potting compound with lower thermal impedance. The heat transfer enhanced potting material is further described, infra.

Heat Transfer Enhanced Potting Material

Referring again to FIG. 17A, a method of production and resulting apparatus of a heat transfer enhanced potting material 1700 is described. Generally, an initial potting material 1710 is mixed with a heat transfer agent 1720 to form a final potting material 1730 about any electrical component, such as about an inductor of a filter circuit, as described supra. Optionally and preferably, one or more of the initial potting material 1710, the heat transfer agent 1720, final potting material 1730, and/or any mixing, transfer pipe or tubing, and/or container are pre-heated or maintained at an elevated temperature to facility mixing and movement of components of the final potting material 1730 or any constituent thereof, as further described infra.

Referring again to FIG. 17B, without loss of generality, an example of a silicon dioxide enriched potting material 1750 is provided, where the silicon dioxide is an example of the heat transfer agent 1720. Generally, a first epoxy component 1752, such as an epoxy part A, is mixed with a silicon dioxide mixture 1754 and a second epoxy component 1756, such as an epoxy part B, with or without an additive 1758 to form a final potting material 1760, which is dispensed about an electrical component to form a potted electrical component, such as a potted inductor 1770.

Sand Mixture

Figure 17B:
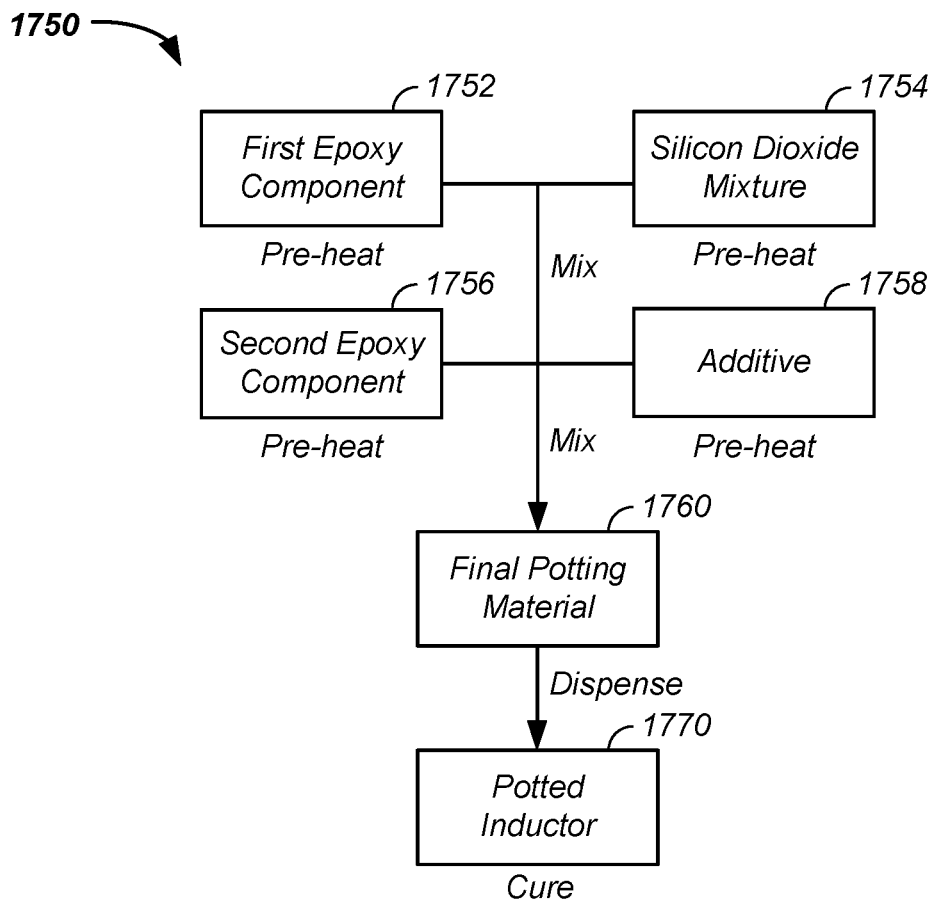
FIG. 17B illustrates an epoxy-sand potting material.
Figure 17C:
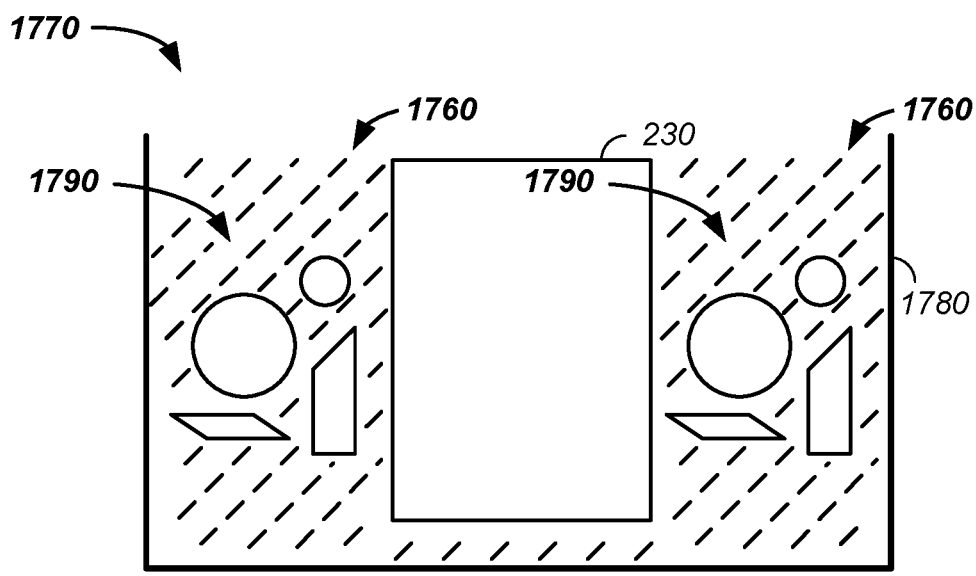
FIG. 17C illustrates the potting material about an electrical component.
Figure 18:
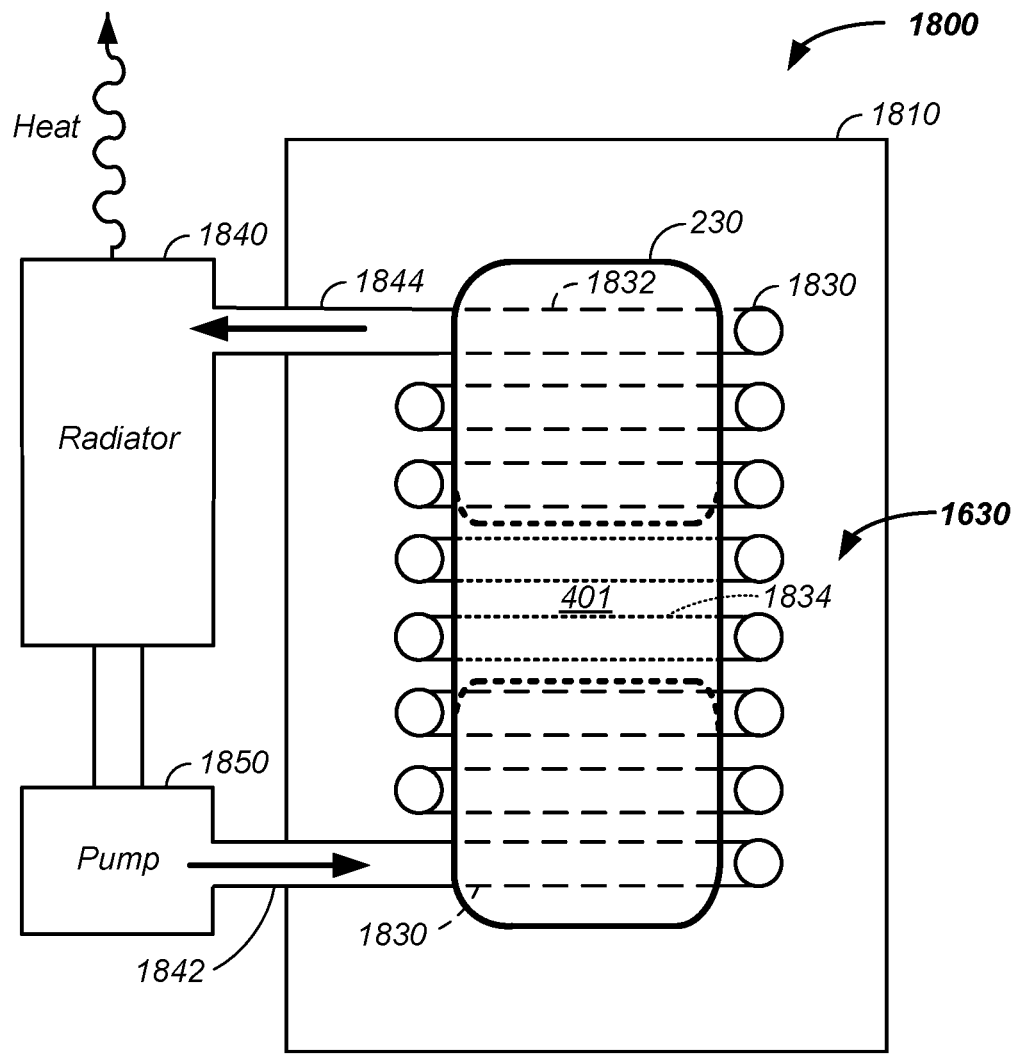
FIG. 18 illustrates a potted cooling line inductor cooling system.

Still referring to FIG. 17B and referring again to FIG. 17C, without loss of generality, the heat transfer agent 1720 is further described, where sand is the heat transfer agent 1720. A form of sand is the silicon dioxide mixture 1754. Herein, the silicon dioxide component 1790 of the silicon dioxide mixture 1754 of the final potting material 1760 is used to refer to one or more of a silica mixture, silica, silicon dioxide, $SiO_2$, and/or a synthetic silica or sand. Generally, the silica purity in the silicon dioxide mixture 1754 is greater than 50, 60, 70, 80, 90, 95, 99, or 99.5%. The silica mixture optionally contains one or more additional components, such as iron oxide, aluminum oxide, titanium dioxide, calcium oxide, magnesium oxide, sodium oxide, and/or potassium oxide. However, preferably the concentration of each of the non-silicon oxides is less than 5, 4, 3, 2, 1, 0.5, or 0.2%. For example, the aluminum oxide concentration is optionally less than 2, 1, 0.5, 0.25, or 0.125%. However, as aluminum oxide functions as an expensive alternative to silicon dioxide, impurities of aluminum oxide are optionally used. Optionally and preferably, the final concentration of silicon dioxide and/or the silicon dioxide mixture 1754 in the potting material is between 10 and 75%, more preferably in excess of 25% and still more preferably 30±5%, 35±5%, 40±5%, 45±5%, 50±5%, 55±5%, or 60±5% by weight. The silicon dioxide mixture constituents are optionally of any shape, such as spherical, crystalline, rounded silica, angular silica, and/or whole grain silica. The individual silicon dioxide mixture constituents are preferably greater than one and less than one thousand micrometers in average diameter and/or have an inner-quartile top size of less than 5, 15, 30, 45, 250, 500, 1000, or 5000 micrometers. Optionally, silica, the individual silicon dioxide components 1790, and/or crystals of the silicon dioxide mixture 1754 comprise a ninety-fifth percentile particle size of less than 10, 20, 40, 80, 160, 320, 640, 1280, or 2560 micrometers. Optional types of silica include whole grain silica, round silica, angular silica, and/or sub-angular grain shaped silica. Optionally, the silicon dioxide mixture 1754 is screened to select particle size, particle size ranges, and/or particle size distributions prior to use.

Additive

Still referring to FIG. 17B, the additive 1758 is optionally mixed into the potting material in place of the silicon dioxide mixture 1754 or in combination with the silicon dioxide mixture. For example, a thermal transfer enhancing agent is optionally mixed with the potting agent to aid in heat dissipation from the inductor during use. While metal oxides are optionally used as the additive, the metal oxides are expensive. The inventor has discovered that silicon dioxide functions as a readily obtainable additive that is affordable, obtainable in desired particle sizes, and functions as a heat transfer agent in the potting material. Optional additives include iron oxide, aluminum oxide, a coloring oxide, an alkaline earth, and/or a transition metal.

Referring again to FIG. 17C, the final potting material 1760 is illustrated about an inductor 230 in a housing 1780.

Heating/Mixing Process

Referring again to FIG. 17B, one or more constituents of the final potting material 1760 are optionally and preferably preheated, such as to greater than 80, 90, 100, 110, 120, 130, or 140 degrees Fahrenheit to facility movement of the one or more constituents through corresponding shipping containers, storage containers, tubing, mixers, and/or pumps. Mixing of the constituents of the final potting material 1760 is optionally and preferably performed on preheated constituents and/or during heating. Optionally, one, many, or all of the mixing steps use one or more pumps for each constituent moving the corresponding constituent though connection pipes, conduit, tubing, or flow lines, where the connection pipes are also optionally and preferably preheated. One or more flow meters, heated connection pipes, and/or a scales are used to control mixing ratios, where the preferred mixing ratios are described supra.

For clarity of presentation and without loss of generality, an example of a heating/mixing process is provided. An epoxy part A, such as in a 55 gallon shipping drum, is preheated to 110 degrees Fahrenheit. Optionally, during preheating, the epoxy part A is mixed through rolling of the shipping drum during heating, such as for greater than 0.1, 1, 4, 8, 16, or 24 hours. The heat transfer agent 1720, such as silica, is also optionally and preferably heated to 110 degrees Fahrenheit and mixed with the epoxy part A in a mixing container. The resulting mixed epoxy part A and silica is combined with an epoxy part B, in the mixing container or a subsequent container, where again the epoxy part B is optionally and preferably preheated, moved through a heated line using a pump, and measured. Optionally, an additive is added at any step, such as after mixing the epoxy part A and the silica and before mixing in the epoxy part B. The resulting mixture, such as the final potting mixture 1760, is subsequently dispensed into a container on, under, beside, and/or about an electrical part to be contained, such as an inductor, and/or about a cooling line, as described infra.

The resulting electrical system element potted in a solid material and heat transfer agent yields an enhanced heat transfer compound as the heat transfer of the heat transfer agent 1720 and/or additive 1758 exceeds that of the raw potting material 1710. For example the heat transfer of epoxy and silica are about 0.001 and 2 W/m-K, respectively. The inventor has determined that the higher heat transfer rate of the heat transfer agent enhanced potting material allows use of a smaller inductor due to the increased efficiency at reduced operating temperatures and that less potting material is used for the same heat transfer, both of which reduce size and cost of the electrical system.

Potted Cooling System

In still another example, a thermally potted cooling inductor cooling system 1800 is described. In the potted cooling system, one or more inductors 230 are positioned within a container 1810. A thermal transfer agent 1630, such as a thermally conductive potting agent is placed substantially around the inductor 230 inside the container 1810. The thermally conductive potting agent is any material, compound, or mixture used to transfer heat away from the inductor 230, such as a resin, a thermoplastic, and/or an encapsulant. Optionally, one or more cooling lines 1830 run through the thermal transfer agent. The cooling lines 1830 optionally wrap 1832 the inductor 230 in one or more turns to form a cooling coil and/or pass through 1834 the inductor 230 with one or more turns. Optionally, a coolant runs through the coolant line 1830 to remove heat to a radiator 1840. The radiator is optionally attached to the housing 1810 or is a stand-alone unit removed from the housing. A pump 1850 is optionally positioned anywhere in the system to move the coolant sequentially through a cooling line input 1842, through the cooling line 1830 to pick up heat from the inductor 230, through a cooling line output 1844, through the radiator 1840 to dissipate heat, and optionally back into the pump 1850. Generally, the thermal transfer agent 1630 facilitates movement of heat, relative to air around the inductor 230, to one or more of: a heat sink 1640, the cooling line 1830, to the housing 1810, and/or to the ambient environment.

Inductor Cooling Line

Figure 19:
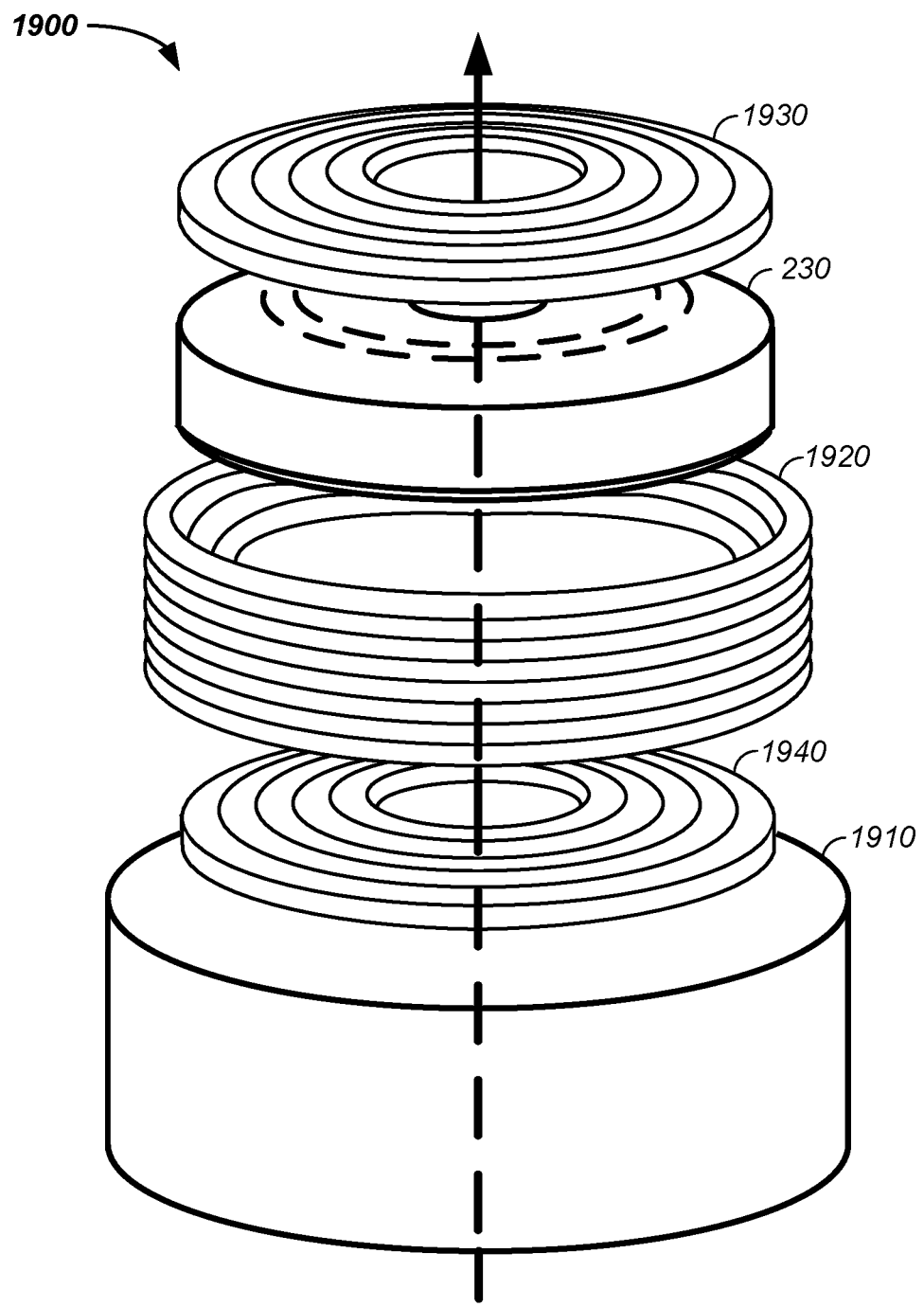
FIG. 19 illustrates a wrapped inductor cooling system.

In yet another example, an oil/coolant immersed inductor cooling system is provided. Referring now to FIG. 19, an expanded view example of a liquid cooled induction system 1900 is provided. In the illustrated example, an inductor 230 is placed into a cooling liquid container 1910. The container 1910 is preferably enclosed, but at least holds an immersion coolant. The immersion coolant is preferably in direct contact with the inductor 230 and/or the windings of the inductor 230. Optionally, a solid heat transfer material, such as the thermally conductive potting compound described supra, is used in place of the liquid immersion coolant. Optionally, the immersion coolant directly contacts at least a portion of the inductor core 610 of the inductor 230, such as near the input terminal and/or the output terminal. Further, the container 1910 preferably has mounting pads designed to hold the inductor 230 off of the inner surface of the container 1910 to increase coolant contact with the inductor 230. For example, the inductor 230 preferably has feet that allow for immersion coolant contact with a bottom side of the inductor 230 to further facilitate heat transfer from the inductor to the cooling fluid. The mounting feet are optionally placed on a bottom side of the container to facilitate cooling air flow under the container 1910.

Heat from a circulating coolant, separate from the immersion coolant, is preferably removed via a heat exchanger. In one example, the circulating coolant flows through an exit path 1844, through a heat exchanger, such as a radiator 1840, and is returned to the container 1910 via a return path 1842. Optionally a fan is used to remove heat from the heat exchanger. Typically, a pump 1850 is used in the circulating path to move the circulating coolant. Still referring to FIG. 19, the use of the circulating fluid to cool the inductor is further described. Optionally, the cooling line is attached to a radiator 1840 or outside flow through cooling source. Circulating coolant optionally flows through a cooling coil:

- circumferentially surrounding or making at least one cooling line turn 1920 or circumferential turn about the outer face 416 of the inductor 230 or on an inductor edge;
- forming a path, such as an about concentrically expanding upper ring 1930, with subsequent turns of the cooling line forming an upper cooling surface about parallel to the inductor front face 418;
- forming a path, such as an about concentrically expanding lower ring 1940, with subsequent turns of the cooling line forming a lower cooling surface about parallel to the inductor back face 419; and
- a cooling line running through the inductor 230 using a non-electrically conducting cooling coil or cooling coil segment.

Optionally, the coolant flows sequentially through one or more of the expanding upper ring 1930, the cooling line turn 1920, and the expanding lower ring 1940 or vise-versa. Optionally, parallel cooling lines run about, through, and/or near the inductor 230.

Coolant/Inductor Contact

Figure 20:
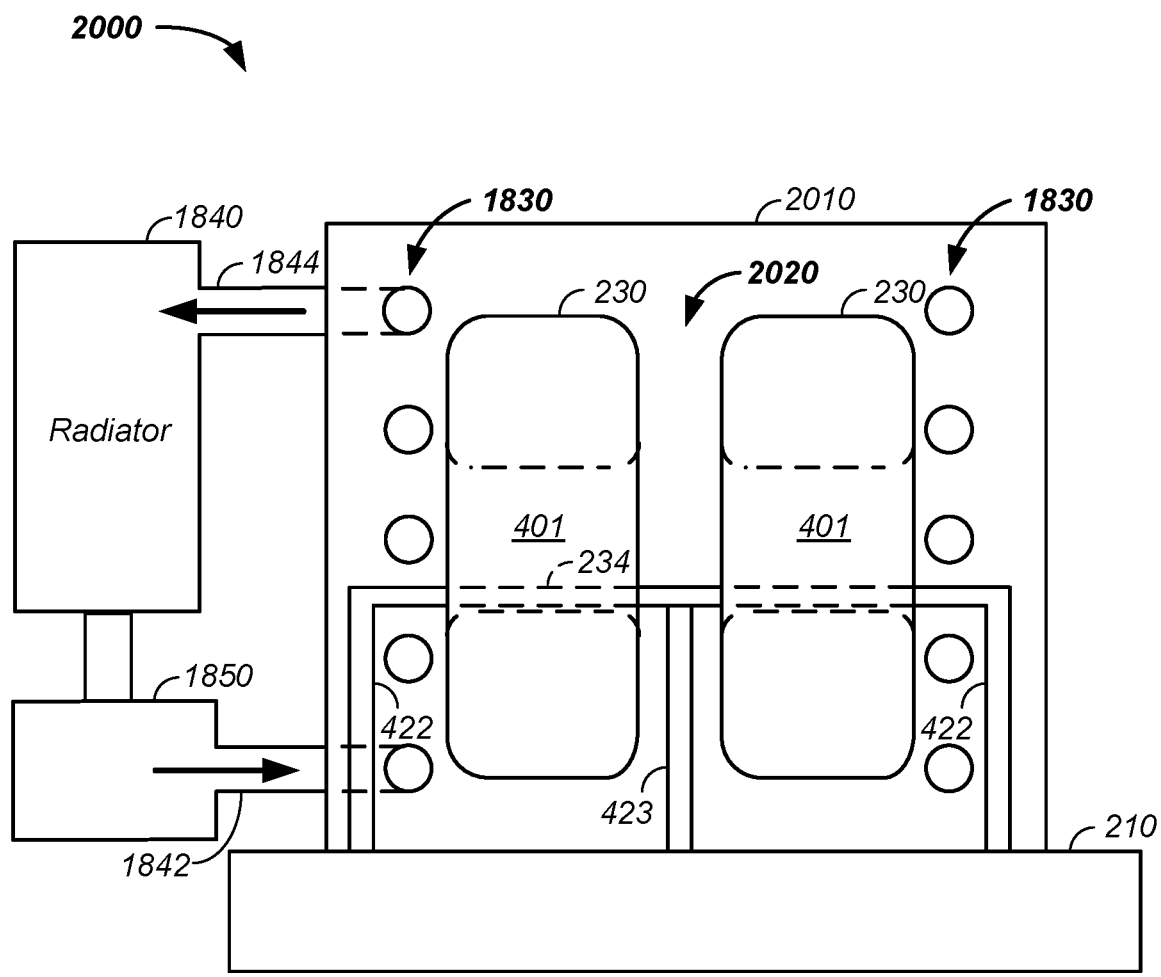
FIG. 20 illustrates an oil/coolant immersed cooling system.

In yet still another example, referring now to FIG. 20, heat is transferred from the inductor 230 to a heat transfer solution 2020 directly contacting at least part of the inductor 230.

In one case, the heat transfer solution 2020 transfers heat from the inductor 230 to an inductor housing 2010. In this case, the inductor housing 2010 radiates the heat to the surrounding environment, such as through a heat sink 1640.

In another case, the inductor 230 is in direct contact with the heat transfer solution 2020, such as partially or totally immersed in a non-conductive liquid coolant. The heat transfer solution 2020 absorbs heat energy from the inductor 230 and transfers a portion of that heat to a cooling line 1830 and/or a cooling coil and a coolant therein. The cooling line 1830, through which a coolant flows runs through the heat transfer solution 2020. The coolant caries the heat out of the inductor housing 2010 where the heat is removed from the system, such as in a heat exchanger or radiator 1840. The heat exchanger radiates the heat outside of the sealed inductor housing 2010. The process of heat removal transfer allows the inductor 230 to maintain an about steady state temperature under load.

For instance, an inductor 230 with an annular core, a doughnut shaped inductor, an inductor with a toroidal core, or a substantially circular shaped inductor is at least partially immersed in an immersion coolant, where the coolant is in intimate and direct thermal contact with a magnet wire, a winding coating, or the windings 610 about a core of the inductor 230. Optionally, the inductor 230 is fully immersed or sunk in the coolant. For example, an annular shaped inductor is fully immersed in an insulating coolant that is in intimate thermal contact with the heated magnet wire heat of the toroid surface area. Due to the direct contact of the coolant with the magnet wire or a coating on the magnet wire, the coolant is substantially non-conducting.

The immersion coolant comprises any appropriate coolant, such as a gas, liquid, gas/liquid, or suspended solid at any temperature or pressure. For example, the coolant optionally comprises: a non-conducting liquid, a transformer oil, a mineral oil, a colligative agent, a fluorocarbon, a chlorocarbon, a fluorochlorocarbon, a deionized water/alcohol mixture, or a mixture of non-conducting liquids. Less preferably, the coolant is de-ionized water. Due to pinholes in the coating on the magnet wire, slow leakage of ions into the de-ionized water results in an electrically conductive coolant, which would short circuit the system. Hence, if de-ionized water is used as a coolant, then the coating should prevent ion transport. Alternatively, the de-ionized cooling water is periodically filtered and/or changed. Optionally, an oxygen absorber is added into the coolant, which prevents ozonation of the oxygen due the removal of the oxygen from the coolant.

Still referring to FIG. 20, the inductor housing 2010 optionally encloses two or more inductors 230. The inductors 230 are optionally vertically mounted using mounting hardware 422 and a clamp bar 234. The clamp bar optionally runs through the two or more inductors 230. An optional clamp bar post 423 is positioned between the inductors 230.

Chill Plate

Often, an inductor 230 in an electrical system is positioned in industry in a sensitive area, such as in an area containing heat sensitive electronics or equipment. In an inductor 230 cooling process, heat removed from the inductor 230 is typically dispersed in the local environment, which can disrupt proper function of the sensitive electronics or equipment.

Figure 21:
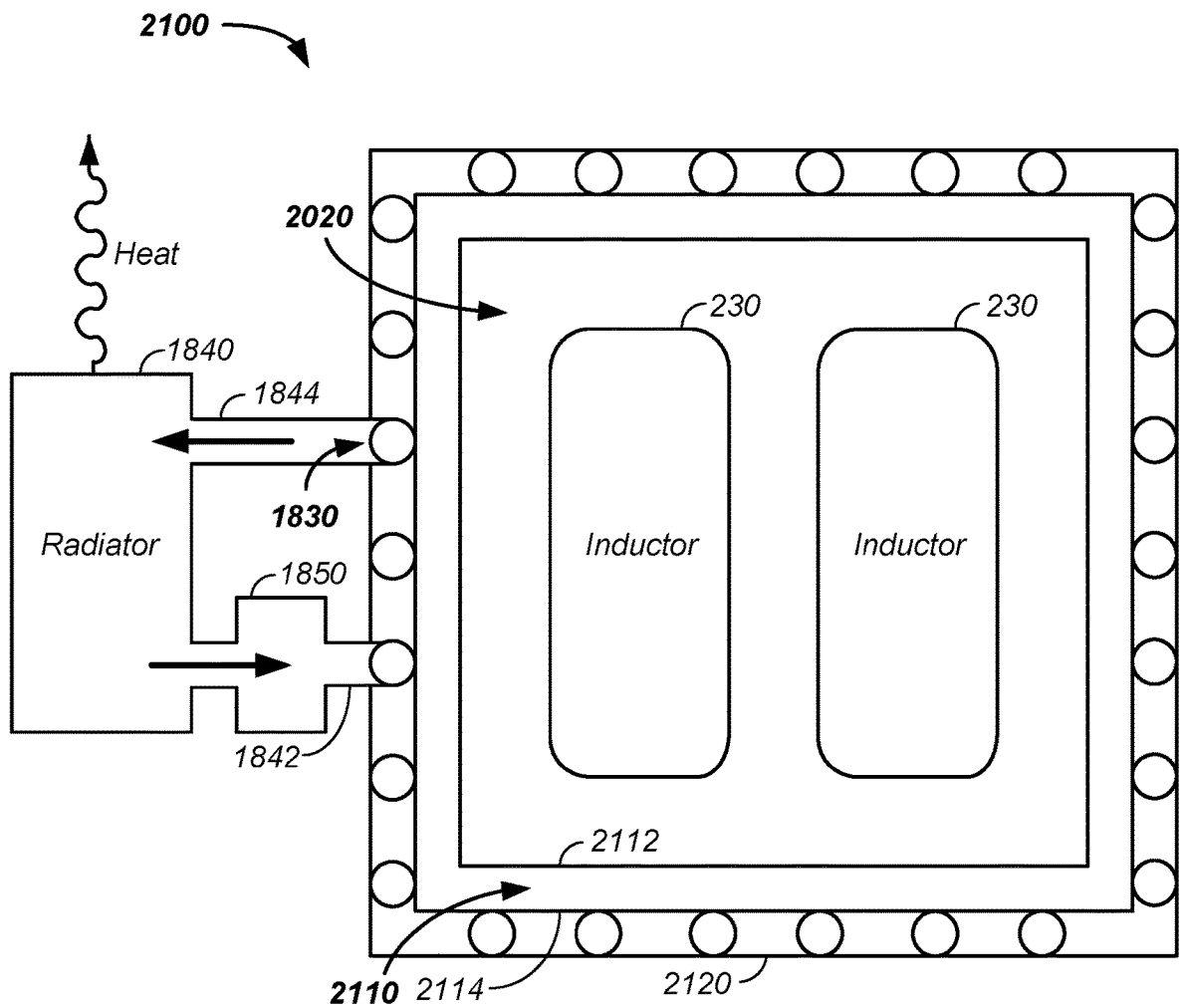
FIG. 21 illustrates use of a chill plate in cooling an inductor.

In yet still another example, a chill plate is optionally used to minimize heat transfer from the inductor 230 to the local surrounding environment, which reduces risk of damage to surrounding electronics. Referring now to FIG. 21, one or more inductors 230 are placed into a heat transfer medium. Moving outward from an inductor, FIG. 21 is described in terms of layers. In a first layer about the inductor, a thermal transfer agent is used, such as an immersion coolant 2020, described supra. Optionally, the heat transfer medium is a solid, a semi-solid, or a potting compound, as described supra. In a second layer about the immersion coolant, a heat transfer interface 2110 is used. The heat transfer interface is preferably a solid having an inner wall interface 2112 and an outer wall interface 2114. In a third layer, a chill plate is used. In one case, the chill plate is hollow and/or has passages to allow flow of a circulating coolant. In another case, the chill plate contains cooling lines 1830 through which a circulating coolant flows. An optional fourth layer is an outer housing or air.

In use, the inductor 230 generates heat, which is transferred to the immersion coolant. The immersion coolant transfers heat to the heat transfer interface 2110 through the inner wall surface 2112. Subsequently, the heat transfer interface 2110 transfers heat through the outer wall interface 2114 to the chill plate. Heat is removed from the chill plate through the use of the circulating fluid, which removes the heat to an outside environment removed from the sensitive area in the local environment about the inductor 230.

Phase Change Cooling

Figure 22:
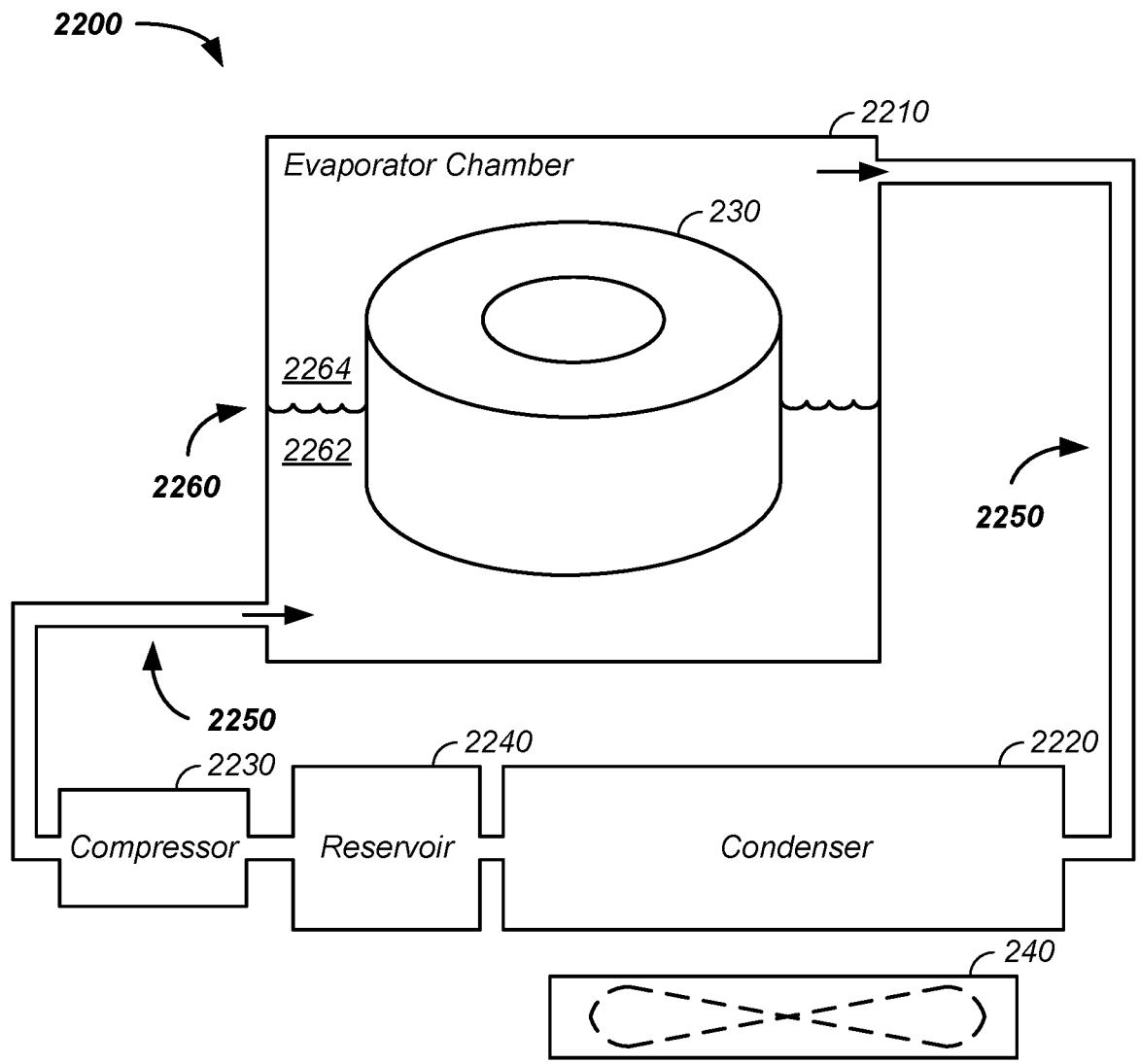
FIG. 22 illustrates a refrigerant phase change on the surface of an inductor.

Referring now to FIG. 22, a phase change inductor cooling system 2200 is illustrated. In the phase change inductor cooling system 2200, a refrigerant 2260 is present about the inductor 230, such as in direct contact with an element of the inductor 230, in a first liquid refrigerant phase 2262 and in a second gas refrigerant phase 2264. The phase change from a liquid to a gas requires energy or heat input. Heat produced by the inductor 230 is used to phase change the refrigerant 2260 from a liquid phase to a gas phase, which reduces the heat of the environment about the inductor 230 and hence cools the inductor 230.

Still referring to FIG. 22, an example of the phase change inductor cooling system 2200 is provided. An evaporator chamber 2210, which encloses the inductor 230, is used to allow the compressed refrigerant 2260 to evaporate from liquid refrigerant 2262 to gas refrigerant 2264 while absorbing heat in the process. The heated and/or gas phase refrigerant 2260 is removed from the evaporator chamber 2210, such as through a refrigeration circulation line 2250 or outlet and is optionally recirculated in the cooling system 2200. The outlet optionally carries gas, liquid, or a combination of gas and liquid. Subsequently, the refrigerant 2260 is optionally condensed at an opposite side of the cooling cycle in a condenser 2220, which is located outside of the cooled compartment or evaporation chamber 2210. The condenser 2220 is used to compress or force the refrigerant gas 2264 through a heat exchange coil, which condenses the refrigerant gas 2264 into a refrigerant liquid 2262, thus removing the heat previously absorbed from the inductor 230. A fan 240 is optionally used to remove the released heat from the condenser 2220. Optionally, a reservoir 2240 is used to contain a reserve of the refrigerant 2240 in the recirculation system. Subsequently, a gas compressor 2230 or pump is optionally used to move the refrigerant 2260 through the refrigerant circulation line 2250. The compressor 2230 is a mechanical device that increases the pressure of a gas by reducing its volume. Herein, the compressor 2230 or optionally a pump increases the pressure on a fluid and transports the fluid through the refrigeration circulation line 2250 back to the evaporation chamber 2210 through an inlet, where the process repeats. Preferably the outlet is vertically above the inlet, the inlet is into a region containing liquid, and the outlet is in a region containing gas. In one case, the refrigerant 2260 comprises 1,1,1,2-Tetrafluoroethane, R-134a, Genetron 134a, Suva 134a or HFC-134a, which is a haloalkane refrigerant with thermodynamic properties similar to dichlorodifluoromethane, R-12. Generally, any non-conductive refrigerant is optionally used in the phase change inductor cooling system 2200. Optionally, the non-conductive refrigerant is an insulator material resistant to flow of electricity or a dielectric material having a high dielectric constant or a resistance greater than 1, 10, or 100 Ohms.

Cooling Multiple Inductors

In yet another example, the cooling system optionally simultaneously cools multiple inductors 230. For instance, a series of two or more inductor cores of an inductor/converter system are aligned along a single axis, where a single axis penetrates through a hollow geometric center of each core. A cooling line or a potting material optionally runs through the hollow geometric center.

Cooling System

Preferably cooling elements work in combination where the cooling elements include one or more of:
a thermal transfer agent;
a thermally conductive potting agent;
a circulating coolant;
a fan;
a shroud;
vertical inductor mounting hardware 422;
a stand holding inductors at two or more heights from a base plate 210;
a cooling line 1830;
a wrapping cooling line 1832 about the inductor 230;
a concentric cooling line on a face 417 of the inductor 230
a pass through cooling line 1834 passing through the inductor 230
a cooling coil;
a heat sink 1640;
a chill plate 2120; and
coolant flowing through the chill plate.

In another embodiment, the winding 620 comprises a wire having a non-circular cross-sectional shape. For example, the winding 620 comprises a rectangular, rhombus, parallelogram, or square shape. In one case, the height or a cross-sectional shape normal or perpendicular to the length of the wire is more than ten percent larger or smaller than the width of the wire, such as more than 15, 20, 25, 30, 35, 40, 50, 75, or 100 the length.

Filtering

The inductor 230 is optionally used as part of a filter to: process one or more phases and/or is used to process carrier waves and/or harmonics at frequencies greater than one kiloHertz.

Winding

Figure 23:
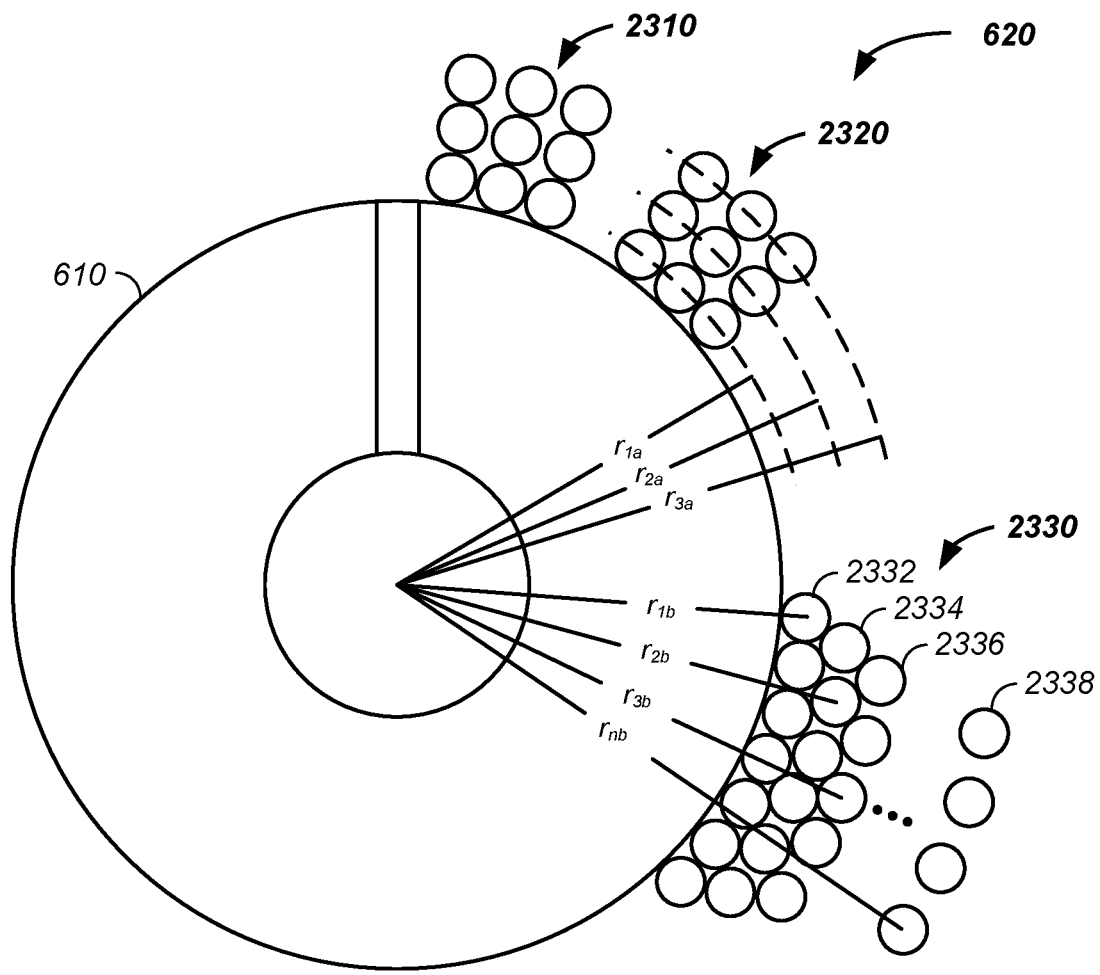
FIG. 23 illustrates multiple turns, each turn wound in parallel.

Referring now to FIG. 23, the inductor core 610 is wound with the winding 620 using one or more turns. Optionally, individual windings are grouped into turn locations, as described supra. As illustrated in FIG. 22, a first turn location 2310 is wound with a first turn of a first wire, a second turn location 2320 is wound with a second turn of the first wire, and a third turn location is wound with a third turn of the first wire, where the process is repeated n times, where n is a positive integer. Optionally, a second, third, fourth, . . . , $a^{th}$ wires wound with each of the $a^{th}$ wires are wound with a first, second, third, . . . , $b^{th}$ turn sequentially in the n locations, where the $a^{th}$ wires are optionally wired electrically in parallel, where a and b are positive integers. As illustrated in the second turn location 2320, the turns are optionally stacked. As illustrated in the third turn location 2330, the turns are optionally stacked in a semi-close packed orientation, where a first layer of turns 2332, a second layer of turns 2334, a third layer of turns 2336, and a $c^{th}$ layer of turns comprise increased radii from a center of the inductor core 610, where c is a positive integer.

Figure 24A:
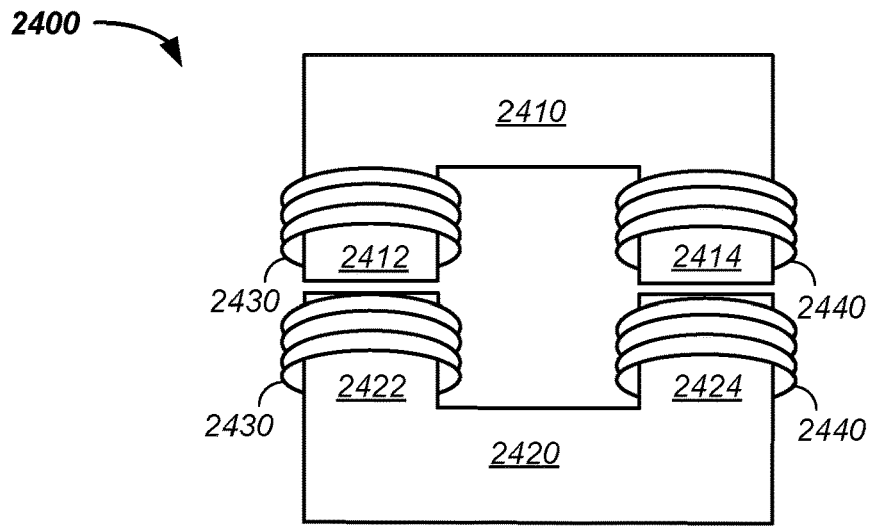
FIG. 24A and FIG. 24C illustrate powdered non-annular, 2-phase inductors
Figure 24B:
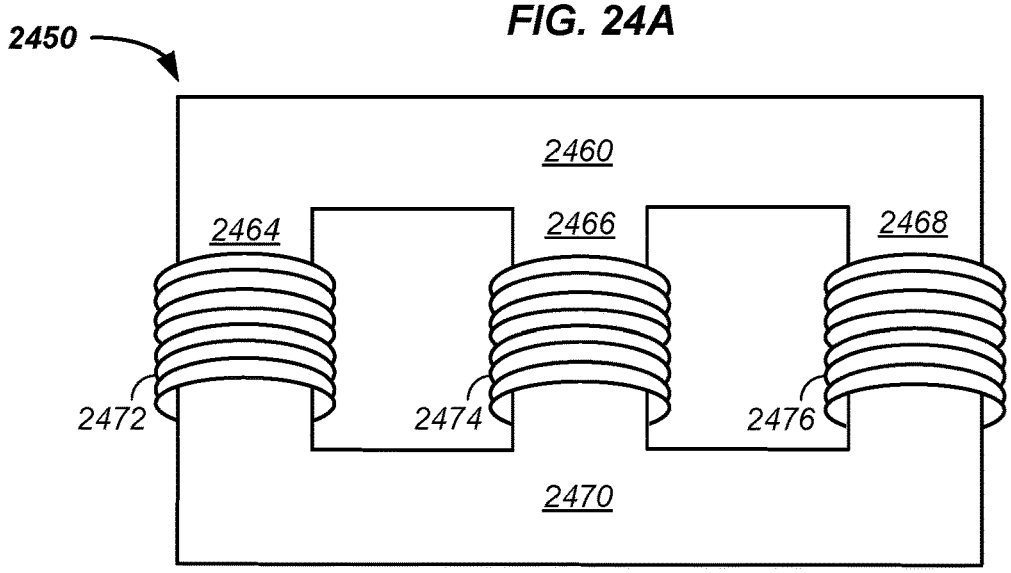
FIG. 24B illustrates a powdered non-annular, 3-phase inductor.

Still referring to FIG. 23 and now referring to FIGS. 24(A-C), the inductor core is optionally of any shape. An annular core is illustrated in FIG. 23, a 2-phase U-core inductor 2400 is illustrated in FIG. 24A, and a 3-phase E-core inductor 2450 is illustrated in FIG. 24B, where each core is wound with a winding using one or more turns as further described, infra.

Figure 24C:
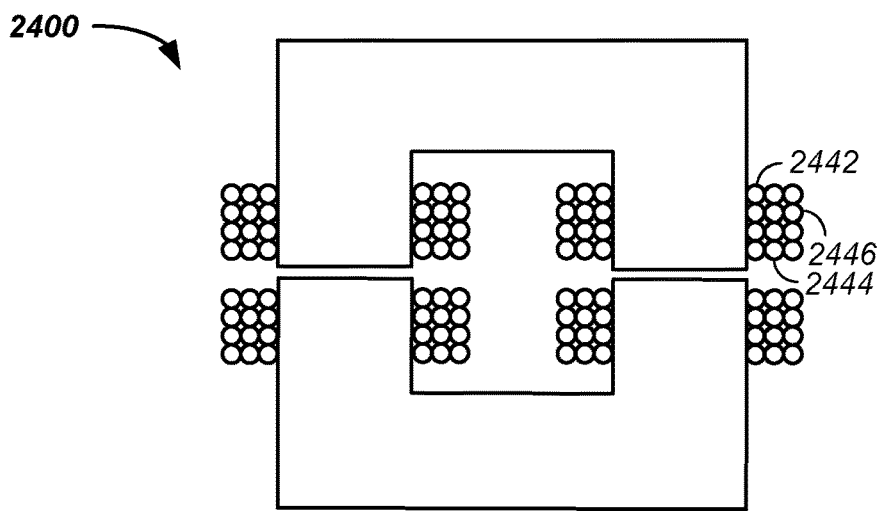

Referring again to FIGS. 24A and 24C, the U-core inductor 2400 is further described. The U-core inductor 2400 comprises a core loop comprising: a first C-element backbone 2410 and a second C-element 2420 backbone where ends of the C-elements comprise: a first yoke and a second yoke. As illustrated, the first yoke comprises a first yoke-first half 2412 and a first yoke-second half 2422 separated by an optional gap for ease of manufacture. Similarly, the second yoke comprises a second yoke-first half 2414 and a second yoke-second half 2424 again separated by an optional gap for ease of manufacture. The first yoke is wound with a first phase winding 2430, shown with missing turns to show the gap, and the second yoke is wound with a second phase winding 2440, again illustrated with missing coils to show the gap. Referring now to FIG. 24C, the second phase winding 2440 is illustrated with three layers of turns, a first layer 2442, a second layer 2444, and a third layer 2446, where any number of layers with any stacking geometry is optionally used. Individual layers are optionally wired electrically in parallel.

Referring now to FIG. 24B, the E-core inductor 2450 is further described. The E-core comprises: a first E-core backbone 2460 and a second E-core backbone 2462 connected by three yokes, a first E-yoke 2464, a second E-yoke 2466, and a third E-yoke 2468. The three yokes each optionally have gaps for ease of manufacture; however, as illustrated a first E-yoke winding 2472, a second E-yoke winding 2474, and a third E-yoke winding 2476 hide the optional gaps.

Referring again to FIG. 23 and FIGS. 24(A-C), any of the gaps, turns, windings, winding layers, and/or core materials described herein are optionally used for any magnet core, such as the annular, "U", and "E" cores as well as a core for a single phase, such as a straight rod-shaped core.

Core Material

Figure 25:
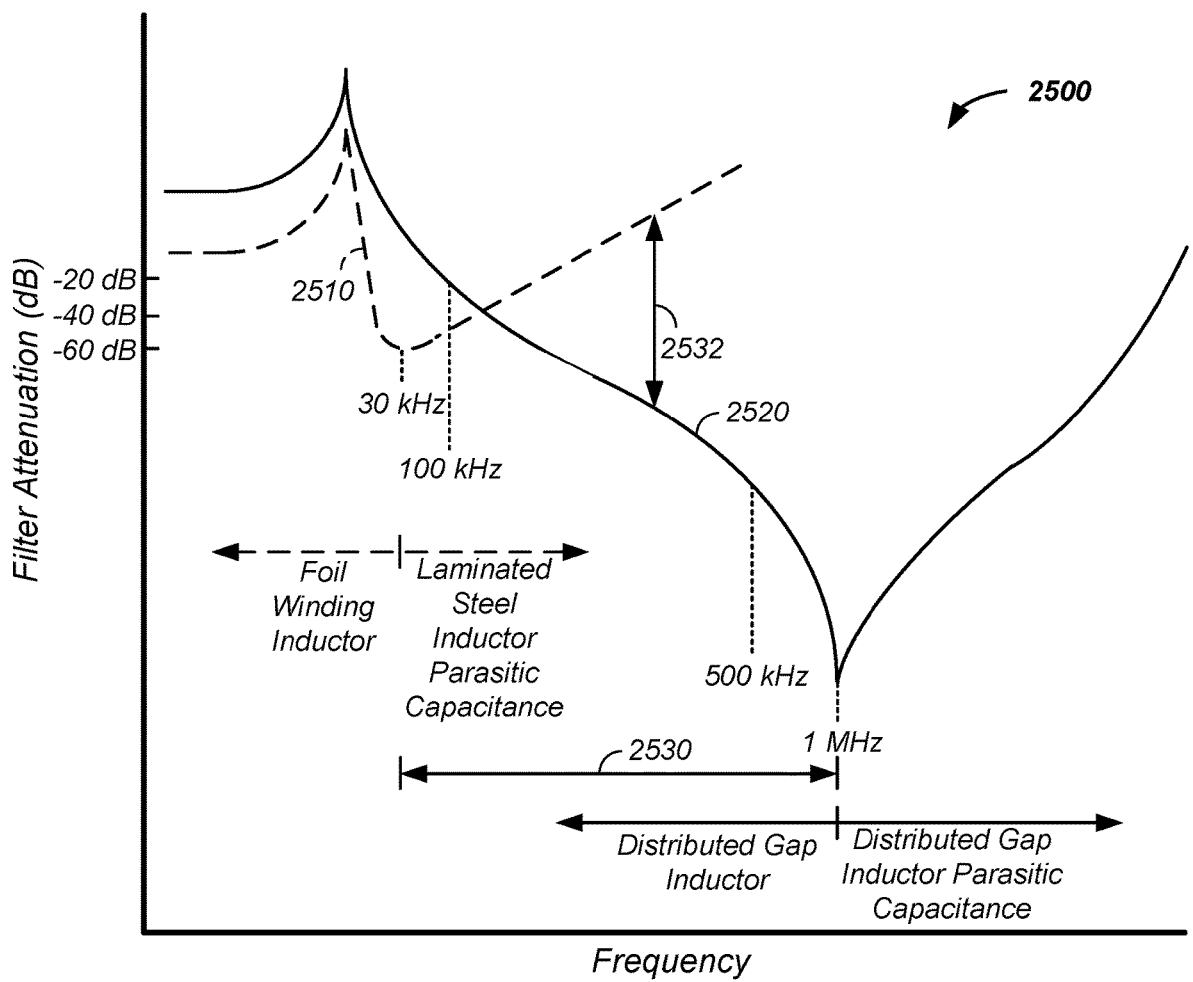
FIG. 25 illustrates filter attenuation for iron and powdered cores.

Referring now to FIG. 25, L-C filtering performance of core materials 2500 are described and compared with Bode curves. A circuit, such as an inductor-capacitor or LC circuit, further described infra, generally functions over a frequency range to attenuate carrier, noise, and/or upper frequency harmonics of the carrier frequency by greater than 10, 20, 30, 40, 50, 60, 70, 80, 90, 95, 99, or 99.9 percent or greater than 20, 30, 40, 50, 60, or 70 decibels. For a traditional solid, non-powdered, iron based core, iron core filter performance 2510, such as for a 60 Hz/100 ampere signal, is illustrated as a dashed line, where the traditional iron core is any iron-steel, steel, laminated steel, ferrite, ferromagnetic, and/or ferromagnetic based substantially solid core. The curve shows enhanced filter attenuation, from a peak at $1/(2\pi(LC)^{1/2})$, at about 600 Hertz down to a minimum, at the minimum resonance frequency, after which point the core material rapidly degrades due to laminated steel inductor parasitic capacitance. Generally, inductor filter attenuation ability degrades beyond a minimum resonance frequency for a given current, where beyond the minimum resonance frequency a laminated steel and/or silicon steel inductor yields parasitic capacitance. For iron, the minimum resonant frequency occurs at about thirty kiloHertz, such as for 60 Hz at 100 amperes, beyond which the iron overheats and/or fails as an inductor. Generally, for ampere levels greater than about 30, 50, or 100 amperes, iron-steel cores fail to effectively attenuate at frequencies greater than about 10, 20, or 30 kHz. However, for the distributed gap inductor described herein, the filter attenuation performance continues to improve, such as compared to the solid iron core inductor 2532, past one kiloHertz, such as past 30, 50, 100, or 200 kiloHertz up to about 500 kiloHertz, 1 megaHertz (MHz), or 3 MHz even at high ampere levels, such as greater than 20, 30, 50, or 100 amperes, as illustrated with the distributed gap filter performance curve 2520. As such, the distributed gap core material in the inductor of an inductor-capacitor circuit continues to function as an inductor in frequency ranges 2530 where a solid iron based inductor core fails to function as an inductor, such as past the about 10, 20, or 30 kiloHertz. In a first example, for a 30 kHz carrier frequency, the traditional steel-iron core cannot filter a first harmonic at 60 kHz or a second harmonic at 90 kHz, whereas the distributed gap cores described herein can filter the first and second harmonics at 60 and 90 kHz, respectively. In a second example, the distributed gap based inductor core can continue to suppress harmonics from about 30 to 1000 kHz, from 50 to 1000 kHz, and/or from 100 to 500 kHz. In a third example, use of the distributed gap core material and/or non-iron-steel material in the an LC filter attenuates 60 dB, for at least a first three odd harmonics, of the carrier frequency as the first three harmonics are still on a filtered left side or lower frequency side of an inductor resonance point and/or self-resonance point, such as illustrated on a Bode plot. Hence, the distributed gap cores described herein perform: (1) as inductors at higher frequency than is possible with solid iron core inductors and (2) with greater filter attenuation performance than is possible with iron inductors to enhance efficiency.

Filter Circuit

Figure 26:
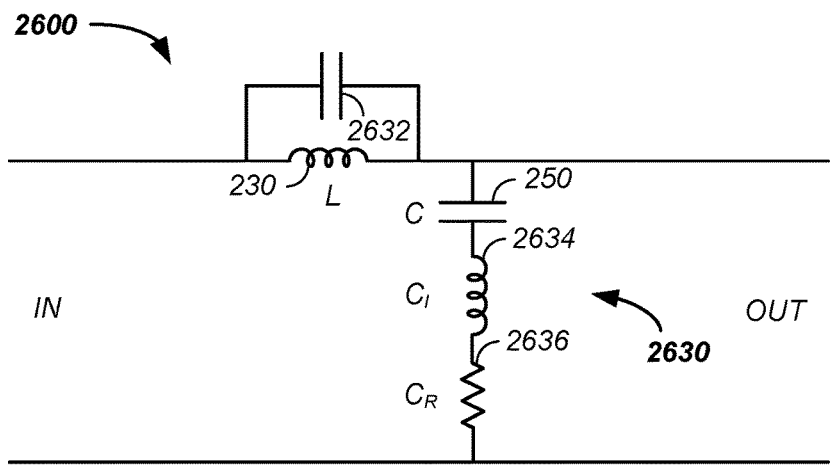
FIG. 26 illustrates a high frequency inductor-capacitor filter.

Referring now to FIG. 26, a parasitic capacitance removing LC filter 2600 is illustrated, which is an LC filter with optional extra electrical components. The LC filter includes at least the inductor 230 and the capacitor 250, described supra. The optional electrical components 2630 function to remove noise and/or to process parasitic capacitance.

High Frequency LC Filter:

Referring now to FIG. 26, the high frequency LC filter 145, which is a low-pass filter, is further described. An example of a parasitic capacitance removing LC filter 2600 is illustrated. However, the only required elements of the high frequency LC filter 145 are the inductor (L) 230, such as any of the inductors described herein, and the capacitor (C) 250. Optionally, additional circuit elements are used, such as to filter and/or remove parasitic capacitance. In one example, a parasitic capacitance filter 2630 uses one or more of: (1) a parasitic capacitance capacitor 2632 wired electrically in parallel with the inductor 230; and/or (2) a set of parasitic capacitance capacitors wired in series, where the set of capacitors is wired in parallel with the inductor 230. In another example, the optional electrical components of the parasitic capacitance removing LC filter include: (1) a parasitic capacitance inductor and/or a parasitic capacitance resistor wired in series with the capacitor 250; (2) one or both of a resistor, $C_R$, 2636 and a second inductor, $C_l$, 2634 wired in series with the capacitor 250; and/or (3) a resistor wired in series with the inductor 230, where the resistor wired in series with the inductor 230 are optionally electrically in parallel with the parasitic capacitance capacitor 2632 (not illustrated).

Variable Current Operation

Generally, power loss is related to the square of current time resistance. Hence, current is the dominant term in power loss. Therefore, for efficiency, the operating current of a device is preferably kept low. For example, instead of turning on a device, such as an air conditioner operating at a high voltage and current, fully on and off, it is more efficient to replace the on/off relay with a drive to run the device continuously, such as at a lower voltage of twenty-five volts with a corresponding lower current. However, the drive outputs a noisy signal, which can hinder the device. A filter, such as an inductor capacitance (LC) filter, is used to filter the high frequency noise allowing operation of the device at a fixed lower current or a variable lower current. At high currents, traditional laminated steel inductors in the LC filter loose efficiency and/or fail, whereas distributed gap based inductors still operate efficiently. Differences in filtering abilities of the laminated steel inductor-capacitor and the distributed gap inductor-capacitor are further described herein.

LC Filter

Figure 27A:
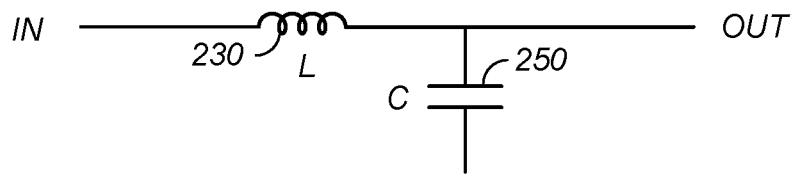
FIG. 27A illustrates an inductor-capacitor filter and FIG. 27B illustrates corresponding filter attenuation profiles as a function of frequency.
Figure 27B:
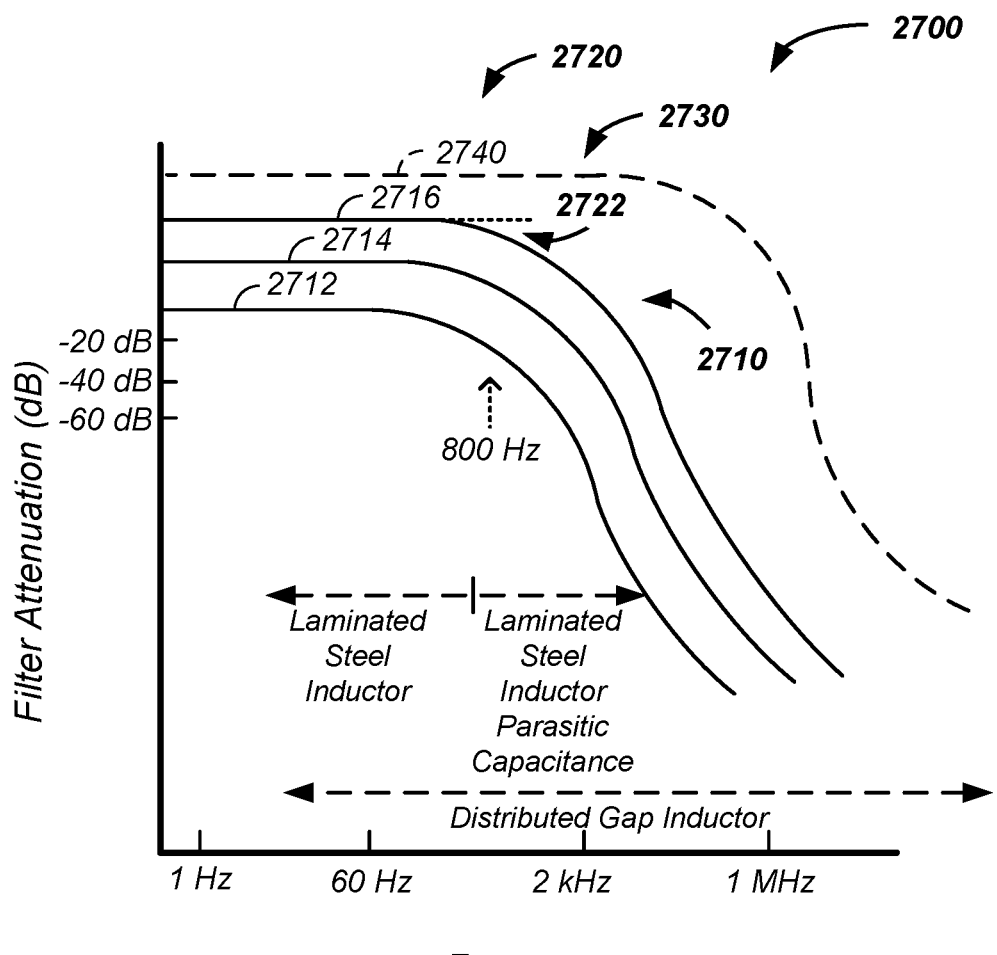

Referring now to FIG. 27A, an inductor-capacitor filter is illustrated, which is referred to herein as an LC filter. The LC filter optionally uses a traditional laminated steel inductor or a distributed gap inductor, as described supra. Generally, an inductor has increasing attenuation as a function a frequency and a capacitor tends to favor higher frequencies. Hence, an inductor, wired in series, has an increasing attenuation as a function of frequency and the capacitor, linked closer to ground and acting as a drain, discriminates against higher frequencies. For a drive filter system using low current, a traditional laminated steel inductor suffices. However at higher currents, such as at greater than 50 or 100 amperes, the traditional laminated steel inductors and/or foil winding inductors fail to efficiently pass the carrier frequency, such as at above 500, 600, 700, 800, 900, or 1000 Hz and fail to attenuate the noise above 30, 50, 100, or 200 kHz, as illustrated in FIG. 25 and FIG. 27B. In stark contrast, the distributed gap inductor, described supra, continues to pass the carrier frequency far beyond 500 or 1000 Hz up to 0.25, 0.5, or 1.0 MHz and reduces higher frequency noise, such as in the range of up to 1-3 MHz before parasitic capacitance becomes a concern, as further described infra.

High Frequency LC Filter

Referring now to FIG. 27B, LC filter attenuation as a function of frequency 2700 is illustrated for LC filters using traditional laminated steel inductors 2710, which are referred to herein as traditional LC filters. The illustrated filter shapes are offset along the y-axis for clarity of presentation. The traditional laminated steel inductors in an LC circuit efficiently pass low frequencies, such as up to about 500 Hz. However, at higher frequencies, such as at greater than 600, 700, or 800 Hz, the traditional LC filters begin to attenuate the signal resulting in an efficiency loss 2722 or falloff from no attenuation. Using a traditional laminated steel inductor, the position of the roll-off in efficiency is controllable to a limited degree using various capacitor and filter combinations as illustrated by a first traditional LC filter combination 2712, a second traditional LC filter combination 2714, and a third traditional LC filter combination 2716. However, the roll-off in efficiency 2722 occurs at about 800 Hz regardless of the component parameters in a traditional LC filter 2710 due to the physical properties of the steel in the laminated steel. Thus, use of a traditional laminated steel inductor in an LC filter results in lost efficiency at greater than 600 to 800 Hz with still increasing loss in efficiency at still higher frequencies, such as at 1, 1.5, or 2 kHz. In stark contrast, use of a distributed gap core in the inductor in a distributed gap LC filter 2730 efficiently passes higher frequencies, such as greater than 800, 2,000, 10,000, 50,000, or 500,000 Hz.

High Frequency Notched LC Filter

When an LC filter is on or off, efficiency is greatest and when an LC filter is switching between on and off, efficiency is degraded. Hence, an LC filter is optionally and preferably driven at lower frequencies to enhance overall efficiency. Returning to the example of a fundamental frequency of 800 Hz, the distributed gap LC filter 2730 is optionally used to remove very high frequency noise, such as at greater than 0.5, 1, or 2 MHz. However, the distributed gap LC filter 2730 is optionally used with a second low-pass filter and/or a notch filter to reduce high frequency noise in a range exceeding 1, 2, 3, 5, or 10 kHz and less than 100, 500, or 1000 kHz. The second LC filter, notch filter, and related filters are described infra.

Figure 28A:
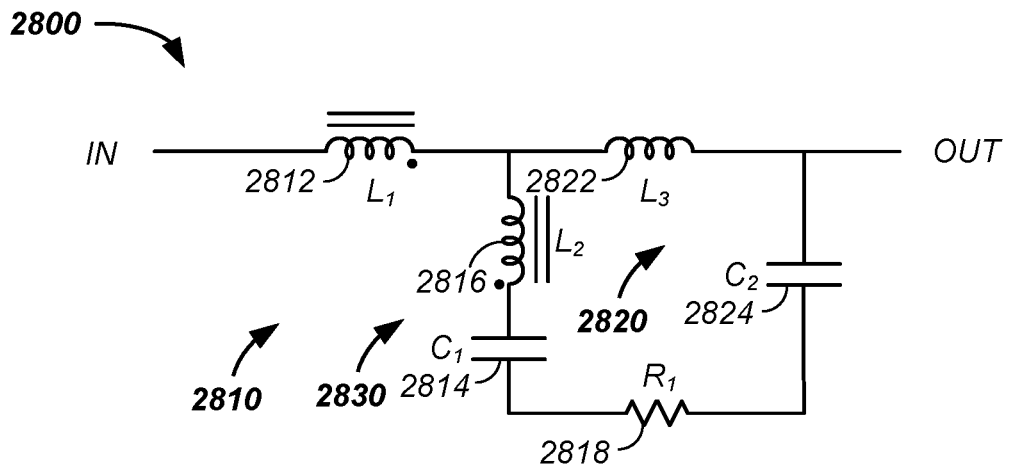
FIG. 28A illustrates a high roll-off low pass filter and FIG. 28B illustrates corresponding filter attenuation profiles as a function of frequency.

Referring now FIG. 28A, a notched low-pass filter circuit is illustrated. A notched low-pass filter 2800 is also referred to herein as a first low-pass filter 2270. Generally, the first low-pass filter 2810 is coupled with either: (1) the traditional laminated steel inductors 2710 or (2) more preferably the distributed gap LC filter 2740, either of which are herein referred to as a second low-pass filter 2820. Several examples, infra, illustrate the first low-pass filter coupled to the second low-pass filter.

Still referring to FIG. 28A, in a first example, the first low-pass filter 2810 comprises a first inductor element, $L_1$, 2812 connected in series to a third inductor element, $L_3$, 2822 of the second low-pass filter 2820 and a second capacitor, $C_2$, 2814 connected in parallel to the second low-pass filter 2820, which is referred to herein as an LC-LC filter. The LC-LC filter yields a sharper cutoff of the combined low-pass filter.

Still referring to FIG. 28A, in a second example, the first low-pass filter 2810 comprises: (1) a first inductor element, $L_1$, 2812 connected in series to a third inductor element, $L_3$, 2822 of the second low-pass filter 2820 and (2) a notch filter 2830 comprising a second inductor element, $L_2$, 2816, where the first inductor element to second inductor element ($L_1$ to $L_2$) coupling is between 0.3 and 1.0 and preferably about 0.9±0.1, where $L_2$ is wired in series with the first capacitor, $C_1$, 2814, where the notch filter 2830 is connected in parallel to the second low-pass filter 2820. The resulting filter is referred to herein as any of: (1) an LLC-LC filter, (2) a notched LC filter, (3) the notched low-pass filter 2800, and/or (4) a low pass filter combined with a notch filter and a high frequency roll off filter. In use, generally the second inductor element, $L_2$, 2816 and the first capacitor, $C_1$, 2814 combine to attenuate a range or notch of frequencies, where the range of attenuated frequencies is optionally configured using different parameters for the second inductor element, $L_2$, 2822 and the first capacitor, $C_1$, 2814 to attenuate fundamental and/or harmonic frequencies in the range of 1, 2, 3, 5, or 10 kHz to 20, 50, 100, 500, or 1000 kHz. The effect of the notch filter 2830 is a notched shape or attenuated profile 2722 in the base distributed gap based LC filter shape.

Figure 28B:
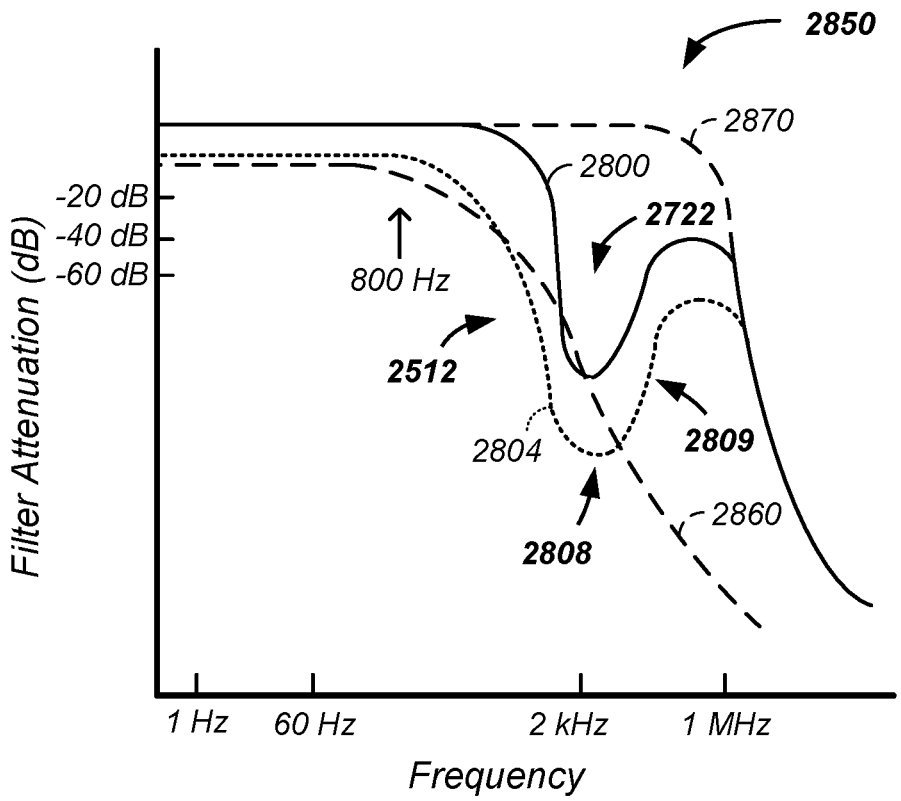

Referring now to FIG. 28B, filtering efficiencies 2850 are compared for a traditional laminated steel based LC filter 2860, a distributed gap based LC filter 2870, and the notched low-pass filter 2800. As described, supra, the traditional laminated steel based LC filter 2860 attenuates some carrier frequency signal at 800 Hz, which reduces efficiency of the LC filter. Also, as described supra, while the distributed gap based LC filter 2870 efficiently passes the carrier frequency at 800 Hz, efficient attenuation of the fundamental frequency occurs at relatively high frequencies, such as at greater than 500 kHz. However, the notched low-pass filter 2800 both: (1) efficiently passes the carrier frequency at 800 Hz and (2) via the notch filter 2830 attenuates the fundamental frequency at a low frequency, such as at 2 kHz±0.5 to 1 kHz, where the lower switching frequency enhances efficiency of the filter.

Still referring to FIG. 28B, the notch 2802 of the notched low-pass filter 2800 is controllable in terms of: (1) frequency of maximum notch attenuation 2808, (2) roll-off shape/slope of the short-pass filter 2512, and (3) degree of attenuation through selection of the parameters of the second inductor element, $L_2$, 2816 and/or the first capacitor, $C_1$, 2814 and optionally with a resistor in series with the second inductor 2816 and first capacitor 2814, where the resistor is used to broaden the notch. One illustrative example is a second notched low-pass filter 2804, which illustrates an altered roll-off shape 2806, notch minimum 2808, and recovery slope 2809 of the notch filter relative to the first notched low-pass filter 2800.

Still referring to FIG. 28B, via selection of parameters of at least one of the second inductor element, $L_2$, 2816 and/or the first capacitor, $C_1$, 2814 in view of selection of at parameters for other elements of the notched low-pass filter 2800, the overall notched low-pass filter shape results in any of:

- less than 2 or 5 dB attenuation of the carrier frequency at 500, 600, 700, 800, 900, or 1,000 Hz;
- greater than 20, 40, 60, or 80 dB of attenuation at 1, 2, 3, 4, or 5 kHz;
- a ratio of a carrier frequency attenuated less than 10 dB to an attenuation frequency attenuated at greater than 60 dB of less than 800 to 2000, 8:20, 1:2, 1:3, 1:4, or 1:5;
- a width of 50% of maximum attenuation of the notch filter of less than 1, 2, 3, 4, 5, 10, 50, or 100 kHz;
- a width of 50% of maximum attenuation of the notch filter of greater than 1, 2, 3, 4, 5, 10, 50, or 100 kHz;
- a maximum notch filter attenuation within 1 kHz of 1, 2, 3, 4, 5, 7, and 10 kHz; and/or
- a maximum notch filter attenuation at greater than any of 1, 2, 3, 5, 10, 20, and 50 kHz and less than any of 3, 5, 10, 20, 50, 100, 500, or 1,000 kHz.

To further clarify the invention and without loss of generality, example parameters for the first low-pass filter 2810 are provided in Table 3.

TABLE 3

Notch Filter

| | Notch Filter | | | |
|---|---|---|---|---|
| Purpose | $L_1$ (μH) | $L_2$ (μH) | $C_1$ (μF) | $R_1$ (Ohm) |
| best filter | 10 ± 5 | 4 ± 3 | 300 ± 50 | 2 ± 2 |

To further clarify the invention and without loss of generality, example parameters for the notched low-pass filter 2800 are provided in Table 4.

TABLE 4

Notched Low-Pass Filter

| | First Low-Pass Filter | | | | Second Low-Pass Filter | |
|---|---|---|---|---|---|---|
| Purpose | $L_1$ (μH) | $L_2$ (μH) | $C_1$ (μF) | $R_1$ (Ohm) | $L_3$ (μH) | $C_2$ (μF) |
| 800 Hz carrier; 2000 Hz notch | 12 ± 5 | 3 ± 2 | 300 ± 50 | 3 ± 2 | 30 ± 20 | 200 ± 100 |

Modular Inductor/Winding

Referring now to FIG. 29A through FIG. 35, a modular winding system and/or a modular inductor system is described. Optionally and preferably, the modular inductor system includes flat windings and/or balanced and opposing magnetic fields in an equal coupling common mode inductor apparatus.

Flat Winding

Figure 29A:
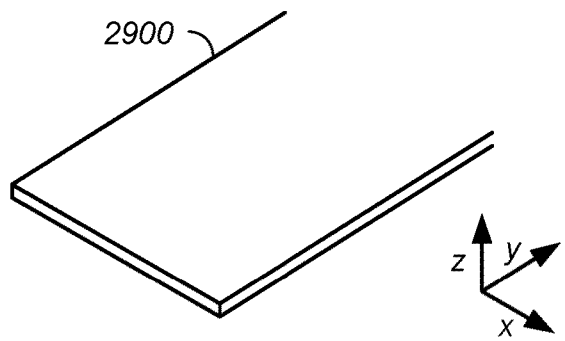
FIG. 29A illustrates a flat winding wire.

Referring now to FIG. 29A and FIGS. 30(A-C), an optional flat winding system 3000 of the modular inductor system is described.

Referring still to FIG. 29A, a flat winding coil 2900 is described. The flat winding coil 2900 is used in place of a traditional round copper winding about an inductor core and/or in conjunction with a traditional copper wire winding. For clarity of presentation and without loss of generality, the flat winding coil 2900 is illustrated as a longitudinally elongated conductor, such as comprising a rectangular cross-section. More generally, the flat winding coil comprises any three-dimensional geometry, such as further described infra.

Referring again to FIG. 30A and FIG. 30B, the flat winding coil 2900 is illustrated in a wound configuration about the inductor core 610. The wound coil configuration comprises an inner radius of curvature of greater than 0.4 inches and less than twenty inches, such as about 1, 1.5, 2, 3, 4, 5, or 10 inches. A cross-sectional width of the flat winding coil 2900 is greater than a cross-sectional height of the flat winding coil. For example, the width of the flat winding coils is greater than or equal to 0.5, 0.75, 1, 1.25, 1.5, 2, or 3 inches and the height of the flat winding coil is less than or equal to 0.75, 0.5, 0.25, 0.125 or 0.0625 inches. The flat aspect of the flat winding coil 2900 allows for more rapid and efficient transfer of heat, conduction, versus a traditional round wire inductor winding as a result of increased surface area per unit volume. Generally, a winding coil has a first connector 2902 and a second connector 2904.

Example I

Figure 29B:
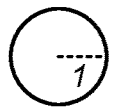
FIG. 29B, FIG. 29C and FIG. 29D compare perimeter lengths of winding wires having differing geometry with a common cross-section area.
Figure 29C:
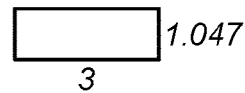
Figure 29D:
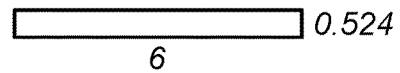

For example, referring now to FIG. 29B, a circular cross-section of a traditional round wire with a radius of 1.000 has a cross-section area of $\pi r^2$ or 3.14 and has a perimeter of $2\pi r$ or 6.28. Referring now to FIG. 29C, a first rectangular wire, with the same cross-section area of 3.14 has a width and height of 3.0 and 1.047, respectively, but has an increased perimeter of 2(l+w) or 8.09, which is an increase of 29% versus the round wire. Similarly, referring now to FIG. 29D, a second rectangular wire, with the same cross-section area of 3.14 has a width and height 6 and 0.524, respectively, but has an increased perimeter of 2(l+w) or 13.05, which is an increase of 108% versus the round wire.

The inventor notes that the greater the width-to-height ratio, the greater the percent increase in surface area of the winding, where the increased surface area results in more rapid cooling of the winding as there is more area in contact with the cooler surrounding, such as air or a liquid coolant. Thus, a preferred width-to-height ratio of the winding is greater than or equal to 1.2, 1.5, 2, 2.5, 3, 5, or 10.

Referring again to FIG. 30A and FIG. 30B, convection cooling of the flat winding system is described. As illustrated, an airflow, optionally a liquid flow, passes between individual turns of the flat winding coil 2900, which enhances cooling of the flat winding coil 2900 and the inductor core 610. The inventor notes that the increased surface area of the flat winding coil increases effectiveness of the convection cooling compared to use of a traditional round cross-section wire winding. Further, the above described conduction operates synergistically with the convection process.

Figure 30A:
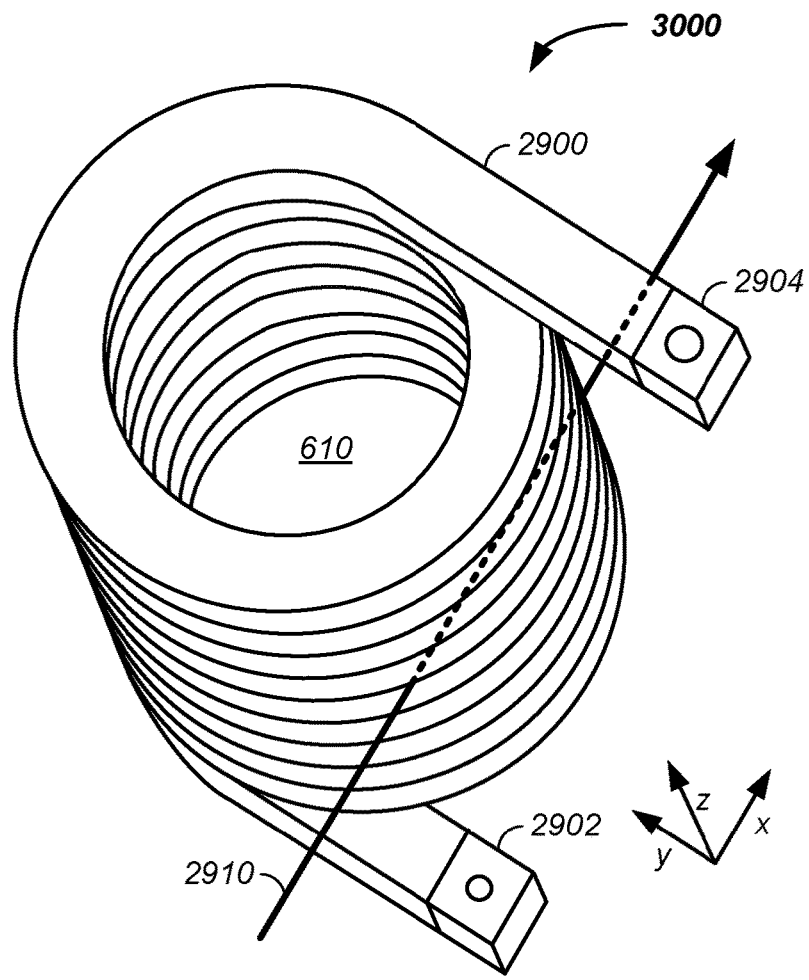
FIG. 30A illustrates a flat winding wound around an inductor core.
Figure 30B:
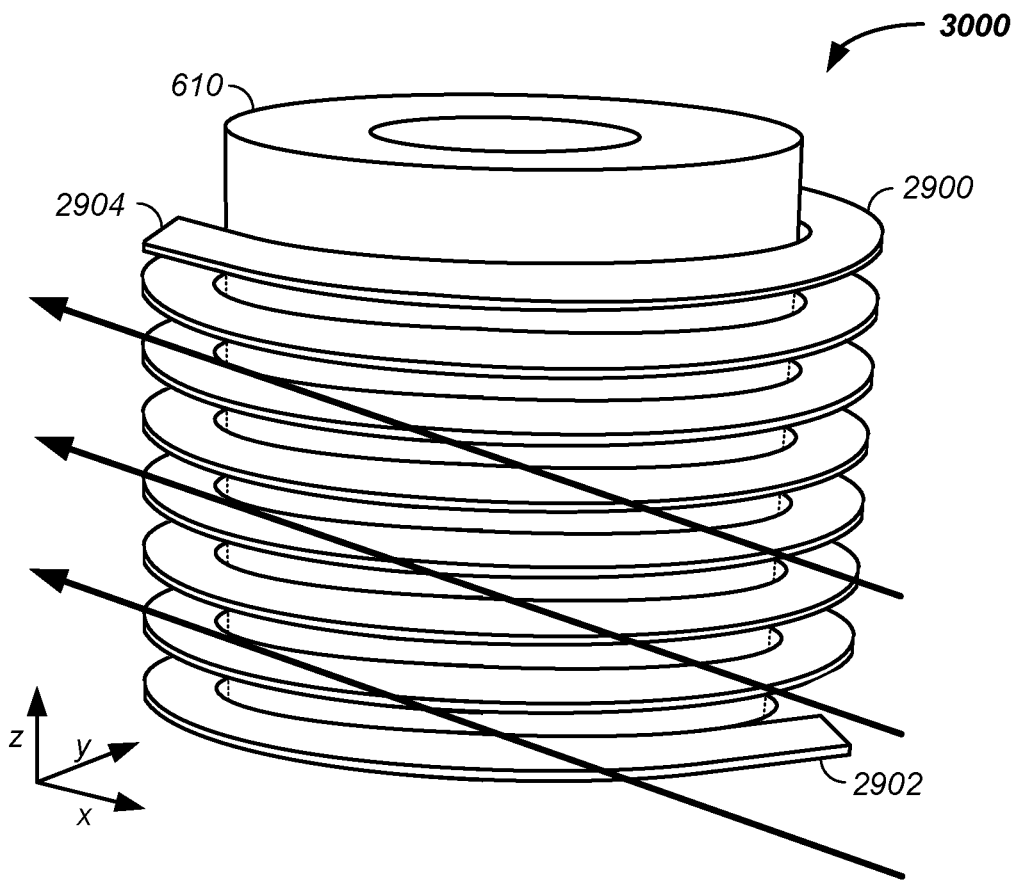
FIG. 30B illustrates air flow between winding turns.
Figure 30C:
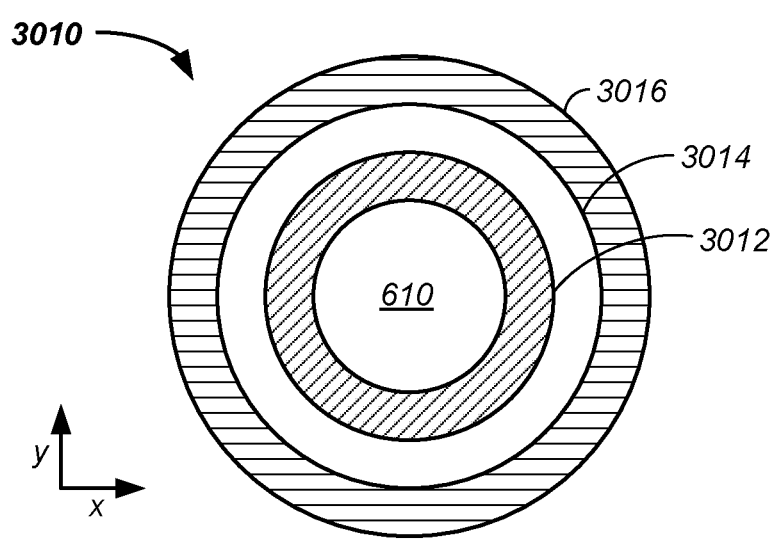
FIG. 30C illustrates layers of windings.

Referring now to FIG. 30C, a system of multiple flat windings 3010 is described. As illustrated, a first flat winding coil 3012 is wrapped, such as with multiple turns, about the inductor core. A separate second flat winding coil 3014 is wrapped, preferably with multiple turns, about the first flat winding coil 3012. A third flat winding coil 3016 is optionally and preferably circumferentially wrapped: (1) around the first flat winding coil 3012 and (2) in contact with and around the second flat winding coil 3014. Generally, n levels of windings are wound around the inductor core 610, where n is a positive integer of at least 1, 2, 3, 4, 5, 6, 10, or 15. Optionally and preferably, the n winding wires are wired in parallel, as described supra.

Balanced Magnetic Fields

Figure 31:
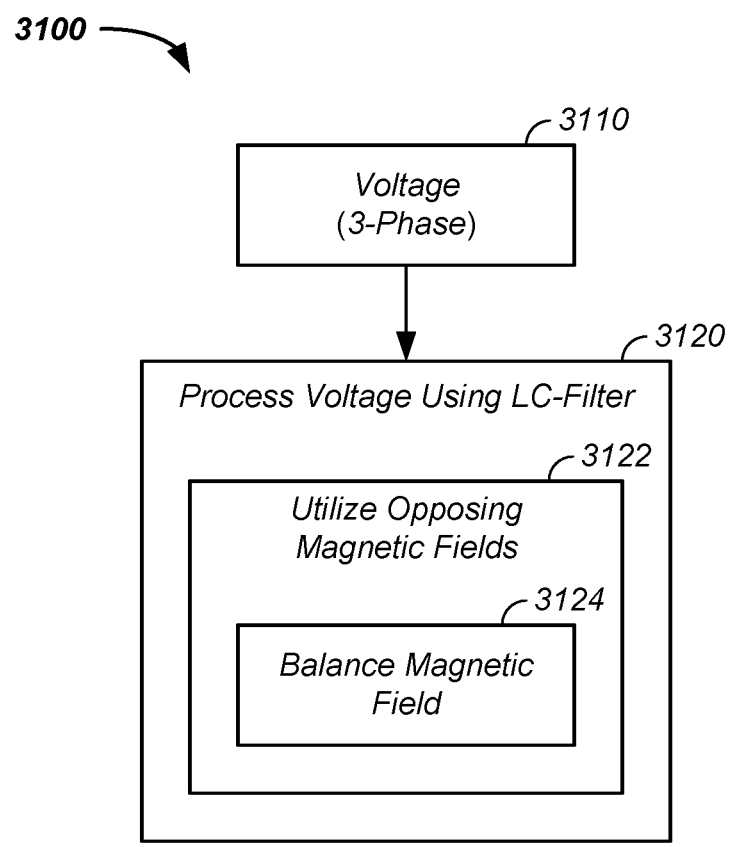
FIG. 31 illustrates a process of balancing magnetic fields in processing 3-phase power line transmissions.

Referring now to FIG. 31 through FIG. 35, a balanced magnetic field filter system 3100 is described. Referring still to FIG. 31, in general, 3-phase voltage 3110/power is processed, such as by using an inductor-capacitor filter 3120. Optionally and preferably, the inductor-capacitor filter 3120 uses opposing magnetic fields 3122 in/about the inductors, as further described infra. Still further, the opposing magnetic fields 3122 optionally and preferably yield a balanced magnetic field 3124, as further described infra. Still further, the opposing and balanced magnetic fields are optionally and preferably generated passively with a mechanical system in the absence of moving parts and/or computer control, as further described infra. Any of the balanced magnetic field systems optionally use the flat winding coil 2900 and/or the flat winding system 3000, described supra.

Figure 32A:
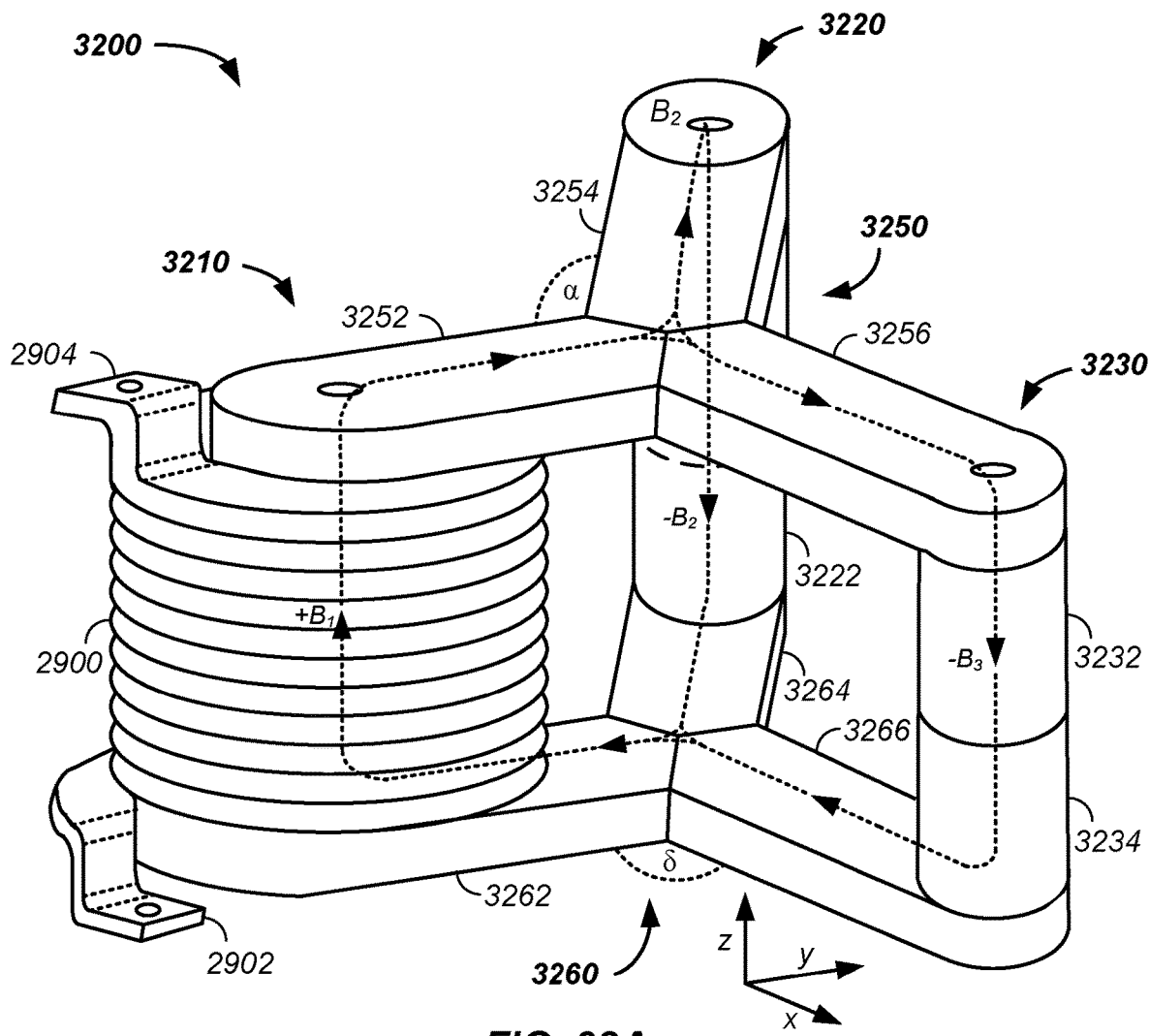
FIG. 32A, FIG. 32C, and FIG. 32D illustrate an equal coupling common mode electrical system for processing a 3-phase power line transmission illustrated in FIG. 32B.

Referring now to FIG. 32A, a 3-phase balanced magnetic field processing system 3200 is illustrated, such as for use in filtering a three-phase power supply system, where each line of the three phases carries an alternating current of the same frequency and voltage amplitude relative to a common reference but with a phase difference of one third the period and/or 120 degrees.

For clarity of presentation and without loss of generality, the three-phase processed current and voltage is referred to herein as a three-phase system. Herein, referring again to FIG. 2, the three-phase system is denoted with a first line, U; a second line, V; and a third line W.

Referring again to FIG. 32A, as illustrated, the first phase, U, is processed using a first inductor 3210, the second phase, V, is processed using a second inductor 3220, and the third phase, W, is processed using a third inductor 3230. Current passing along the winding in each phase generates a magnetic field. Particularly, a first current, from the first phase, passing through a first winding of the first inductor 3210 generates a first magnetic field, $B_1$. Similarly, a second current, from the second phase, passing through a second winding of the second inductor 3220 generates a second magnetic field, $B_2$, and a third current, from the third phase, passing through a third winding of the third inductor 3230 generates a third magnetic field, $B_3$. For clarity of presentation, the second winding of the second inductor 3220 and the third winding of the third inductor 3230 are not illustrated to allow a view of the optional modular cores, described infra.

Figure 32B:
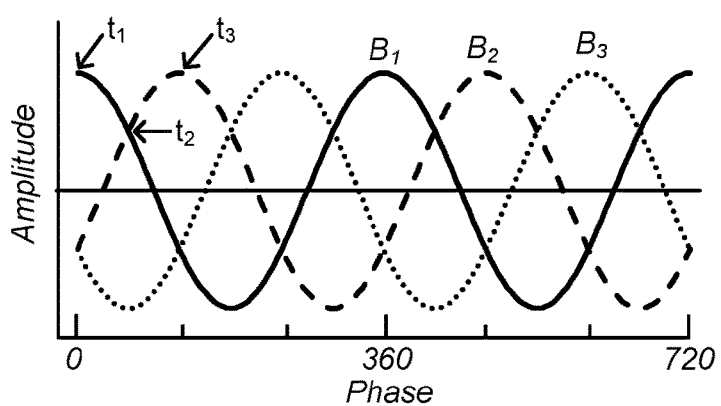

Referring still to FIG. 32A and now to FIG. 32B, the first, second, and third magnetic fields, $B_1$, $B_2$, $B_3$ generated by the first phase, U, the second phase, V, and the third phase, W, are respectively illustrated in the first inductor 3210, the second inductor 3220, and the third inductor 3230. Generally, the sum of the three magnetic fields $B_1$, $B_2$, $B_3$, is a constant, such as zero, as in equation 1.

$$B_1+B_2+B_3=0 \qquad \text{(eq. 1)}$$

Generally the symmetrical 3-phase balanced magnetic field processing system 3200 balances the magnetic field of each inductor, of the three inductors, using the magnetic fields of the remaining two inductors of the three inductors, which results in a balanced magnetic system which does not create common mode noise. In stark contrast, unbalanced three-phase magnetic systems are sources that generate common mode noise, as further described infra.

Example 1

An example is provided to further describe the balanced magnetic fields of the symmetrical layout of the 3-phase balanced magnetic field processing system 3200. Referring still to FIG. 32A and FIG. 32B, the 3-phase system is further described where amplitude of the current/voltage is related to the magnetic field of the respective inductor. For instance, as illustrated at a first time, $t_1$, the relative amplitude of the first magnetic field, $B_1$, is 1.0 while the amplitude of the second magnetic field, $B_2$, is −0.5 and the amplitude of the third magnetic field, $B_2$, is −0.5, where the sum of the three magnetic fields is zero, as in equation 1. At this first time, three magnetic field loops are further described.

Still referring to FIG. 32A, a first magnetic field loop, $B_1B_2$, and a third magnetic field loop, $B_1B_3$, are described where the magnetic field lines and directions are illustrated at the first time, $t_1$. The first magnetic field loop, $B_1B_2$, sequentially passes/cycles up through the first inductor 3210, along/through a first upper plate section 3252, along/through a second upper plate section 3254, down through the second inductor 3220, along/though a second lower plate section 3264, along/through a first lower plate section 3262, and back up through the first inductor 3210. Similarly, the third magnetic field loop, $B_1B_3$, sequentially passes/cycles up through the first inductor 3210, along/through the first upper plate section 3252, along/through a third upper plate section 3256, down through the third inductor 3230, along/though a third lower plate section 3266, along/through the first lower plate section 3262, and back up through the first inductor 3210.

In the illustrated 3-phase balanced magnetic field processing system 3200, the first magnetic field, $B_1$, of +1.0 in the first inductor 3210 is split at the centrally positioned end of the first upper plate section 3252 along the second upper plate section 3254 and the third upper plate section 3256, where '+' demarks a magnetic field in a first direction and '−' demarks a magnetic field in the opposite direction. Thus, still at the first time, $t_1$, the first inductor 3210 and the first magnetic field, $B_1$, of +1.0 results in: (1) a field of +0.5 applied to the second inductor 3220 balancing the −0.5 field in the second inductor 3220 at the first time, $t_1$, and (2) a field of +0.5 applied to the third inductor 3230, which balances the −0.5 field in the third inductor 3230 at the first time, $t_1$.

At subsequent times, such as a second time, $t_2$, and a third time, $t_3$, the magnitude and direction of each the three magnetic fields sinusoidally vary, but the sum of the magnetic fields in each of the three inductors, 3210, 3220, 3230, continues to add to zero as a result of the geometry of the 3-phase balanced magnetic field processing system 3200, as further described, infra.

3-Phase Inductor Geometry

Figure 32C:
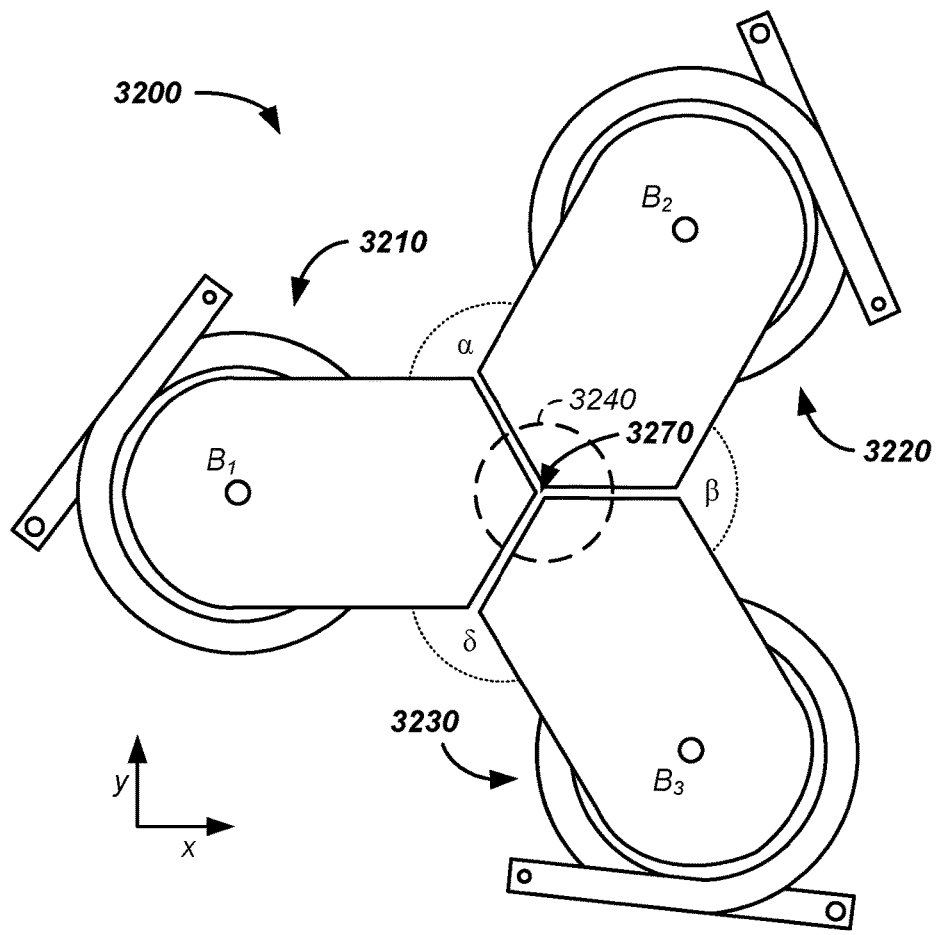

Referring still to FIG. 32A and referring now to FIG. 32C, geometry of the 3-phase balanced magnetic field processing system 3200 is further described. The three inductors 3210, 3220, 3230 have a common upper plate 3250 comprising the first upper plate section 3252, the second upper plate section 3254, and the third upper plate section 3256. Similarly, the three inductors 3210, 3220, 3230 have a common lower plate 3260 comprising the first lower plate section 3262, the second lower plate section 3264, and the third lower plate section 3266. Optionally and preferably the material, size, and shape of the three sections of the upper plate 3250 and/or the three sections of the lower plate 3260 are the same to yield a balanced magnetic field conduit path. Further, as illustrated each of, a first angle alpha, $\alpha$, a second angle beta, $\beta$, and a third angle delta, $\delta$, are equal and 120 degrees. In practice, magnetic field resistance and/or permeability of the upper plate sections 3250 and/or the lower plate sections 3260 are within 1, 2, 3, 5, or 10 percent of each other and/or the first, second, and third angles are optionally 110 to 130 degrees, such as about 118, 119, 121, and/or 122 degrees.

As illustrated, with the first, second, and third angles at 120 degrees, each of: (1) a first distance between the first inductor 3210 and the second inductor 3220, B, to $B_2$, (2) a second distance between the second inductor 3220 and the third inductor 3220, $B_2$ to $B_3$, and (3) a third distance between the first inductor 3210 and the third inductor 3230, B, to $B_3$, are equal. Equal distances between each combination of the first inductor 3210, second inductor 3220, and the third inductor 3230 coupled with common element shapes and/or materials along the upper and lower plates sections 3250, 3260 results in balanced magnetic fields in each of the three inductors 3210, 3220, 3230 at times/phases of an input 3-phase power supply system, such as the three-phase power grid system of the United States.

Figure 32D:
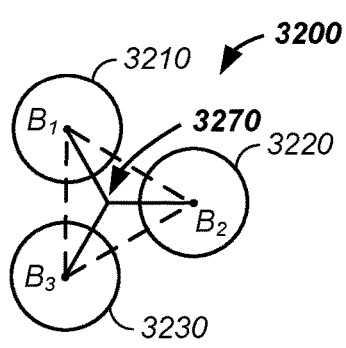
Figure 33:
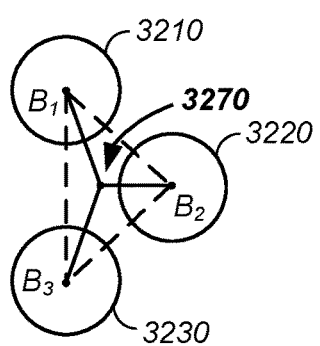
FIG. 33 illustrates a first unequal coupling common mode electrical system for processing a 3-phase power line transmission.
Figure 34:
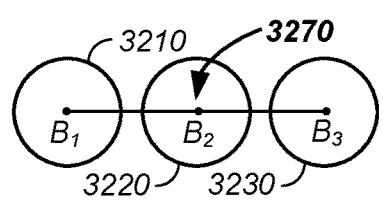
FIG. 34 illustrates a second unequal coupling common mode electrical system for processing a 3-phase power line transmission.

Referring now to FIG. 32D, FIG. 33, and FIG. 34, the equal distance between the three inductors of the 3-phase balanced magnetic field processing system 3200 is contrasted with unbalanced systems. Particularly, referring now to FIG. 32D, the 3-phase balanced magnetic field processing system 3200, as described above, includes: (1) equal distances between the inductors, $B_1$ to $B_2$, $B_1$ to $B_3$, and $B_2$ to $B_3$, and (2) equal magnetic field mediums 3270, such as along paths between the inductors in the upper and lower plate sections 3250, 3260.

Referring now to FIG. 33, however, when: (1) distances between the distance between inductors, $B_1$ to $B_2$, $B_1$ to $B_3$, and $B_2$ to $B_3$, are unequal and/or (2) magnetic field mediums 3270, such as along paths between the inductors in the upper and lower plate sections 3250, 3260 are unequal and/or are of different length, the magnetic fields in each of the first inductor 3210, the second inductor 3220, and the third inductor 3230 do not balance due to impacts from the other inductors as a function of time. For instance, the first magnetic field of the first inductor 3210 is not balanced by the magnetic fields from the combination of the second inductor 3220 and the third inductor 3230 as a function of time, which yields common mode noise. Referring now to FIG. 34, as the distances between pairs of the three inductors increases, the common mode noise increases. For example, when the three inductors are on a line, such as in FIG. 34, the distance between the first inductor 3210 and the second inductor 3220 is fifty percent or more less than a second distance between the first inductor 3210 and the third inductor 3230, which results in an unbalanced magnetic system in which the summation of the magnetic fields does not equal zero. Since the summation of the magnetic fields does not equal zero, the unbalanced magnetic system is generating common mode noise when processing 3-phase input voltage systems.

Additional Post Systems

Figure 35:
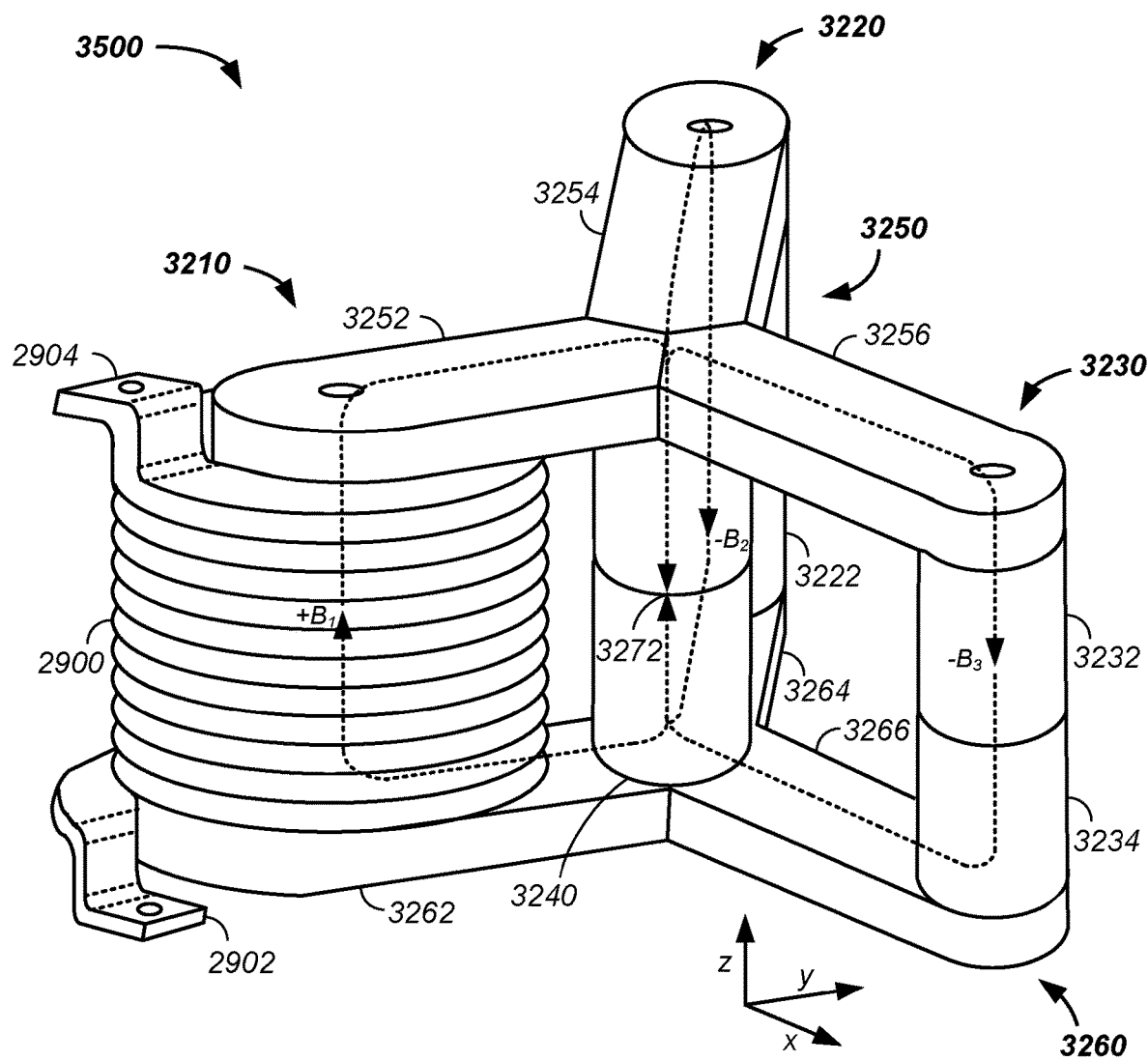
FIG. 35 illustrates a four post inductor system.

The inventor notes that the 3-phase balanced magnetic field processing system 3200 optionally uses one or more additional posts referred to herein as yokes. Referring now to FIG. 35, an optional first yoke 3240 or fourth post, is illustrated. Generally, one or more yokes function to maintain balanced magnetic fields in the first inductor 3210, the second inductor 3220, and the third inductor 3230, but more than three total posts are used, where the term post includes the longitudinal axis/height or each inductor. Again, the magnetic field paths for the first time, $t_1$, as provided in FIG. 32B, are illustrated. Particularly, at the first time, $t_1$, the first magnetic field, $B_1$, when reaching the inner end of the first upper plate section 3252, instead of dividing between the second upper plate section 3254 and third upper plate section 3256, a first portion, $B_p$, of the first magnetic field passes down through the first yoke 3240. At the same time, the second magnetic field, $B_2$, passes down through the second inductor 3220 and up the first yoke 3240 and the third magnetic field, $B_3$, passes down through the second inductor 3230 and up the first yoke 3240. In this case, the magnetic fields are balanced in the middle 3272 of the first yoke 3240, such as $+B_1+B_2+B_3=0$ or $1.0-0.5-0.5=0$. In this case, as the 3-phase balanced magnetic field processing system 3200 is symmetrical, has $C_3$ rotational symmetry, the magnetic fields are still balanced within each inductor as a function of time. For instance, any portion of the first magnetic field, $B_1$, passing through the second inductor 3220 and the third inductor 3230 subtracts from the magnetic field passing down through the first yoke 3240, which considering all fields, still balances the magnetic field in each of the three inductors 3210, 3220, 3230.

Placing additional return yokes in the 3-phase balanced magnetic field processing system 3200 is optionally done while maintaining balance magnetic fields, such as by adding a multiple of three yokes, with $C_3$ rotational symmetry, to the three post or four post systems described supra.

Cast Inductor

Figure 38:
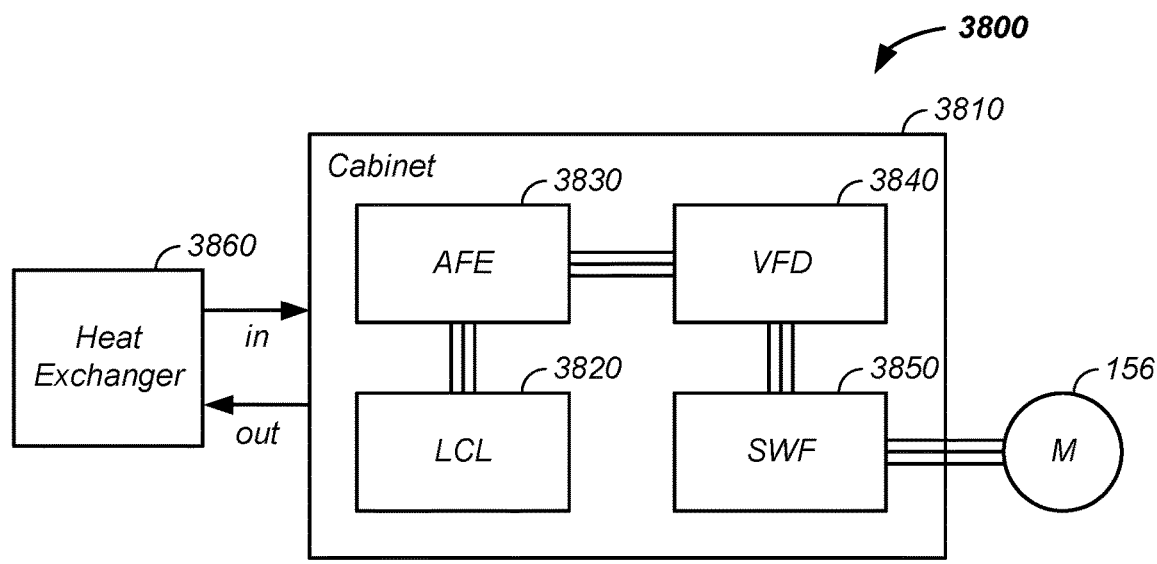
FIG. 38 illustrates a cabinet housing a power processing system.
Figure 39A:
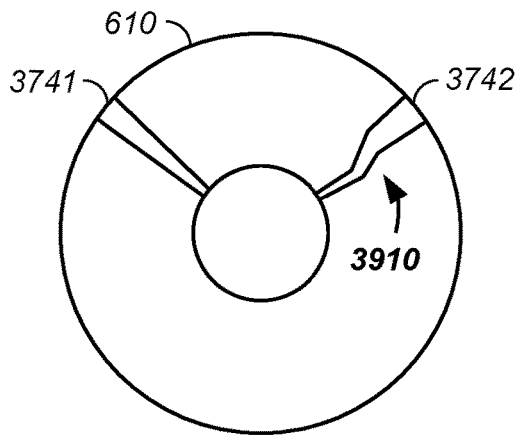
FIG. 39A illustrates a bent flat turn about an inductor core and FIG. 39B and FIG. 39C illustrate one and two flat turns about a toroidal core, respectively.
Figure 39B:
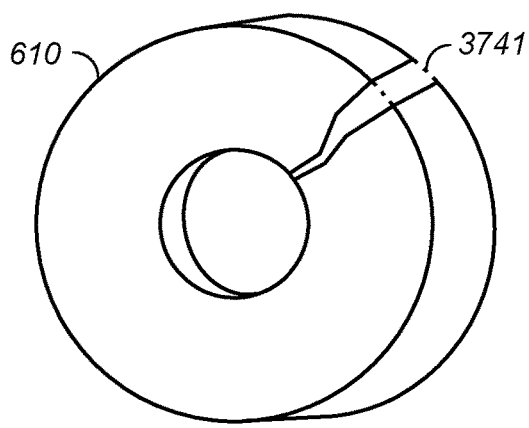

Optionally, one or more elements of the inductor 230 are cast. For example, the windings 620 are optionally cast. Herein, a cast part, such as formed by casting refers to a part manufactured by pouring a liquid metal, or electrically conducting material, into a mold and after cooling/curing removing the cast item from the mold. One preferred metal is aluminum and/or an alloy containing at least 50, 60, 70, 80, 90, 95, or 99% aluminum. The solidified part, which is also referred to as a casting, is ejected/broken out of the mold for later use, such as after removing runners and risers and/or rough edges. FIGS. 36(A-C), FIG. 37(A-C), FIG. 38, and FIG. 39A and FIG. 39B are used to further describe casted windings used with the inductor core 610.

Figure 36A:
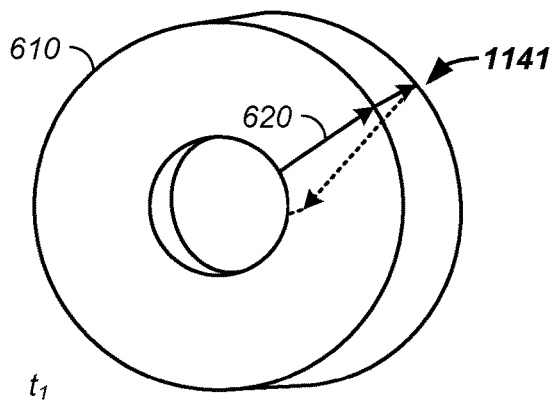
FIG. 36A, FIG. 36B, and FIG. 36C respectively illustrate one, two, and three turns about a toroidal inductor core.
Figure 37A:
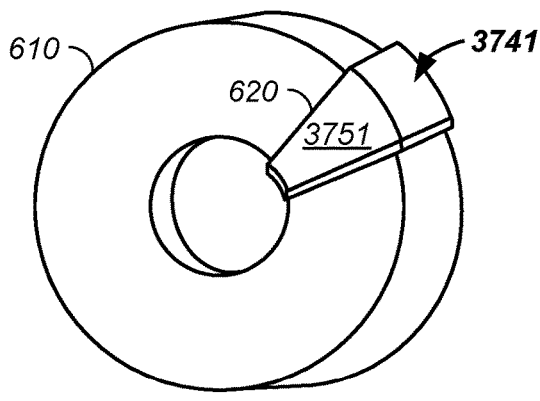
FIG. 37A, FIG. 37B, and FIG. 37C respectively illustrate one, two, and three flat turns about a toroidal inductor core.
Figure 36B:
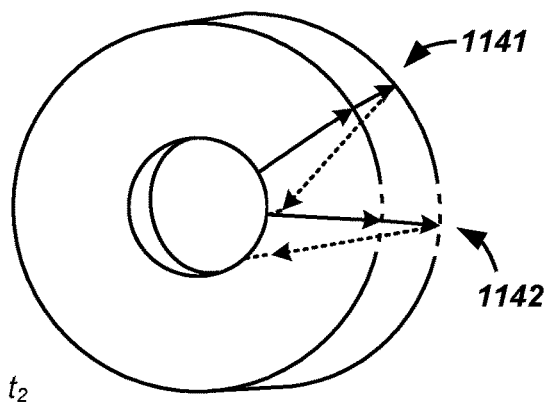
Figure 37B:
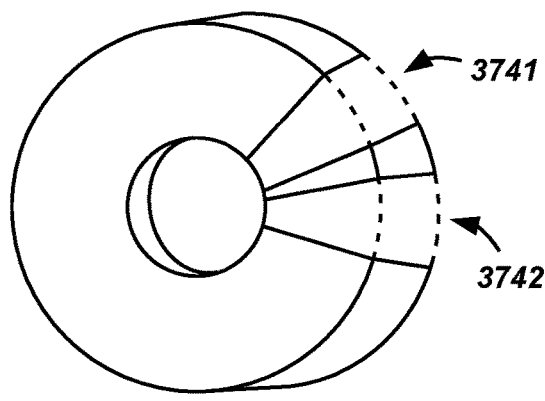
Figure 36C:
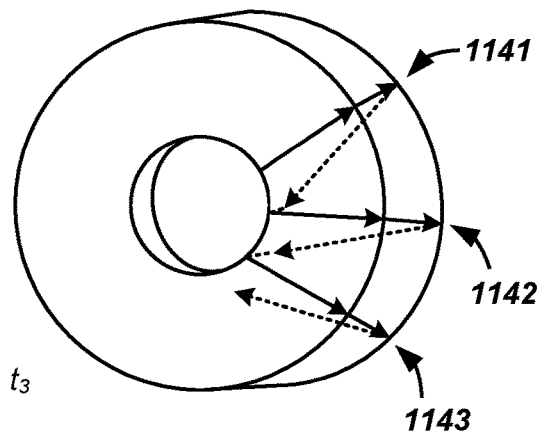
Figure 37C:
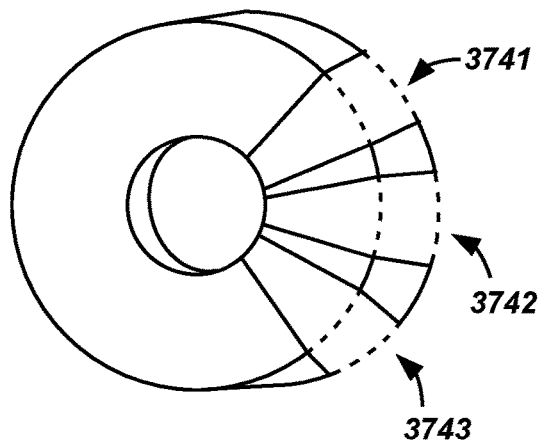

Referring now to FIGS. 36(A-C) and FIGS. 37(A-C), wire windings are compared with flat windings. Referring now to FIG. 36A and FIG. 37A, the first wire turn 1141 is compared with a first flat turn 3741. The first flat turn 3741, optionally and preferably formed by casting, differs from the first wire turn 1141 in several ways. In a first example, the first flat turn 3741 replaces n wire turns as the cross-sectional area is larger. For instance, 2, 3, 4, 5, 6 or more wire turns are replaced with a single flat turn. Replacing multiple wire turns with a single turn reduces manufacturing cost while maintaining electrical flux capacity. In a second example, the width of the flat turn, such the front winding face 3751, increases with radial distance from the center of the toroid/inductor core 610, whereas the wire turn has a constant width with radial distance. In a third example, the cross-sectional area of the flat turn optionally differs with position, such as by greater than 5, 10, or 15 percent, whereas the wire turn has a constant cross-sectional area. The increased cross-sectional area aids in heat transfer, such as a thicker and/or wider section of the winding along the face or outer perimeter of the inductor core facilitates heat dissipation to a cooling system and/or the atmosphere. Optionally, heat sinks, such as pillars, are included in the casting to facilitate heat transfer from the faces and/or outer perimeter inductor interfacing areas of the case inductor. In a fourth example, the flat turn is optionally thicker, such as within the opening of the inductor core 610, and thinner, such as along the faces and/or outer perimeter of the inductor core 610. A thicker section within the aperture of the inductor core 610 enhances current carrying capacity by using a large fraction of the volume of the aperture than winding with coatings allows. Generally, the cast turn is formed via a casting process and the wire turn is formed through a labor intensive winding process as each wire must be threaded through the aperture of the inductor core 610.

Referring now to FIGS. 36(A-C) and FIGS. 37(A-C), wire windings are further compared with flat windings. As illustrated in FIGS. 36(A-C), during manufacturing, the first wire turn 1141 is wound at a first time, $t_1$; the second wire turn 1142 is wound at a second time, $t_2$; and the third wire turn 1143 is wound at a third time, $t_3$. In stark contrast, during manufacturing, the first flat turn 3741, the second flat turn 3742, and the third flat turn 3743 are all cast at one time. Hence, the manufacturing process is further improved by forming many/all of the turns at one time.

Cabinet

Referring now to FIG. 38, a cabinet 3800, such as a single cabinet, is used to house multiple elements of the power processing system 100. For instance, it is beneficial to house multiple elements of the power processing system together to save in manufacturing cost, shipping, storage, and/or installation space. Further, housing multiple elements together aid in temperature control, cooling, electrical isolation, and/or safety. Optionally, the cabinet 3810 houses one or more of:

any inductor described herein;
an LC filter;
an LCL filter 3820;
an active front end (AFE) 3830;
a variable frequency drive (VFD) 3840;
a sine wave filter (SWF) 3850;
an inverter; and/or
a converter.

A heat exchange system 3860, such as the radiator 1840/radiator system, is optionally used to cool elements in the cabinet. Elements in the cabinet are optionally connected to the motor 156. Optionally and preferably, the power processing system 100 processes three-phase power. Optionally and preferably, the LCL filter, variable frequency drive 3840, and sine wave filter 3850 are all housed in the cabinet 3800 and are cooled using a liquid cooled cooling system.

Referring now to FIG. 39A, the shape of the flat windings is further described. The first flat winding is illustrated with an increasing width with radial distance from the center of the inductor core 610. The increasing width with radial distance increases surface area for cooling for a fixed/given amount of metal in the winding, such as aluminum. The second flat winding 3742 is illustrated with a rotational offset 3810 or bend along the face(s) of the inductor core 610, which facilitates the total coverage of the inductor core 610 by the inductor windings 620, as further described, infra.

Figure 39C:
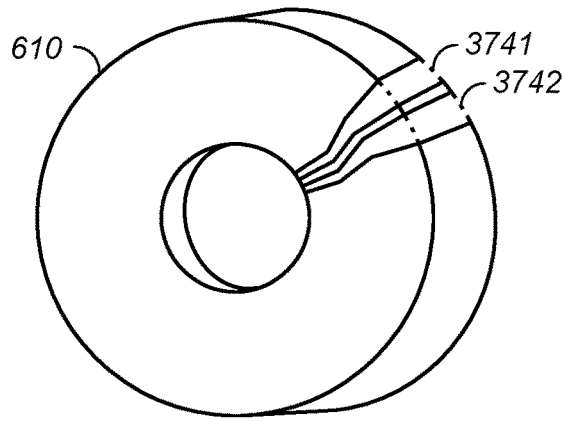

Referring now to FIG. 39B and FIG. 39C, the first flat winding 3741 with the rotational offset 3910 is illustrated in close proximity, close packed, with the second flat winding 3742. The close packing of the flat windings, with the rotational offset: increases the mass of the inductor windings 620 to increase flux of the current passing around sections of the inductor core 610 and covers more of the inductor core 610 to facilitate thermal heat transfer from the inductor core 610 to the surrounding environment.

Figure 40:
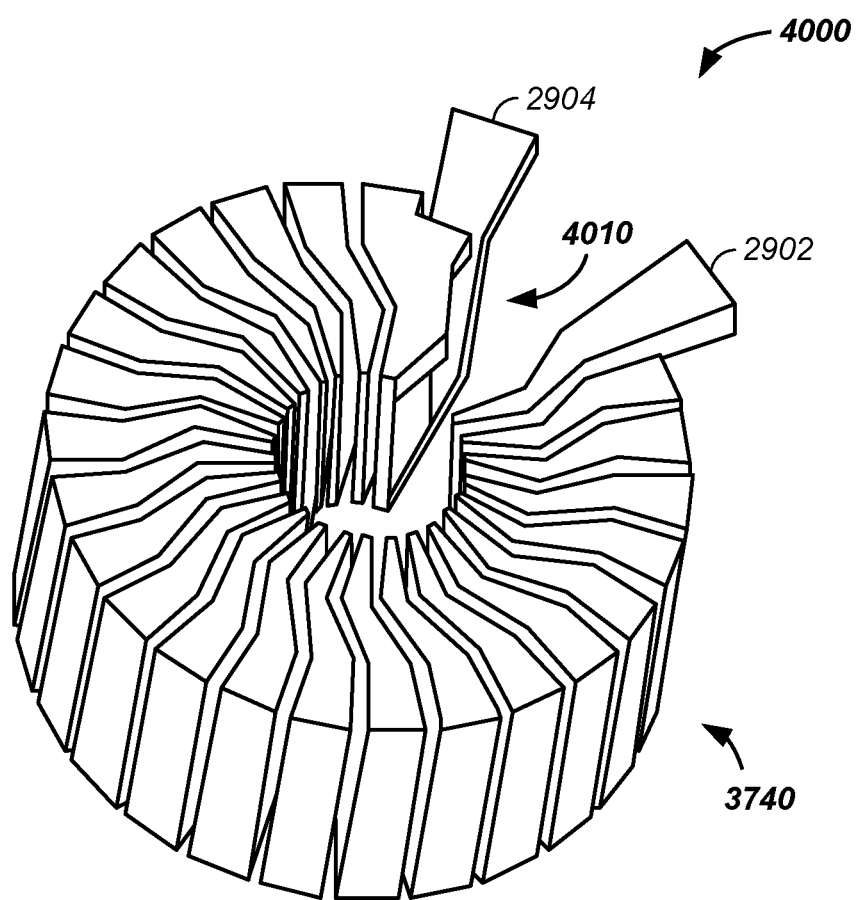
FIG. 40 illustrates an arced helical coil.

Referring now to FIG. 40, a cast winding assembly element is described. Generally, the cast winding assembly element or cast winding 4000 is an example of inductor windings 620. However, the cast winding 4000 is cast as an element and the inductor core 610 is then inserted into the cast winding 4000 as opposed to the winding being wound turn-by-turn around the inductor core 610. As illustrated, the cast winding 4000 has a first electrical connector 2902 and a second electrical connector 2904, a set of flat turns 3740, and a cavity 4010 into which the inductor core is inserted. The cast winding 4000 is optionally and preferably cast out of aluminum or an aluminum alloy. The cast winding 4000, or a subsection thereof, is optionally coated and/or plated with another metal, such as copper, silver, or gold. The cast winding 4000 is optionally and preferably an arced helical coil, arced helix, bendable helix, and/or a flexible helix, which form the central cavity 4010 into which a doughnut shaped inductor is inserted. When the cast winding 4000 has a plurality of flat turns, such as n turns, where n is a positive integer greater than 5, 6, 7, 8, 9, 10, 15, 20, 25, or 30, the cast winding 4000, the cast winding 4000 is flexible, like an uncompressed slinky, and is readily twisted to allow insertion of sections of the inductor core 610, described infra.

Figure 41:
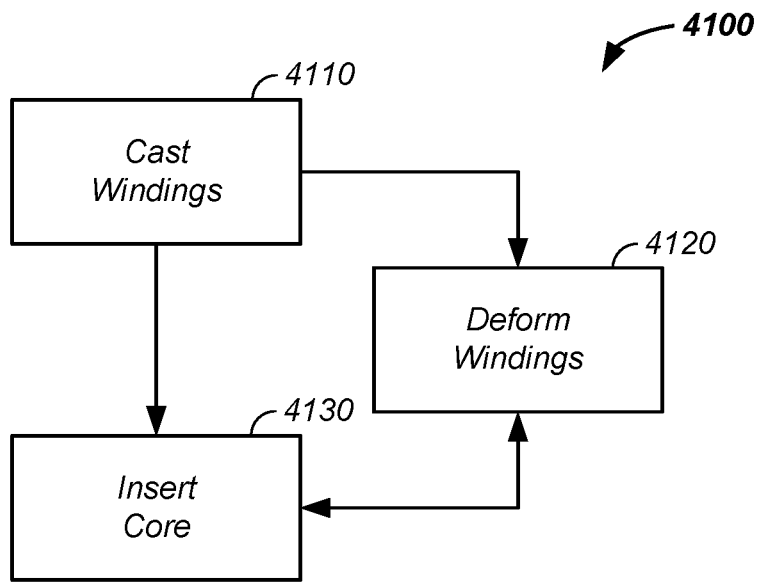
FIG. 41 illustrates a method of manufacturing an inductor.

Referring now to FIG. 41, an optional manufacturing process 4100 of the inductor 230 is described. In a first process, the winding is cast 4110, such as described supra. In a second process, the cast winding 4000 is deformed 4120, such as by turning or rotating one or more flat winding turns relative to additional flat winding turns of the set of flat turns 3740 and/or by rotating one or more flat winding turns, such as the first flat winding 3741 and second flat winding 3742 relative to a central curved axis running through the cavity 4010. As illustrated in FIG. 40, the cavity accepts a toroidal inductor core. In a third process, the inductor core 610 is inserted 4130 into the cavity 4010. A process of inserting the inductor core 610 into the cast winding 4000 is further described, infra.

Figure 42:
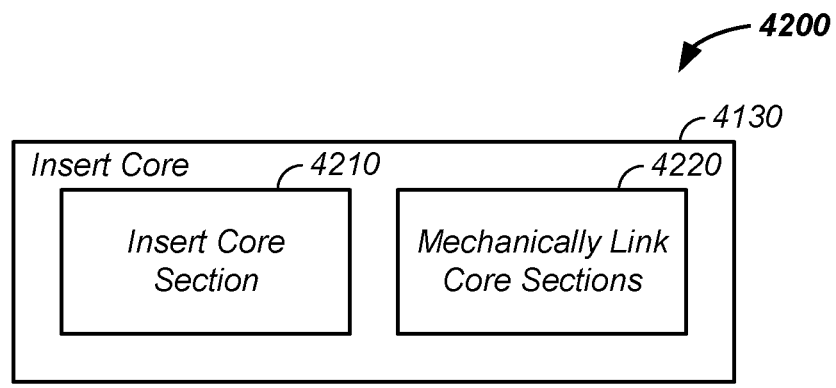
FIG. 42 illustrates a method of assembly of an inductor.
Figure 43A:
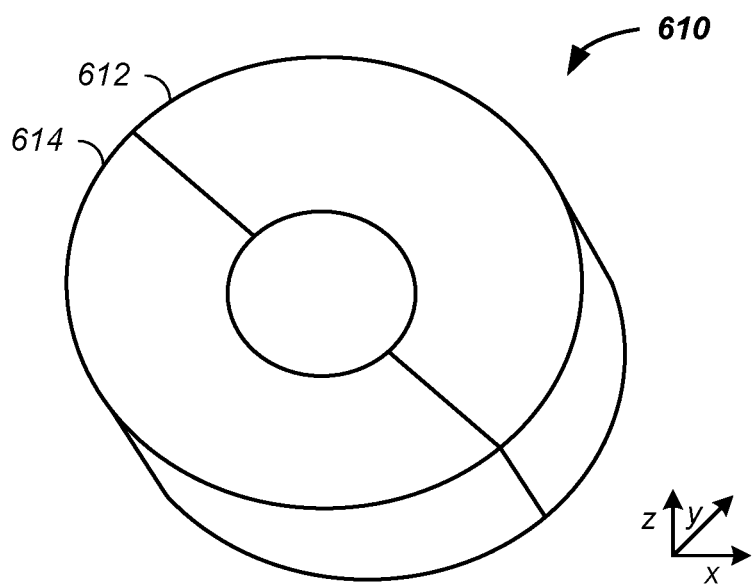
FIG. 43A illustrates a sectioned toroid inductor core and FIG. 43B and FIG. 43C respectively illustrate a close fit and snap-together interface of toroid inductor core sections.

Referring now to FIG. 42 and FIGS. 43(A-C), an assembly process 4200 of inserting the core 4130 into the set of flat turns 3740 is described. Generally, the inductor core 610 is provided in two or more sections, such as a first core section 612 and a second core section 614, that combine to form the inductor core 610. For example, the sections of the inductor core 610 include 2, 3, 4, or more sub-sections that when combined form the inductor core 610, such as a first sub-section forming one-half of the inductor core 610 and a second sub-section forming a second half of the inductor core 610, such as illustrated in FIG. 43A. For instance, in the step of inserting core sections 4210, the first core section 612 is inserted into the cavity 4010 and then the second core section is inserted into the cavity and the core sub-sections are mechanically linked 4220 and/or are mechanically connected.

Figure 43B:
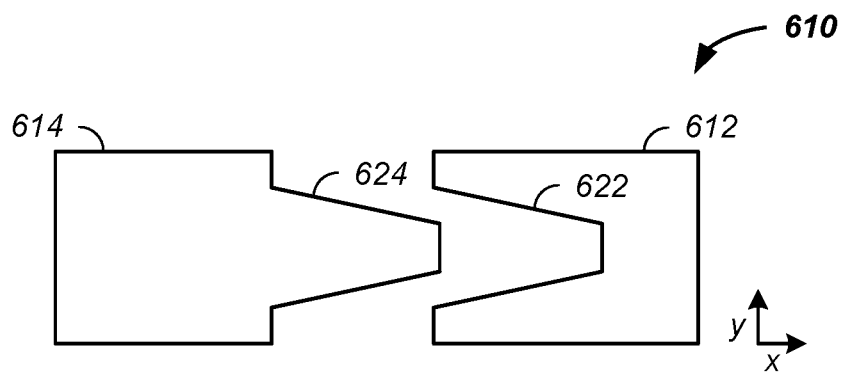

Referring now to FIG. 43B, optionally the two or more core sub-sections, such as the first core sub-section 612 and the second core sub-section 614, fit together in a lock and key format. As illustrated, a key section 624 of the second core sub-section 614 inserts into a lock section 622 of the first core sub-section 612. The lock and key interface is optionally of any geometry; however, optionally and preferably the lock and key element combine to form a fully contacting interface between two or more sub-sections to form a complete inductor core 610, such as a distributed gap inductor core.

Figure 43C:
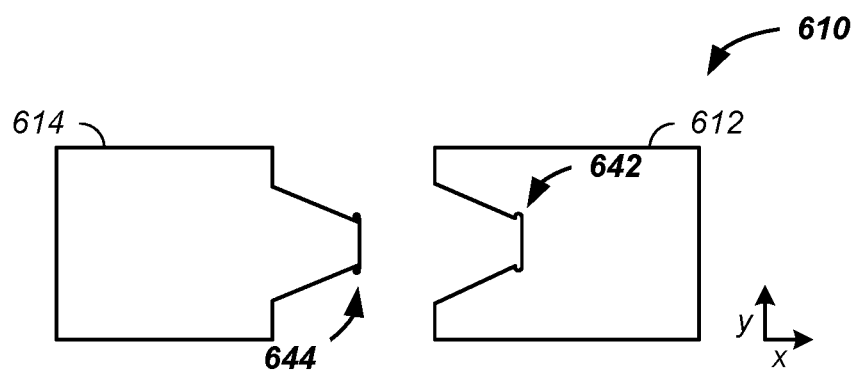

Referring still to FIG. 43B and referring now to FIG. 43C, optionally the core sub-sections click together via use of an insertion element 644 into an insertion gap 642, which is optionally and preferably combined with the lock and key format. A positive response function, such as a click, informs the assembler that a connection between sub-sections is achieved.

Cooling

Figure 44A:
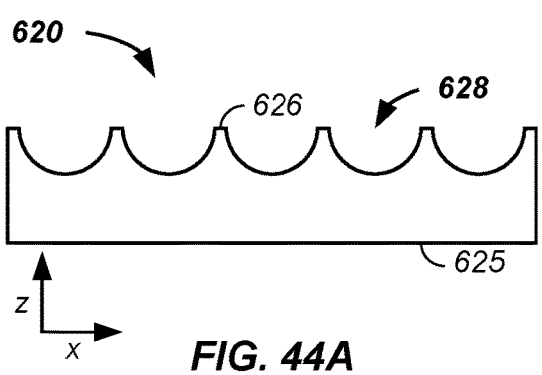
FIG. 44A and FIG. 44B illustrate cast protrusions of a winding having gaps and gaps filled with cooling lines, respectively.

Referring now to FIG. 44A, FIG. 44B, FIG. 45A, FIG. 45B, and FIG. 46, a cooling system of the inductor 230 using the cast winding 4000 is described, where the cast winding 4000 includes a cast protrusion 626 separating casting gaps 628. Referring to FIG. 44A, the optional cast protrusions 626 of the winding 620 is referring to herein as a clamshell surface of the winding 620. The clamshell surface is further described, infra.

Referring still to FIG. 44A, an example of the winding 620 comprising a flat winding body 625 is illustrated, where a flat/curved/arced surface of the winding body 625 is wound around and in contact/proximate contact with the core 610. The winding body 625, such as in the first flat turn 3741, optionally contains a non-planar surface, such as containing one or more of the cast protrusions 626 that separate the casting gaps 628. The casting gaps protrude from the inductor turn, such as along a z-axis away from an inductor core, such as far enough to encompass 1, 2, 3, or more cooling tubes and optionally more than one-fifth, one-fourth, one-third, one-half, or three-quarters of a diameter of a corresponding cooling tube. Optionally, the cast protrusions 626 function as heat sink fins, such as to dissipate heat to the surrounding atmosphere and/or to a liquid coolant flowing across/around the cast protrusions 626.

Figure 44B:
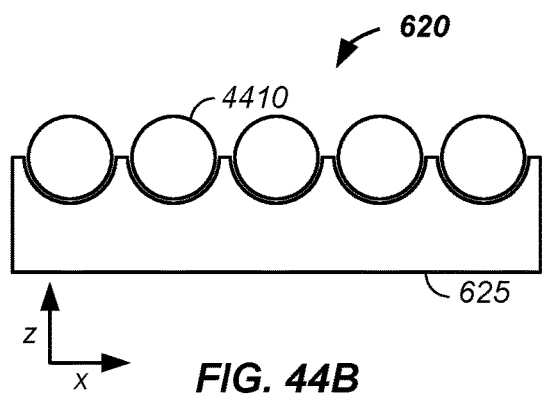

Still referring to FIG. 44A and referring now to FIG. 44B, one or more optional cooling lines/cooling tubes 4410 are positioned substantially into the casting gaps 628, where a cooling fluid running through the cooling tubes is used to remove heat/energy from the inductor 230. Generally, as least one cooling tube of the set of cooling tubes 4410 is positioned in at least one casting gap of the set of casting gaps 628. The cooling tube preferably contacts the cast protrusions 626 to aid in thermal transfer. Optionally, the cooling tube is thermally connected to the cast protrusions, such as via use of a thermal grease. Generally, the cooling tube is less than 0.5, 1, 2, 3, or 5 millimeters from the cast protrusions 626 and/or the winding body 625. The winding body 625 and the winding protrusions 626 are optionally and preferably cast, as described supra, such as in the cast winding 4000 and/or such as in the first flat turn 3741.

Figure 45A:
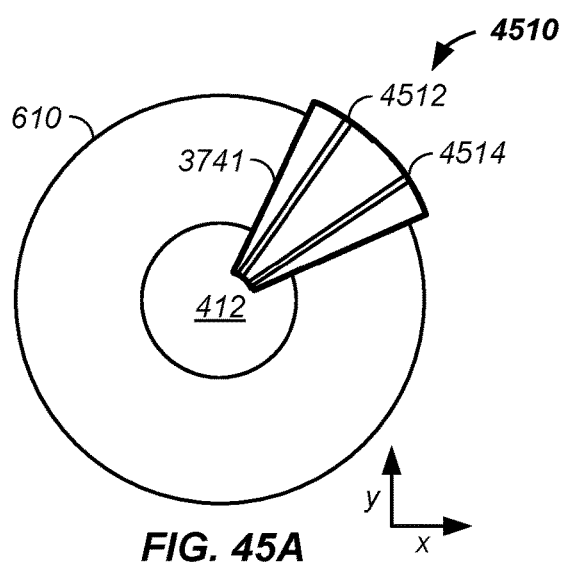
FIG. 45A and FIG. 45B illustrate cooling lines in gaps in a planar and perspective view, respectively.
Figure 45B:
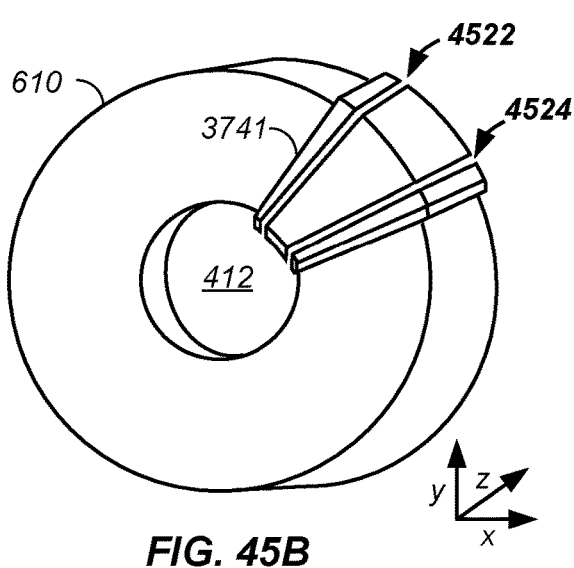

Referring now to FIG. 45A and FIG. 45B, a set of cooling tubes 4510 coupled to the inductor 230 is illustrated. Referring now to FIG. 45A, as illustrated, a first cooling tube 4512 and a second cooling tube 4514, illustrative of n cooling tubes, are coupled, such as in corresponding casting gaps 628 between corresponding casting protrusions 626, to the first flat turn 3741 wrapped about the inductor core 610, where n is a positive integer, such as greater than 0, 1, 2, 3, 4, 5, 10, or 20. As illustrated, the cooling tubes run along a first surface, such as the front face 418, of the inductor 230. Referring now to FIG. 45B, the cast protrusions 626, the casting gaps 628, and/or the cooling tubes 4410 are illustrated running along multiple surfaces of the inductor 230, such as the inner surface 414 surrounding the center aperture 412, the front face 418, the outer edge 416, and/or the back face 419 of the inductor 230. As illustrated, the cooling tubes extend radially outward from the center aperture 412, but optionally extend along any surface of the inductor 230 in any direction.

Figure 46:
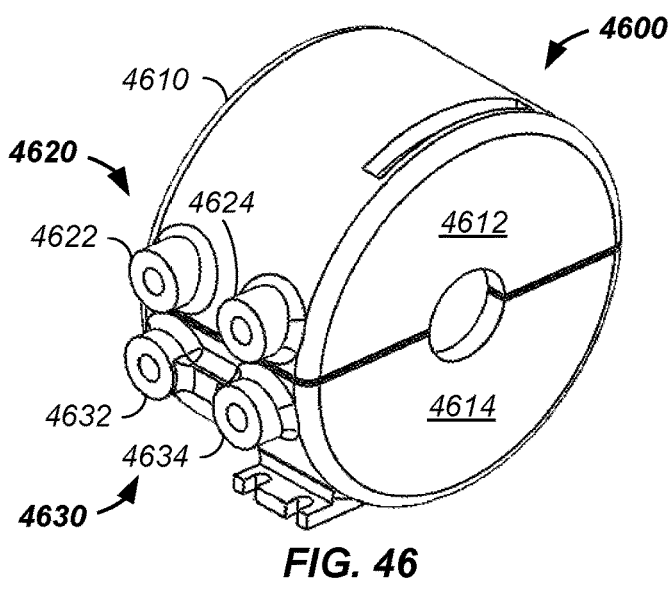
FIG. 46 illustrates a clamshell cooling system.

Referring now to FIG. 46, an optional cooling jacket system 4600 is described. The cooling jacket 4600 is optionally a clamshell design, where two sections enclose a central object, such as the inductor 230. Generally, the cooling jacket system 4600 includes a cooling jacket 4610 comprising at least two sections, which are optionally mechanically connected via a hinge. For example, the cooling jacket 4610 comprises at least two parts, such as a plurality of coolant containment parts or a top section 4612 of the cooling jacket 4610 and a bottom section 4614 of the cooling jacket 4610. The multiple parts come together to surround or circumferentially surround the wound core/inductor 230 during use. The top and bottom halves join each other along any axis of a plane crossing the inductor 230. Further, the top and bottom sections 4612, 4614 of the cooling jacket 4610 are optionally equal in size or either piece could be from 1 to 99 percent of the mass of the sandwiched pair of pieces. For instance, the bottom piece may make up about 10, 25, 50, 75, or 90 percent of the combined cooling jacket assembly. Still further, the cooling jacket 4610 may be composed of multiple pieces, such as 3, 4, or more pieces, where the center pieces are rings sandwiched by the top and bottom sections, or any outer sections, of the cooling jacket. Generally, any number of cooling pieces optionally come together along any combination of axes to form a jacket cooling the wound core. Each section of the cooling jacket optionally contains its own cooling in and cooling out lines and/or a cooling line runs between jacket sections. As illustrated, a first cooling line 4620 has a first coolant input line 4622 connected to a first coolant exit line 2624 via a first internal fluid guide directing the, optionally circulating, coolant over a first section of the inductor 230 and a second cooling line 4630 has a second coolant input line 4632 connected to a second coolant exit line 2634 via a second internal fluid guide directing the coolant over a second section of the inductor 230. Generally, a given internal fluid guide directs the coolant along any path, such as forward along a first arc of the inductor 230 and in a return path along a second arc of the inductor 230.

Flat Winding Shape

Referring now to FIGS. 47(A-C), optional cast geometries of the set of flat turns 3740 is described. Referring now to FIG. 47A, the first flat turn 3741 of the set of flat turns 3740 is illustrated with an optional geometry. For clarity of presentation, the optional geometry is illustrated in four sections, a first volume, $v_1$, along the inner surface 414; a second volume, $v_2$, along the front face 418; a third volume, $v_3$, along the outer edge 416; and a non-visual fourth volume, $v_4$, along the back face 419 of the inductor 230. Generally, a current flux capacity is related to a cross-section area of the turn as a function of longitudinal position along the turn. As the width of the first flat turn 3741, as illustrated, increases with radial distance from the center 412 of the aperture of the inductor 230, the thickness of the first flat turn 3741 is optionally made thinner, such as along the front face 418 of the inductor 230, as a function of radial distance from the center 230 while still maintaining a constant cross-section area of the first flat turn 3741 as a function of radial distance. Similarly, as the first flat turn 3741 has a smaller width along the inner surface 414 of the inductor 230 compared to a larger width along the outer edge 416 of the inductor 230, a thicker section of the first flat turn 3741 along the inner surface 414 and a thinner section of the first flat turn along the outer edge 416 yield a constant cross-section of the first flat turn 3741 as a function of position around the inductor core 610.

Figure 47A:
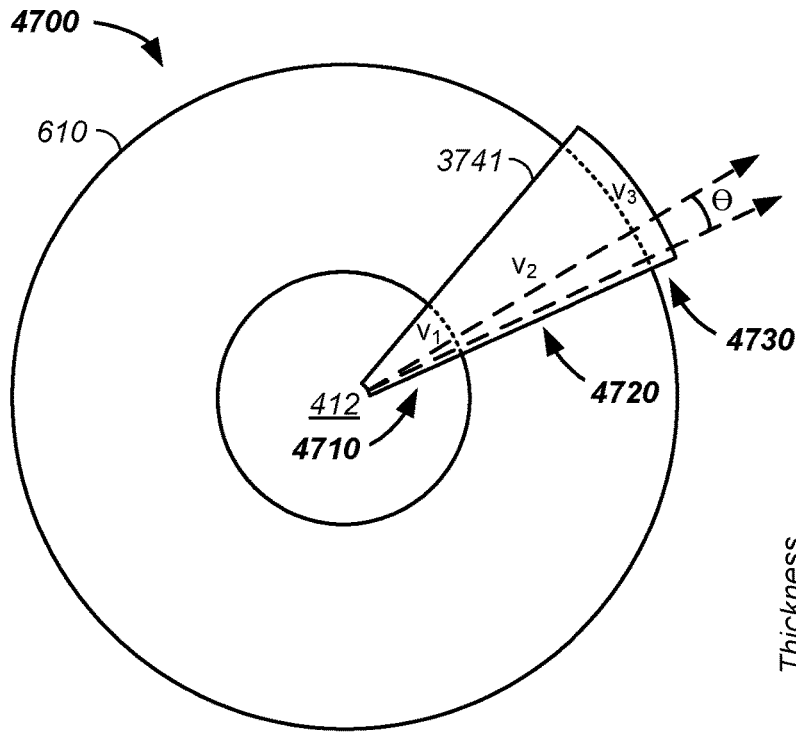
FIG. 47A and FIG. 47B illustrate volumes and thicknesses of a cast winding.
Figure 47B:
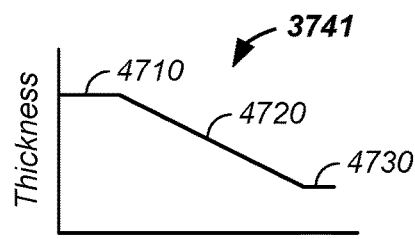

Referring now to FIG. 47B, an optional thickness profile of the first flat turn 3741 is illustrated, where the thickness of the first volume, along an axis from the center 412 radially outward through a center of a section of the inductor core 610, is thicker than the third volume along the same axis and the thickness of the second volume, along an axis perpendicular to the front face 418 of the inductor core 610, decreases with radial position. It is thus readily calculated using simple geometry thicknesses of the first flat turn as a function of position along/around the first flat turn 3741 that combined with the varying width of the first flat turn 3741 maintain a constant cross-section area as a function of position along/around the first flat turn 3741. The decreased thickness of the first flat turn as a function of radial distance from the center 412 along the front face 418 and the back face 419 of the inductor 230 reduces required mass, such as required aluminum, of the first flat turn 3741 and thus reduces cost while maintaining a current flux capacity around the turn. Optionally, the thickness of the first volume, along the axis from the center 412 through a center of a section of the inductor core is at least 1, 2, 5, 10, 15, 20, 30, 40, 50, or 100 percent greater than the thickness of the third volume along the same axis. Optionally, the thickness of the second volume as a function of radial distance from the center decreases from a first inward radial distance to a second outward radial distance by at least 1, 2, 5, 10, 20, or 30 percent.

Figure 47C:
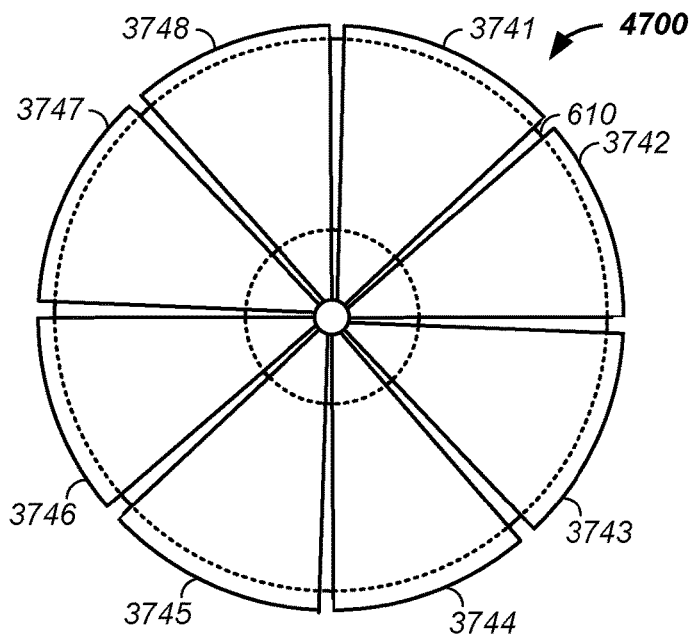
FIG. 47C illustrates aperture filling capacity of cast windings.

Referring now to FIG. 47C, the first flat winding and a second through an eighth flat winding, 3742-3748, illustrate that a majority of a volume of the center aperture of the inductor 230 is filled by the set of flat turns 3740. Generally, current carrying sections the set of flat turns 3740 occupy at least 50, 60, 70, 80, or 90 percent of the volume of the center aperture of the inductor 230, where volume of the current carrying metal of traditional wire windings occupy less than 10, 20, 30, or 40 percent of the volume of the center aperture of the inductor due to the volume requirements of the wire coating about each wire core and mechanical gaps between individual turns, especially for round cross-section wires which have air gaps between turns and layers of windings.

Figure 47D:
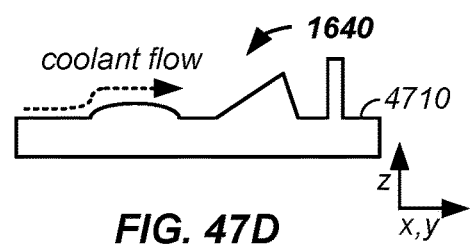
FIG. 47D and FIG. 47E illustrate heat sinks as elements of a winding.
Figure 47E:
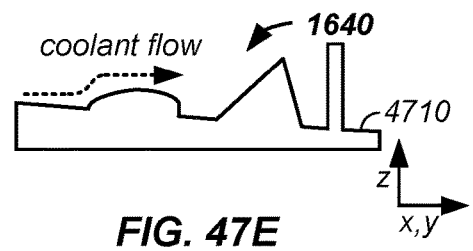

Referring now to FIG. 47D and FIG. 47E, an example of heat sinks 1640 optionally cast as a part of the winding are illustrated. For example, the first flat winding 4710 is cast with heat sinks protruding from the surface of the winding, such as from the front face 418. Air flow and/or coolant flowing over the heat sinks 1640 removes heat from the inductor 230, which aids in longevity of the inductor 230 and efficiency of the inductor 230. Generally, the heat sinks 1640 are of any geometry. Referring now to FIG. 47E, heat sinks are illustrated as protruding from the heat sink where the heat sink thickness varies as a function of position along the length and/or width of a given turn of the winding.

Harmonic Filter Contactor Controller

Figure 48:
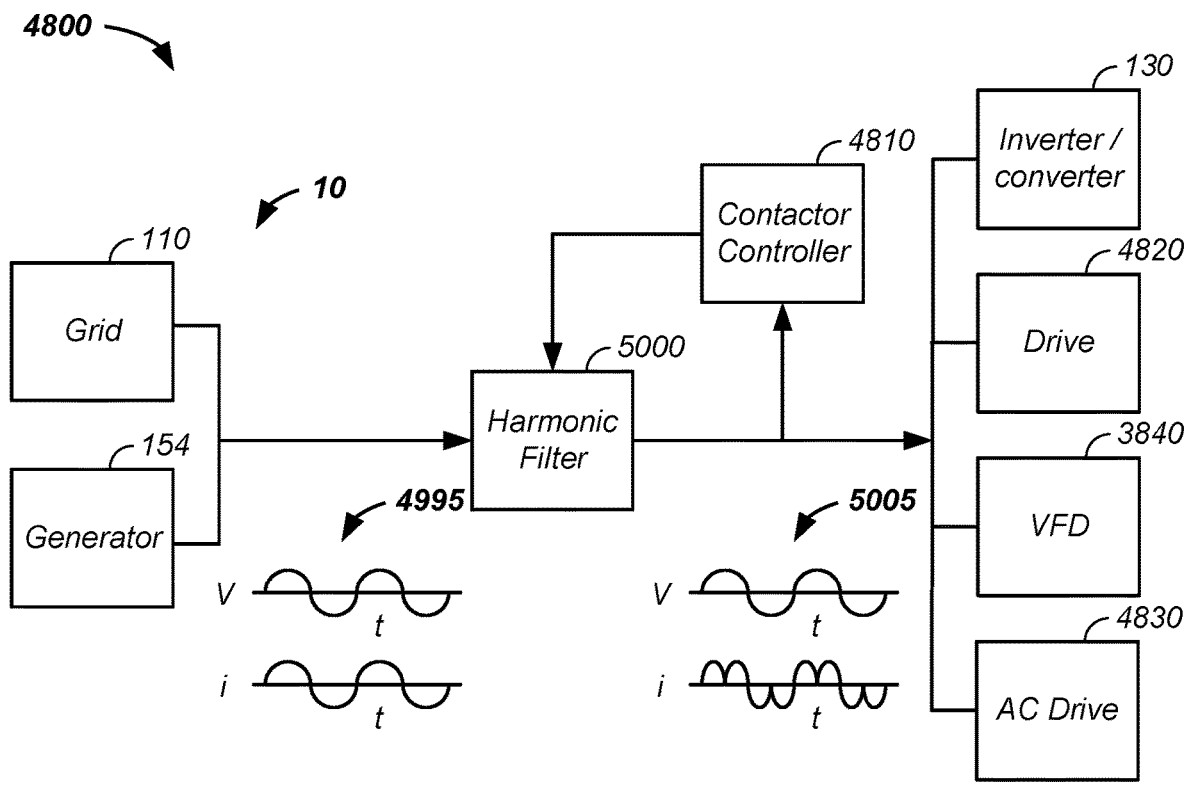
FIG. 48 illustrates use of a harmonic filter.

Referring now to FIG. 48, a harmonic filter control system 4800 is described. Generally, a harmonic filter 5000 takes output from an electrical power source 10, such as the grid 110 or a generator 154, and shunts or blocks harmonic currents, such as provided to a load, an inverter/converter 130, a drive 4820, a variable frequency drive 3840, and/or an AC drive 4830. As illustrated, the harmonic filter transforms the current profile as a function of time from an initial profile 4995 to a filtered profile 5005, such as with $5^{th}$ order harmonics and beyond removed by at least 50, 75, 90, or 95%. The filter and corresponding circuit card essentially looks at a current and provides a fixed pulse width output profile. As illustrated, a contactor controller 4810 is used to open/shut one or more contactors linked to the harmonic filter 5000, as further described infra. Generally, a contactor is an electrical device that is used for switching an electrical circuit on or off. These contacts are, in most cases, typically open and provide operating power to the load when the contactor coil is energized. Contactors are most commonly used for controlling electric motors. For example, 99+% of time, drive load turns on contactors; however, occasionally it is desirable to break contactors connection. When this is done, the grid is still linked to the drive via the inductors.

Figure 49:
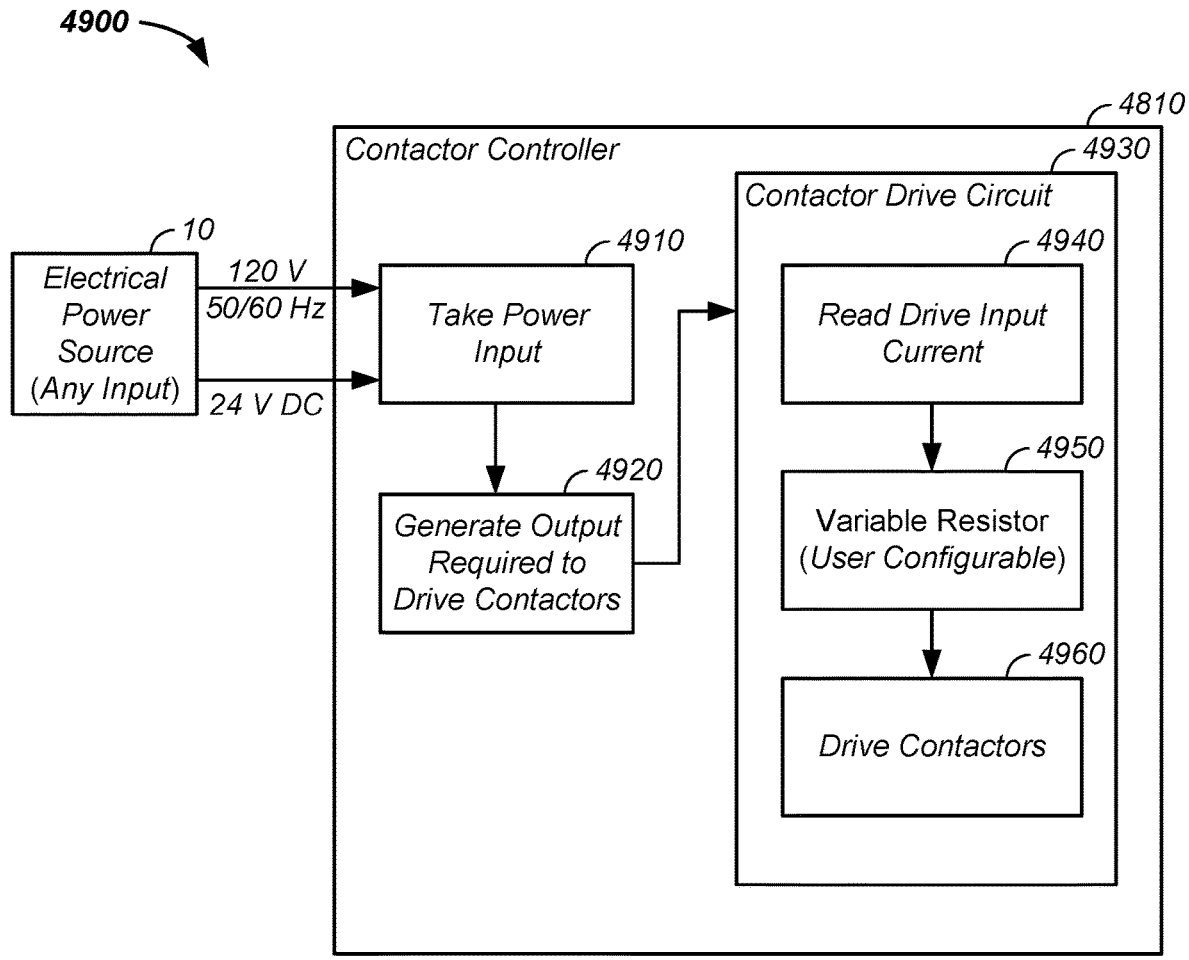
FIG. 49 illustrates a contactor controller.

Still referring to FIG. 48 and referring now to FIG. 49 the contactor controller 4810, used to connect or disconnect capacitors, is further described. Generally, the contactor controller 4820 is a power sensor that turns a contactor, further described infra, on or off. For instance, the generator 154 operates with the contactor open until a power threshold is reached, which trips the contactor to disconnect the harmonic filter 5000. The contactor functions to allow start-up or shut-down without tripping a fault circuit on the generator 154. As illustrated in FIG. 49, the contactor controller 4810 operates on output from the electrical power source 10, such as by taking/sensing power input 4910 and generating output required to drive contactors 4920, such as 5V or 15V output. For example, the 5V or 15V output is input into a contactor drive circuit 4930, of the contactor controller 4810, which reads a drive input current 4940 and using a user configurable variable resistor 4950 drives the contactors 4960. Contactors used in conjunction with the harmonic filter 5000 are further described infra. An example is provided herein to further elucidate the contactor.

Example I

In a first example, the contactor operation is further described for clarity of presentation and without loss of generality. In this example, an oil/gas industry pump is designed to operate with the contactor in a closed (power flowing) state at higher levels of current and to open at low current. For instance, the user configurable variable resistor 4950 might be set to on at a particular load, such as a 25% load, and/or to turn off at a particular load, such as a 15% load.

Harmonic Filter

Figure 50:
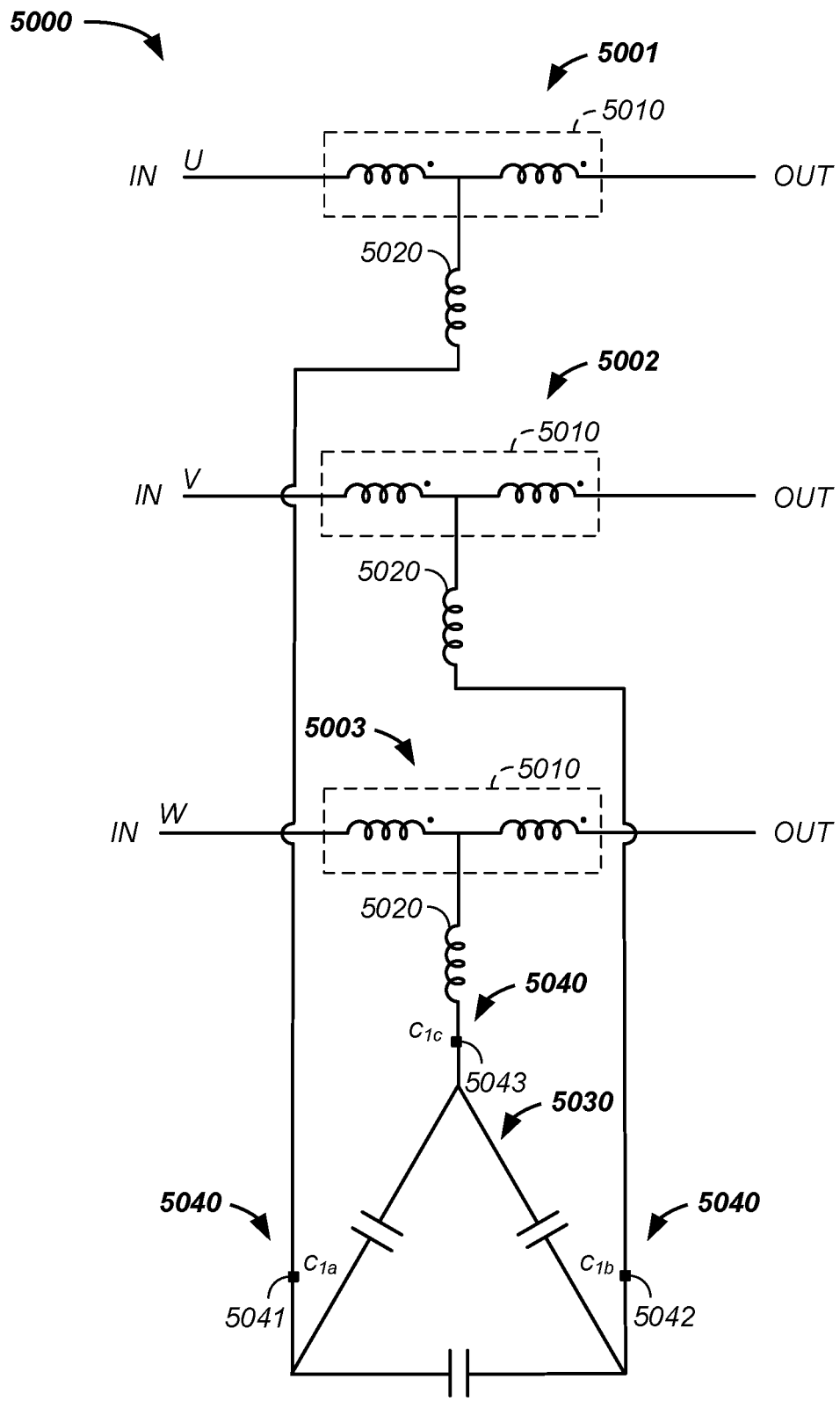
FIG. 50 illustrates a harmonic filter.

Referring now to FIG. 50, a harmonic filter 5000 is illustrated. As illustrated, the harmonic filter 5000 filters 3-phase power, U, V, W. Each phase of power is filtered with a coupled inductor 5010—inductor 5020 pair linked together with a delta circuit, described infra. The coupled inductor 5010 has two or more windings on a common core and operates as both an inductor and a transformer. The harmonic filter 5000 also includes a delta-circuit 5030. An exemplary delta circuit 5030 includes three hot conductors and optionally a ground. The phase loads are connected to one another in the shape of a triangle forming a closed circuit. As illustrated, a first coupled inductor—inductor pair 5001 is connected to a first apex of the delta circuit 5030, such as from the U phase; a second coupled inductor—inductor pair 5002 is connected to a second apex of the delta circuit 5030, such as from the V phase; and a third coupled inductor—inductor pair 5003 is connected to a third apex of the delta circuit 5030, such as from the W phase. Optional contactors, connected to the harmonic filter 5000, are used to alternatingly connect and disconnect the delta circuit 5030, as further described infra.

The harmonic filter 5000 takes out higher frequency harmonics. For instance, when processing 50 Hz signal, higher order harmonics are removed, such as removal of 300 Hz ($5^{th}$ harmonic), 400 Hz ($7^{th}$ harmonic), and 500 Hz ($9^{th}$ harmonic), which would otherwise distort the power grid.

In one embodiment of the invention, the harmonic filter is constructed using any of the toroids, inductor cores, core materials, and/or windings described herein.

Cooling

Referring now to FIG. 51A, FIG. 51B, FIG. 51C, FIG. 51D, and FIG. 51E, an optionally cooling process 5100 of the harmonic filter 5000 is described. As described, supra, the harmonic filter includes a coupled inductor 5010-inductor 5020 pair in-line with each phase of the 3-phase power system. As illustrated, first various inductors in the harmonic filter 500 are optionally staggered in vertical position relative to second various inductors in the harmonic filter 5000, which aids in cooling as described herein. For clarity of presentation and without loss of generality, examples provided infra illustrate the coupled inductors 5010 of the coupled inductor—inductor pairs in a top layer and the inductors 5020 of the coupled inductor—inductor pairs in a bottom layer in a cooling shroud 452. However, any of the inductors in the coupled inductor-inductor pair, such as the first coupled inductor—inductor pair 5001, described supra, are optionally on the same level and/or are positioned in any orientation on differing levels.

Example I

In a first example, the coupled inductors of the coupled inductor—inductor pairs are positioned in a first cooling layer and the inductors of the coupled inductor-inductor pairs are positioned in a second cooling layer. More particularly, referring now to FIG. 51A, three coupled inductors 5010 (of coupled inductor-inductor pairs) are positioned in a first layer within a cooling shroud 452, which is an example of the air guide shroud 450. Still more particularly, a first coupled inductor 231, a second coupled inductor 232, and a third coupled inductor 233 are positioned in the first layer, where each of the coupled inductors 231, 232, 233 are linked to individual phases of the 3-phase grid system. Similarly, referring now to FIG. 51B, three inductors 5020 (of coupled inductor—inductor pairs) are positioned in a second layer within the cooling shroud 452. Still more particularly, a first inductor 237, a second inductor 238, and a third inductor 239 are positioned in the second layer, where each of the inductors 237, 238, 239 are linked to individual phases of the 3-phase grid system. As illustrated, the x-, y-positions of the first, second, and third coupled inductors 231, 232, 233 are staggered relative to x-, y-positions of the first, second, and third inductors 237, 238, 239, which forces air flowing between levels along the z-axis to travel back and forth along the x- and/or y-axes, which aids cooling.

Figure 51A:
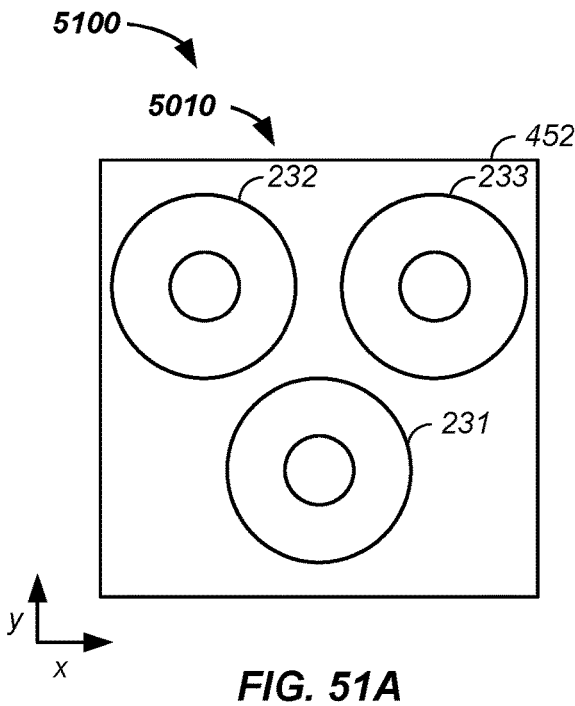
FIG. 51A and FIG. 51B illustrate stacked inductors and FIG. 51C, FIG. 51D, and FIG. 51E illustrate air cooling stacked inductors.
Figure 51B:
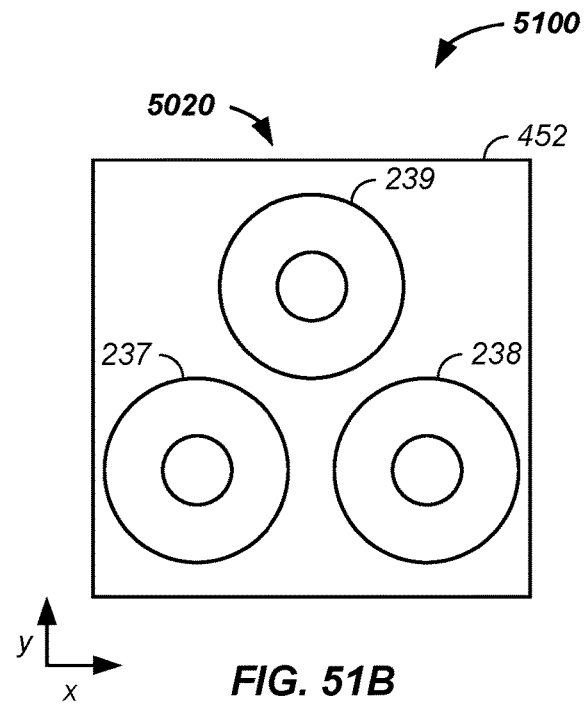
Figure 51C:
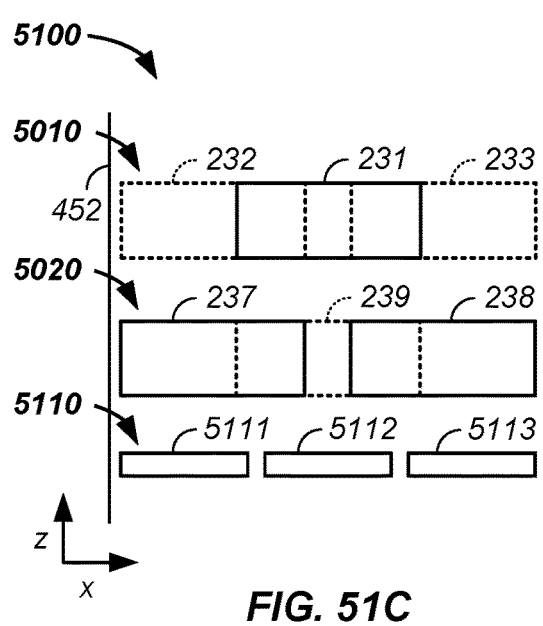
Figure 51D:
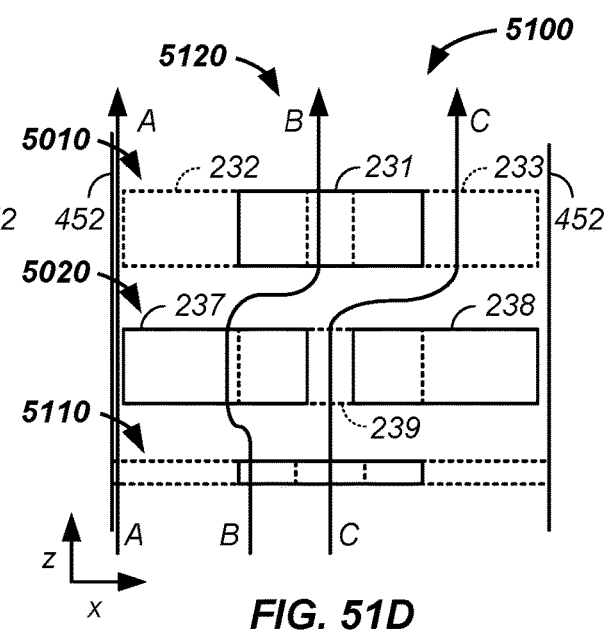

Referring still to FIG. 51A and FIG. 51B and referring now to FIG. 51C and FIG. 51D, the z-axis alignment of the inductors in the coupled inductor-inductor pairs, such as the first, second, and third coupled inductor—inductor pairs 5001, 5002, 5003 is further described. As illustrated, one or more fans 5110, such as a first fan 5111, a second fan 5112, and/or a third fan 5113 push, and/or optionally pull, air through the cooling shroud 452, where the cooling air takes direct and/or tortuous paths between, around, and/or through the inductors. For instance, referring now to FIG. 51D, a first air flow path, A, travels around the inductors and within the cooling shroud 452; a second air flow path, B, travels around the some inductors and through other inductors within the cooling shroud 452; and/or a third air flow path, C, travels around first inductors on a first level and around second inductors on a second level within the cooling shroud 452.

Example II

Figure 51E:
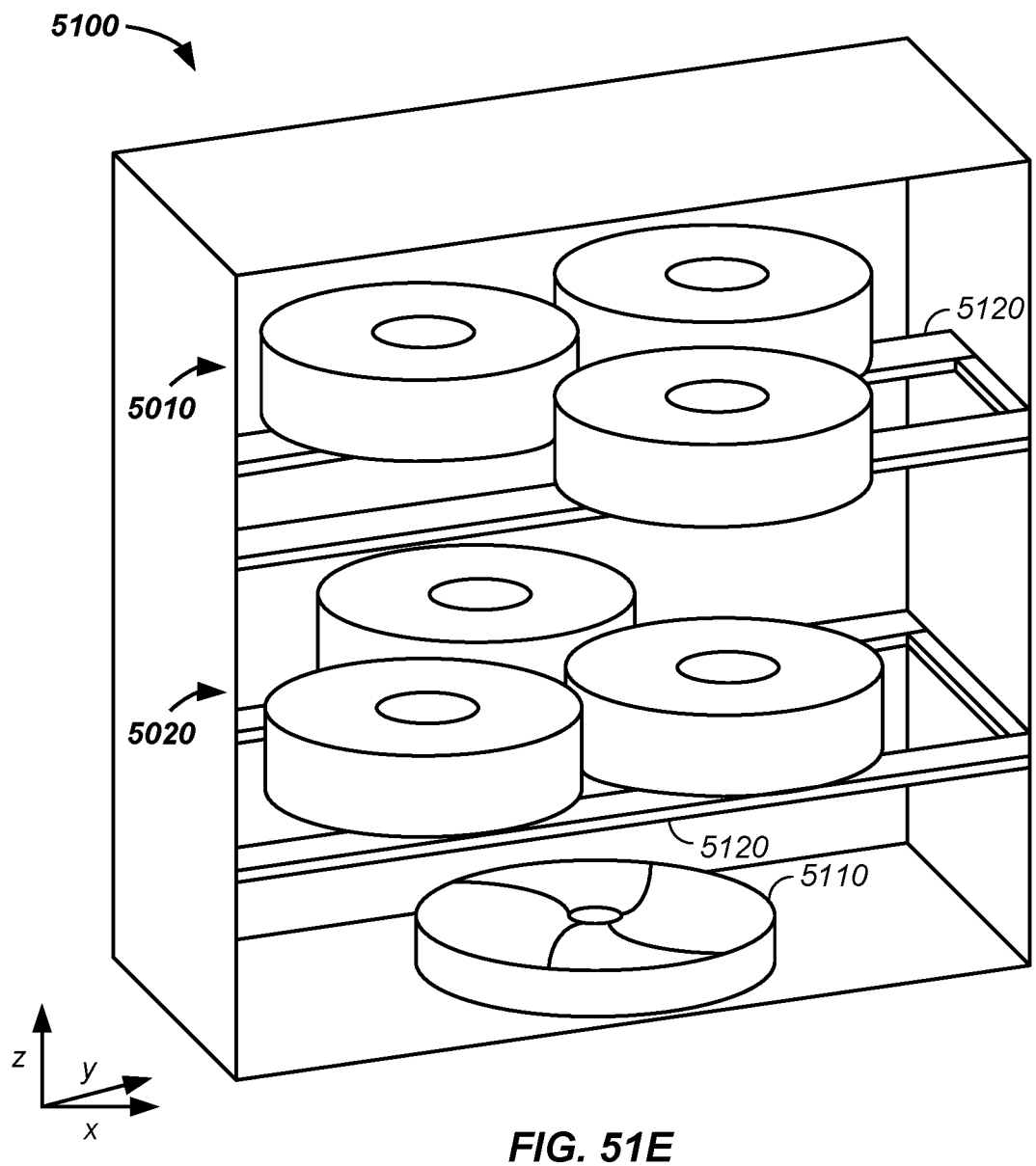

Referring now to FIG. 51E, an exemplary representation of housing the coupled inductors 5010 and the inductors 5020 in the coupled inductor-inductor pairs 5001, 5002, 5003, described supra, is provided. As illustrated, the coupled inductor-inductor pairs 5001, 5002, 5003 are mounted on racks 5120 or rails in a cabinet, such as a hip cabinet, further described infra, and are optionally and preferably cooled by one or more fans placed in the hip cabinet or in a tube, as further described infra.

Optionally and preferably, the inductors in the previous two examples are mounted in an orientation with the air flow traveling vertically; however, the inductors in the cooling shroud 452 are optionally positioned in any orientation.

Inductor Mounting

Figure 52A:
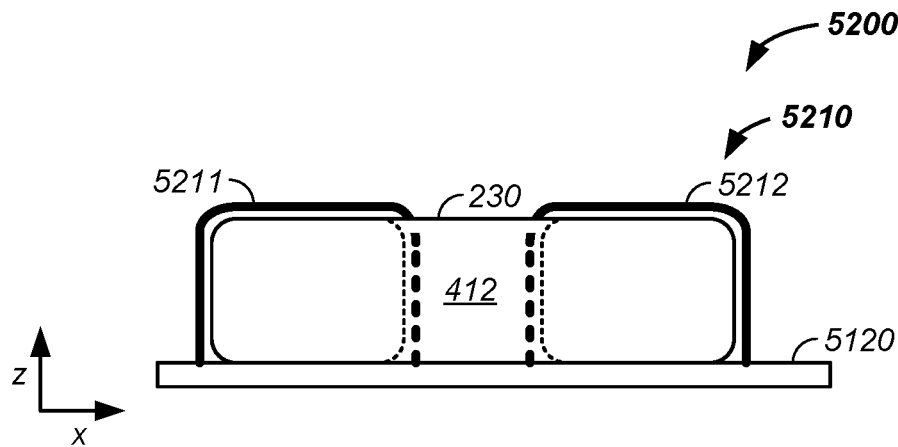
FIG. 52A and FIG. 52B illustrates strapped inductors from a side-view and a perspective view, respectively.
Figure 52B:
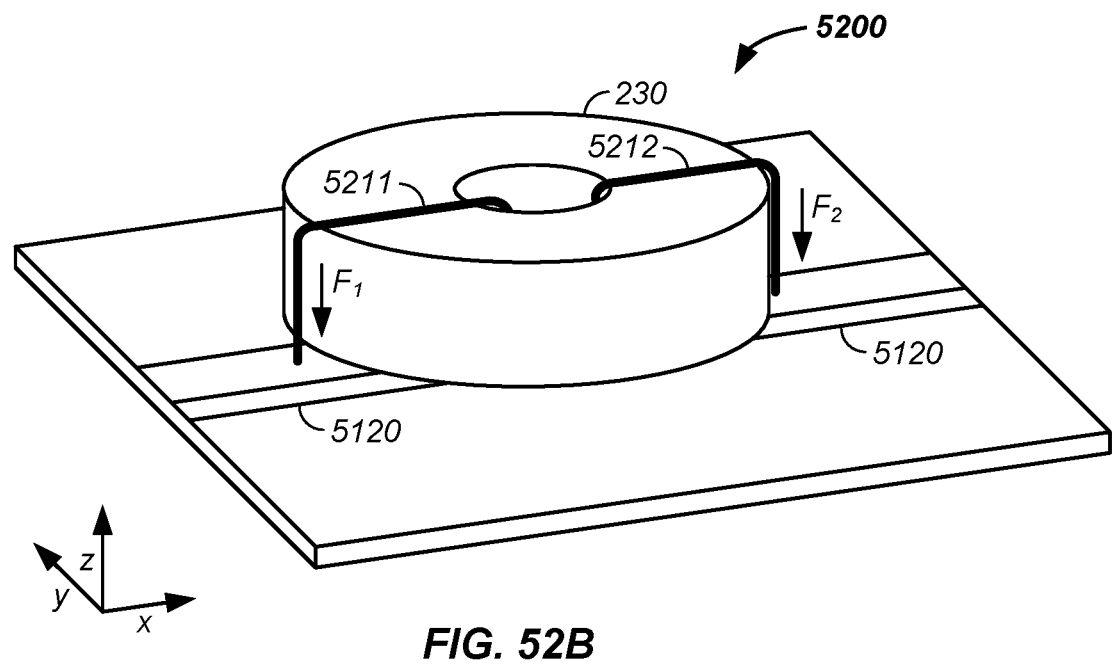

Referring still to FIG. 51E and referring now to FIG. 52 A and FIG. 52B, an inductor mounting system 5200 is described. Generally, the inductor mounting system 5200 resembles the vertical mounting system where a clamp bar 234 passes through a central opening 310 in the inductor 230 and is clamped to the base plate 210 via ties 315, albeit with less clamping force. Here, an inductor 230 is fastened to the rack 5120 with a tiedown strap 5210, such as a first tiedown strap 5211 fastened at one point to the rack 5120 and, after wrapping along an outer edge, an outer surface, and through a central opening of the inductor 230, is fastened at another point to the rack 5120. Similarly, a second tiedown strap 5212 is optionally and preferably used to force the inductor 230 toward the rack 5210, where the second tiedown strap 5212 is optionally and preferably positioned at least 115 degrees around an axis passing through the central opening of the inductor 230 relative to the first tiedown strap 5211. Generally, any number of tiedown straps 5210 are used. As illustrated in FIG. 52B, a tiedown strap, which is alternatively a bolt based fastener, is applied with a force of 10 to 100 pounds of force/tension and preferably within five pounds of 30, 40, 50, or 60 pounds of force. Optionally and preferably, the tiedown straps 5210 are non-conductive, such as Glastic straps, a pultruded strap, and/or fiber reinforced plastic.

As mounted, optionally and preferably individual inductors 230 are mounted with one or more of the following properties:
  in a duct/cooling shroud/housing;
  with a fan forcing air through the duct/cooling shroud/housing;
  with a fan pulling air through the duct/cooling shroud/housing;
  attached with less force than a vertically mounted inductor, which is preferably mounted with 200 to 800 pounds of strap force;
  in a stacked orientation relative to other inductors in the duct/cooling shroud/housing;
  rotated about a longitudinal axis passing through the duct/cooling shroud/housing relative to other inductors; and/or
  in a cabinet, such as in a drive cabinet, in a hip cabinet attached to the drive cabinet, or in a separate cabinet from a drive housing cabinet.

Harmonic Filter

Figure 53:
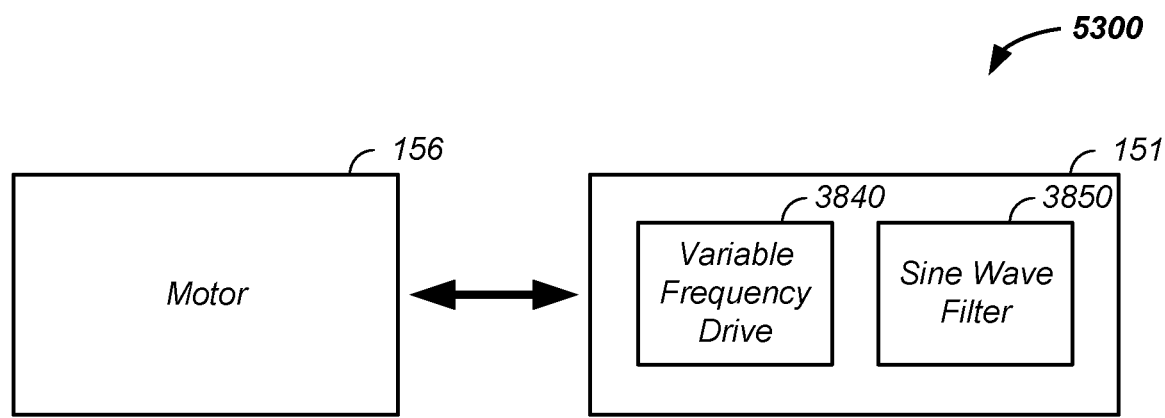
FIG. 53 illustrates a motor linked to a load.

Referring now to FIG. 53, a harmonic filter 5000 and/or a high frequency filter 144 is optionally and preferably used to process/filter current passing between: (1) the inverter/converter 130 and/or a high frequency inverter 134 and the load 152, motor 156, or a permanent magnet motor 158 and/or (2) a drive 151, such as a variable frequency drive 3840 and a load 152, such as a motor 156.

Harmonic Filter Contactor

Harmonic filter contactors are used to alternatingly connect the coupled inductor 5010 to the delta circuit, such as under control of the contactor controller 4810 described supra. As described herein, placing contactors within the delta circuit 5030 greatly reduces expense of the contactors. Four examples are provided with contactors positioned in different locations, where the overall cost of the harmonic filter 5000 decreases in each subsequent example.

Example I

Figure 54:
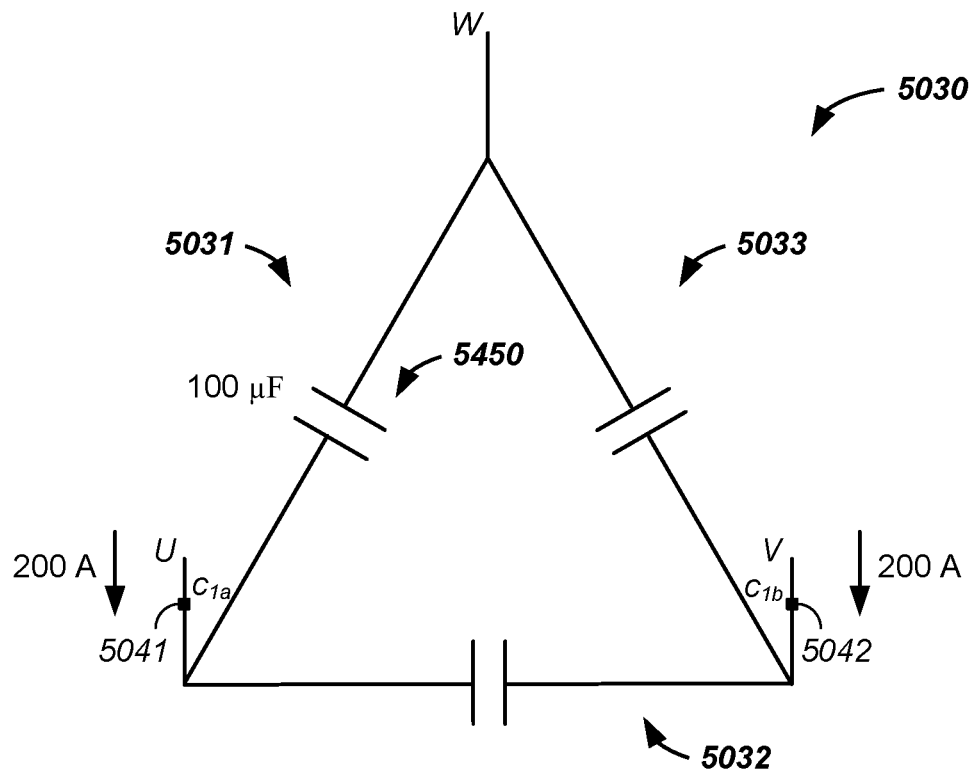
FIG. 54 illustrates a delta-circuit with auxiliary connectors.

In a first example, still referring to FIG. 50 and referring now to FIG. 54, as illustrated optional main line contactors 5040 are positioned between a given coupled inductor 5010-inductor 5020 pair and a given apex of the delta circuit 5030. For instance, a first main line contactor 5041, $C_{1a}$, connecting the U phase, is positioned between the first coupled inductor—inductor pair 5001 and the first apex of the delta circuit; a second main line contactor 5042, $C_{1b}$, connecting the V phase, is positioned between the second coupled inductor—inductor pair 5002 and the second apex of the delta circuit; and/or a third main line contactor 5043, $C_1c$, connecting the W phase, is positioned between the third coupled inductor—inductor pair 5003 and the third apex of the delta circuit, where any two of the first, second, and third contactors 5041, 5042, 5043 function to alternatingly connect and disconnect the delta circuit 5030 and/or the capacitors therein. A primary problem with the main line contactors is expense. For instance, when filtering 500 A current, each contactor must connect/disconnect approximately 200 A. This size contactor currently costs about $4,000, where costs of contactors drops exponentially with decreased amperage requirements.

Example II

Figure 55:
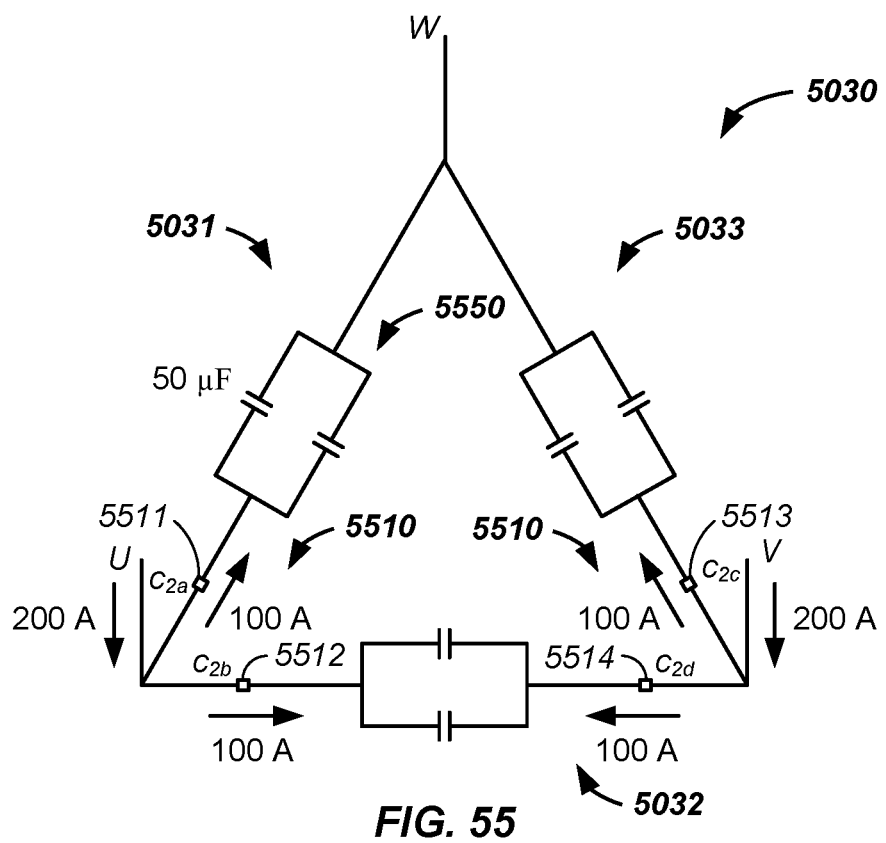
FIG. 55 illustrates a delta-circuit with in-leg connectors.

In a second example, still referring to FIG. 50 and referring now to FIG. 55, as illustrated the optional main line contactors 5040 are replaced with delta leg contactors positioned on legs of the delta circuit 5030 between the apexes of the delta circuit 5030. For instance, the first main line contactor 5041 is replaced with two delta leg contactors 5510, such as a first delta leg contactor 5511 on the UW leg 5031 of the delta circuit 5030 and a second delta leg contactor 5512 on the UV leg 5032 of the delta circuit 5030. Stated again, the first and second delta leg contactors 5511, 5512 optionally replace the first main line contactor 5041, where the cost of the contactors operating on the legs of the delta circuit 5030 are reduced to $500 as a result of only having to handle 100 A within each leg of the delta circuit as opposed to 200 A in the lead from the first couple inductor-inductor pair 5001 to the delta circuit 5030, which as noted above had to handle 200 A. Similarly, the second main line contactor 5042 is optionally replaced with two delta leg contactors 5510, such as a third delta leg contactor 5513 on the VW leg 5033 of the delta circuit 5030 and a fourth delta leg contactor 5514 on the UV leg 5032 of the delta circuit 5030. As above, the third and fourth delta leg contactors 5513, 5514 replace the second main line contactor 5042 and again the price of the two smaller delta leg contactors is far less than the main line contactor as the 200 A current on the main line is split to 100 A on each delta leg of the delta circuit 5030. In practice, only three delta leg contactors 5510 are need to disconnect the delta circuit from the electrical power source 10 or the load, such as the first, second, and third delta leg contactors 5511, 5512, 5513 or the first, third, and fourth delta leg contactors 5511, 5513, 5514. Similarly, one or two delta leg contactors are optionally used to disconnect the W phase power, not illustrated for clarity of presentation. Again, disconnecting any one contactor on each of the three legs of the delta circuit functions in practice to disconnect the delta circuit 5030 from the electrical power source 10 or the load. Notably, the 100 µF capacitors in each leg of the delta filter 5030 in the previous example are optionally and preferably replaced by two 50 µF capacitors wired in parallel in each leg of the delta filter 5030 in the current example. This example illustrates that's contactors within legs of the delta filter 5030 are optionally used in place of contactors positioned between a given coupled inductor-inductor pair and the delta filter 5030, where the given coupled inductor-inductor pair filters a given phase of multi-phase U, V, W current.

Example III

Figure 56:
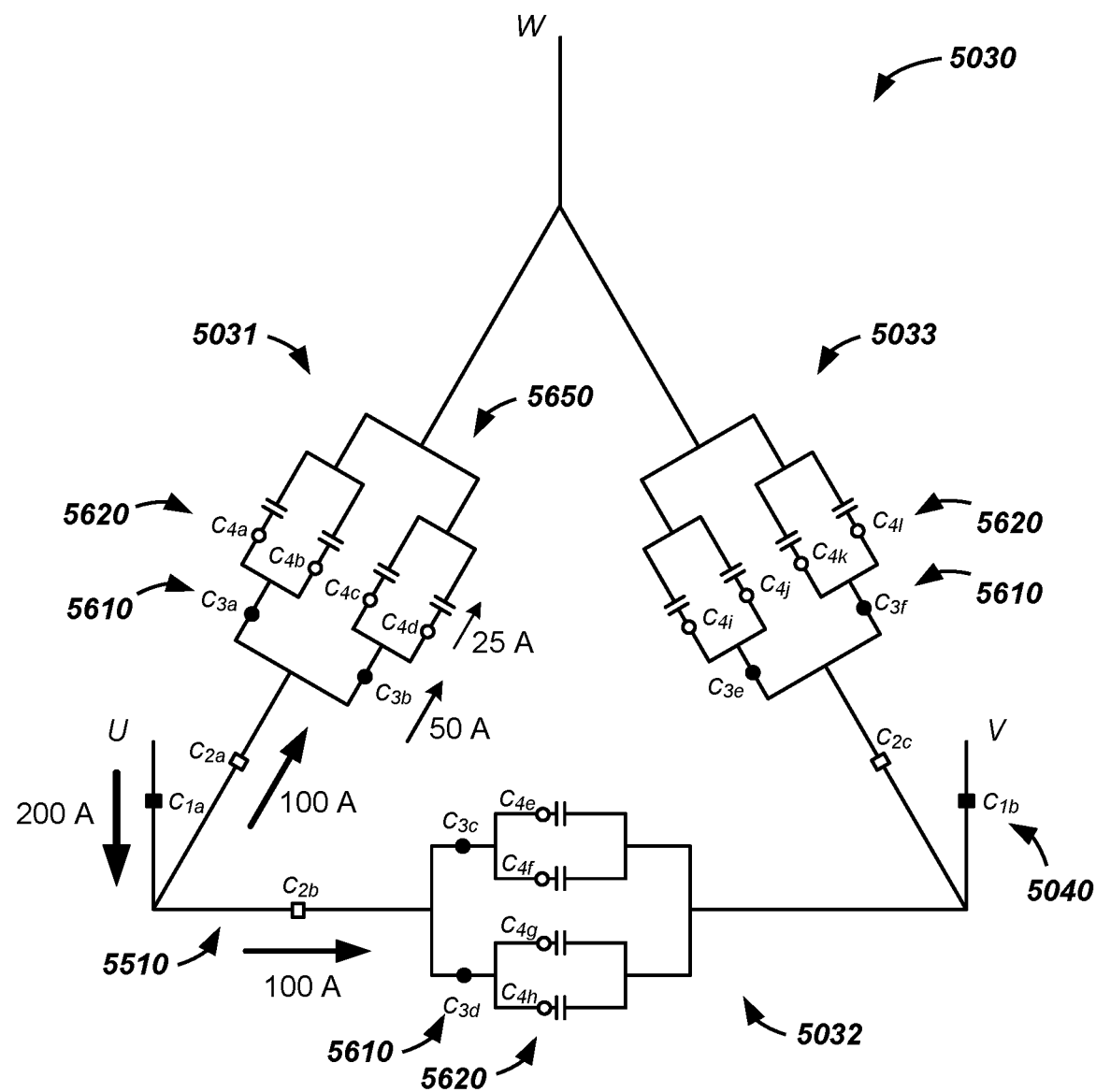
FIG. 56 illustrates a delta-circuit with parallel connectors.

In a third example, still referring to FIG. 50 and referring now to FIG. 56, as illustrated the optional main line contactors 5040 and/or the delta leg contactors 5510 are optionally and preferably replaced with parallel delta leg contactors positioned on legs of the delta circuit 5030 between the apexes of the delta circuit 5030. For instance, the first main line contactor 5041 and/or the first delta leg contactor 5511 on the UW leg 5031 of the delta circuit 5030 is optionally and preferably replaced with two parallel delta leg contactors 5610, such as a first delta leg contactor, $c_{3a}$, on the UW leg 5031 of the delta circuit 5030 and a second delta leg contactor, cab, on the UW leg 5031 of the delta circuit 5030.

Stated again, the first and second electrically parallel delta leg contactors are optionally used to replace the first main line contactor 5041, where the cost of the contactors operating on the legs of the delta circuit 5030 are reduced to $50 as a result of only having to handle 50 A within parallel electrical paths on the leg of the delta circuit as opposed $4000 contactors in the lead from the first coupled inductor-inductor pair 5001 to the delta circuit 5030, which as noted above had to handle 200 A. Similarly, the UV leg 5032 of the delta circuit 5030 is optionally and preferably alternatingly connected/disconnected using two contactors wired in parallel in the UV leg 5032, the contactors labeled $c_{3c}$ and $c_{3d}$. Similarly, the VW leg 5033 of the delta circuit 5030 is optionally and preferably alternatingly connected/disconnected using two contactors wired in parallel in the VW leg 5032, the contactors labeled $c_{3e}$ and $c_{3f}$. Again, breaking the connection of each leg with the contactors is sufficient to disconnect the delta circuit 5030 from the electrical power source 10 or load. Generally, this example illustrates that two or more contactors wired in parallel handling less current in a given leg of the delta circuit 5030 are optionally and preferably used in place of larger and more expensive contactors between a given coupled inductor—inductor pair and the delta circuit 5030, as illustrated in the first example.

Notably, in the first example each leg of the delta circuit used 100 µF capacitors, which are optionally and preferably replaced with two 50 µF capacitors in the second example and four 25 µF capacitors in the third example.

The third example is a preferred embodiment as the contactor cost per leg has reduced from $4,000 currently to $100 through use of the smaller contactors. However, in the fourth example, described infra, it is demonstrated that still smaller contactors are optionally used.

Example IV

In a fourth example, still referring to FIGS. 50 and 56, as illustrated the optional main line contactors 5040, the delta leg contactors 5510, and/or the parallel delta leg contactors 5610 are optionally replaced with a set of 2, 3, 4, or more delta contactors 5620, such as the illustrated $c_{4a}$, $c_{4b}$, $c_{4c}$, and $c_{4d}$ contactors for the UW delta leg 5031; the illustrated $c_{4e}$, $c_{4f}$, $c_{4g}$, and $c_{4h}$ contactors for the UV delta leg 5032; and the illustrated $c_{4i}$, $c_{4j}$, $c_{4k}$, and $c_{4l}$ contactors for the VW delta leg 5033. However, gains made in reduced contactor price versus labor is negligible at this point. Again, breaking the connection of each leg with the contactors is sufficient to disconnect the delta circuit 5030 from the electrical power source 10 or load.

Notably, the contactors used are separately selectable for each leg of the delta filter 5030. For instance, the delta leg contactors 5510 are optionally used on one leg of the delta filter 5030; the parallel delta leg contactors 5610 are optionally used on another leg of the delta filter 5030; and even a set of two delta contactors are optionally used in parallel with one of the parallel delta leg contactors 5610.

Filter

Figure 57:
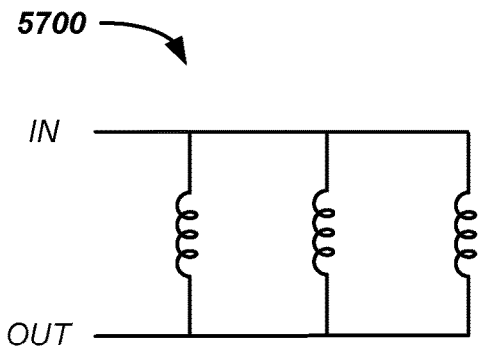
FIG. 57 illustrates parallel inductors.
Figure 58:
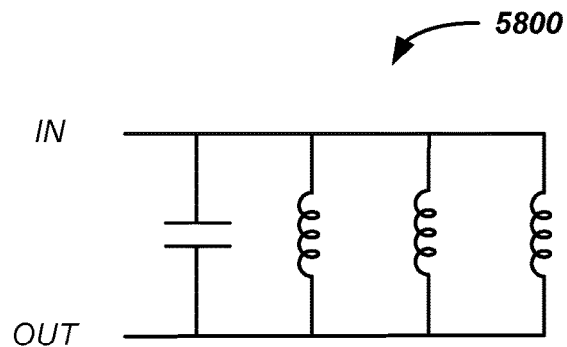
FIG. 58 illustrates a capacitor in parallel with parallel inductors.

Referring now to FIG. 57 and FIG. 58, three electrically parallel inductors are illustrated filtering current without and with a capacitor, respectively. If made with electrolytic capacitors, the circuits may require oil cooling and/or are not fully able to carry a load in the cold. For instance, for a 200 ampere current, a traditional 100 µF capacitor cannot handle higher ripple current, such as from a noisy power grid. However, if the described circuits are made with metallized film capacitors, these limitations are overcome, as further described infra. Further, magnetic flux passes between all 3-phases in the circuits illustrated in FIG. 57 and FIG. 58.

However, in the harmonic filter 500, the 3-phases, such as in the power grid, are magnetically isolated.

Metallized Film Capacitors

Figure 59A:
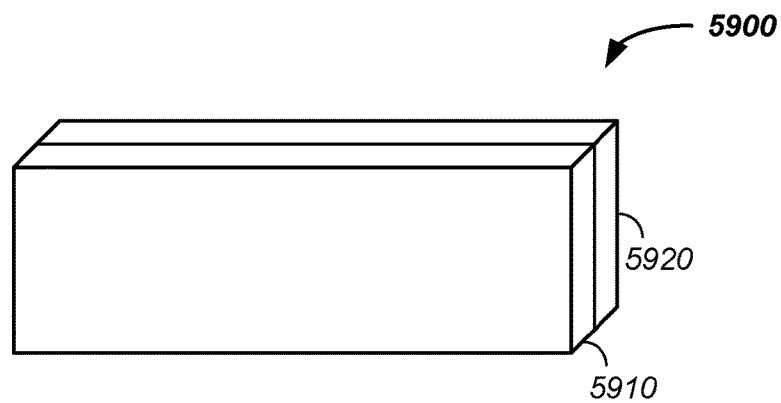
FIG. 59A and FIG. 59B illustrates a metallized film and a metallized film capacitor, respectively.
Figure 59B:
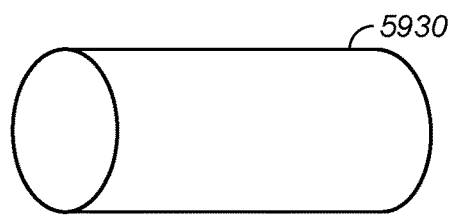

Referring now to FIG. 59A and FIG. 59B, a metallized film 5900 is illustrated. The metallized film 5900 is used to construct a metallized film capacitor 5930, which is optionally used in place of any capacitor described herein. As illustrated, the metallized film 5900 includes a metal side 5910, such as an aluminum side, and an insulator side 5920, such as a plastic side. Optionally and preferably, the harmonic filters 5000 described herein are produced with one or more metallized film capacitors. The metallized film capacitors are optionally and preferably non-electrolytic. One advantage of the metallized film capacitor 5930 is an ability to operate and/or carry 100% load in the cold, such as at less than 60, 50, 40, 30, 20, 10, 0, −10, or −20° F. Another advantage of the metallized film capacitor 5930 is ability to operate without being submersed in oil, where traditional capacitors fail at cold temperatures due to changes in the oil heat transfer properties. Still another advantage of the metallized film capacitor 5930 is the ability to handle 60 Hz current, such as at greater than 50, 60, 75, 100, or 500 amperes, such as in a polyphase power system.

Inductor Shape

Figure 60A:
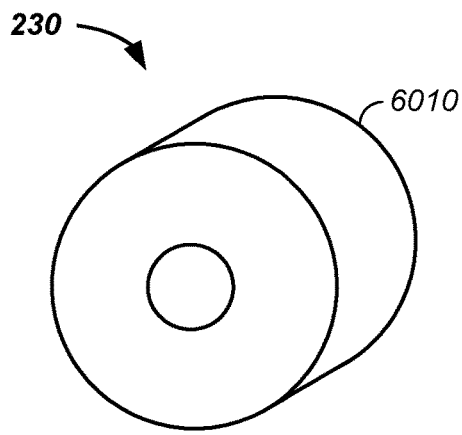
FIG. 60A illustrates a circular inductor core.
Figure 60B:
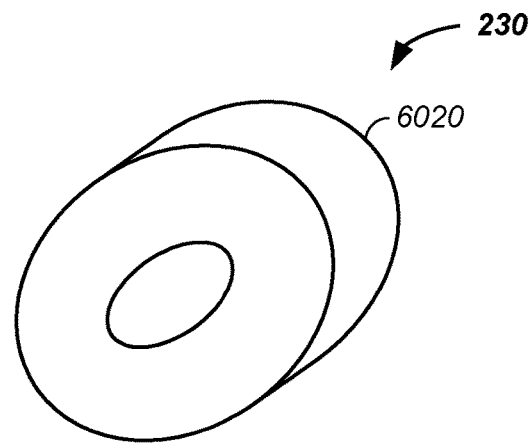
FIG. 60B illustrates an oval inductor core.
Figure 60C:
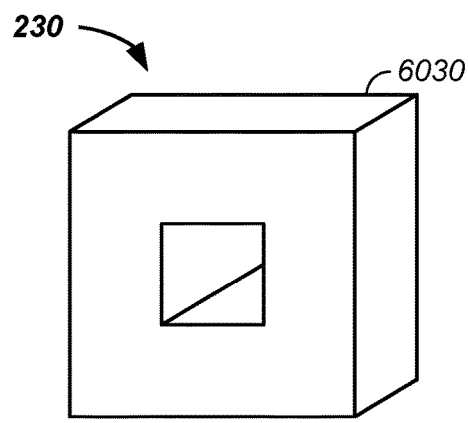
FIG. 60C illustrates a square inductor core.
Figure 60D:
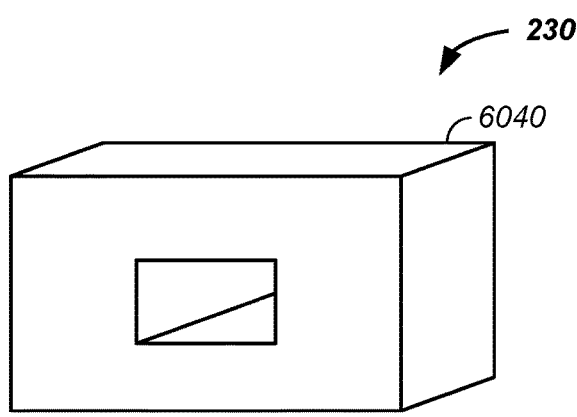
FIG. 60D illustrates a rectangular inductor core.

Referring now to FIG. 60A, FIG. 60B, FIG. 60C, and FIG. 60D, optionally and preferably any of the inductors 230 described herein are optionally constructed with any geometry circumferentially surrounding a central opening. for example, the inductor core 610 optionally has a circular cross-section 610, FIG. 60A; an oblong cross-section 6020, FIG. 60B; a square cross-section 6030, FIG. 60C; and/or a rectangular cross-section 6040, FIG. 60D, such as for one or more phases of a multi-phase power system. Generally, the inductor 230 optionally has an aperture therethrough, such as through a center of the inductor 230, where the inductor has rotational symmetry or lacks rotational symmetry. For instance, the inductor core of a circular inductor has infinite rotational symmetry, $C_\infty$ rotational symmetry, as the inductor core, is the same upon rotation about an axis passing through the center aperture without contacting the core, such as along a z-axis passing through an annular inductor laying on its face. Similarly, an oval inductor core and/or a rectangular core has $C_2$ rotational symmetry; a triangular inductor core has $C_3$ rotational symmetry; a square inductor core has $C_4$ rotational symmetry; and so on, where rotational symmetry results in an object looking the same with rotation about an axis.

Mechanically Fabricated Winding

Figure 61:
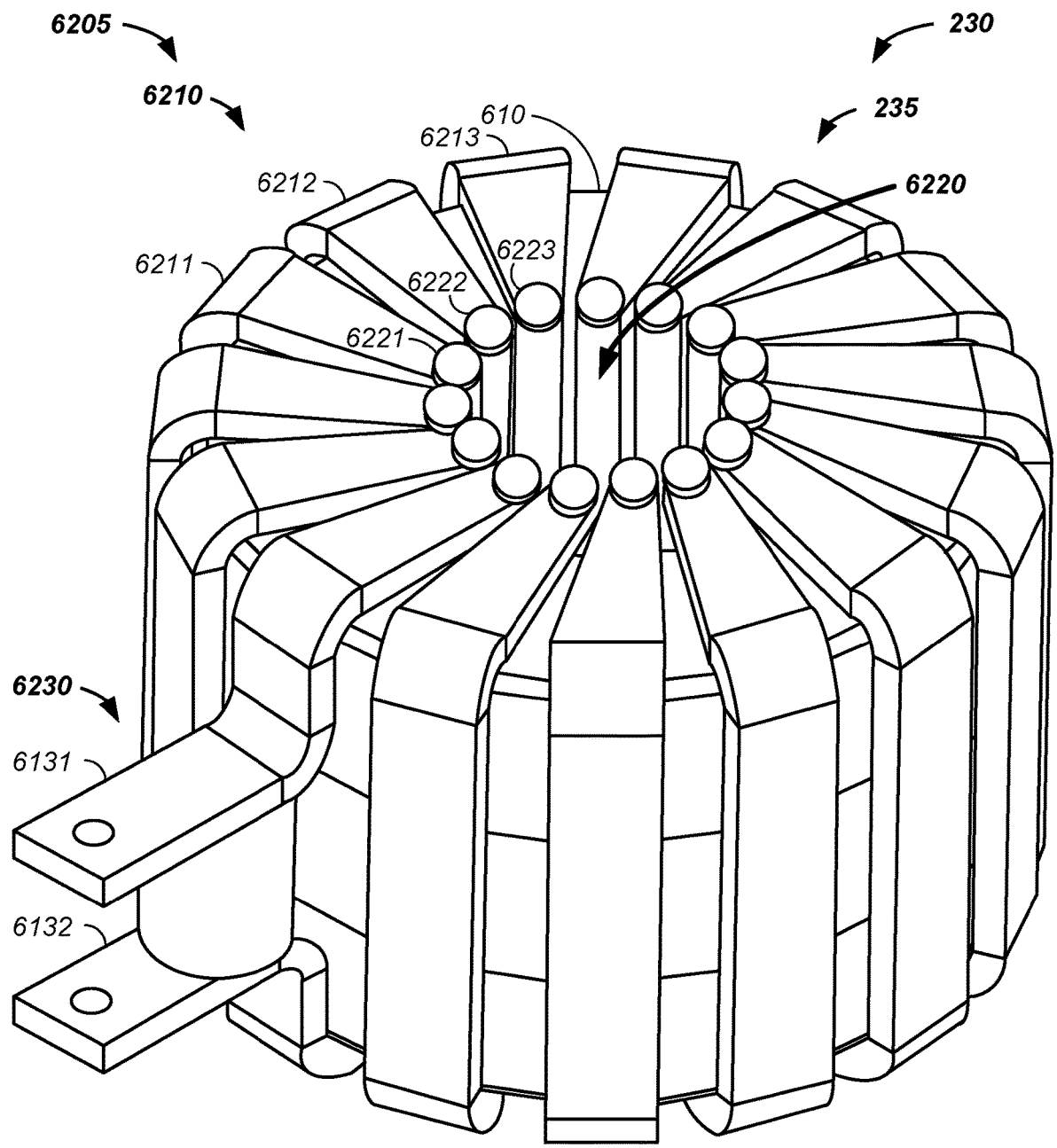
FIG. 61 illustrates mechanically joined/fabricated windings.

Referring now to FIG. 61, an inductor 230 with a mechanically assembled winding 6205 is illustrated about an inductor core 610. Herein, an assembly using the mechanically assembled winding 6205 about the inductor core 610 is referred to as an inductor 230 and/or a mechanically fabricated inductor 235.

Still referring to FIG. 61, manufacture of the mechanically fabricated inductor 235 is described. In a traditional toroidal inductor 230, a winding is a continuous wire, where each turn of the continuous wire is passed through the central opening 310 during manufacture, which is a time consuming process. In stark contrast, in the mechanically fabricated inductor 235, a winding is not a continuous wire. Rather, each one or more turns of the mechanically assembled winding is put together from sections, such as sections attached to each other in a fabrication step as opposed to a continuous length of wire. For clarity of presentation and without loss of generality, as illustrated, each mechanically assembled turn, of the mechanically assembled winding 6205, is illustrated as a first part 6210, such as a C-section, that is mechanically fastened to a second part 6220, such as a rod-section. However, more generally each mechanically assembled turn, of the mechanically assembled winding 6205, optionally and preferably includes greater than 1, 2, 3, 4, 5, or more sections that are fastened together, such as via a bolt, a weld, plugs, clips, and/or formation of one or more electrical connections. Several examples are provided to clarify the manufacture of the mechanically fabricated inductor 235 and/or the structure of the mechanically fabricated inductor 235.

Example I

Figure 62D:
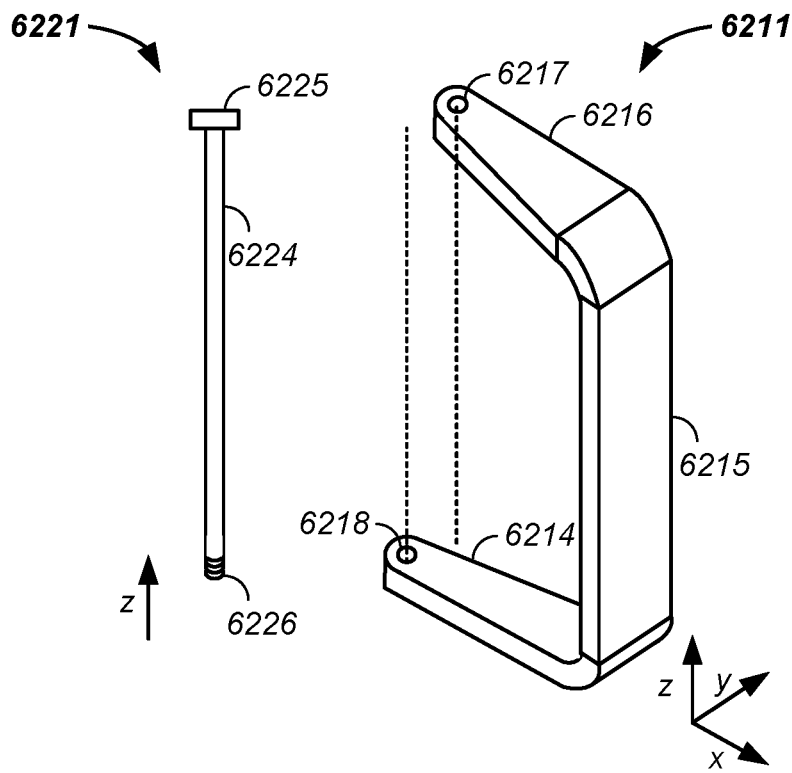
FIG. 62D illustrates a winding terminal connector.
Figure 62D:
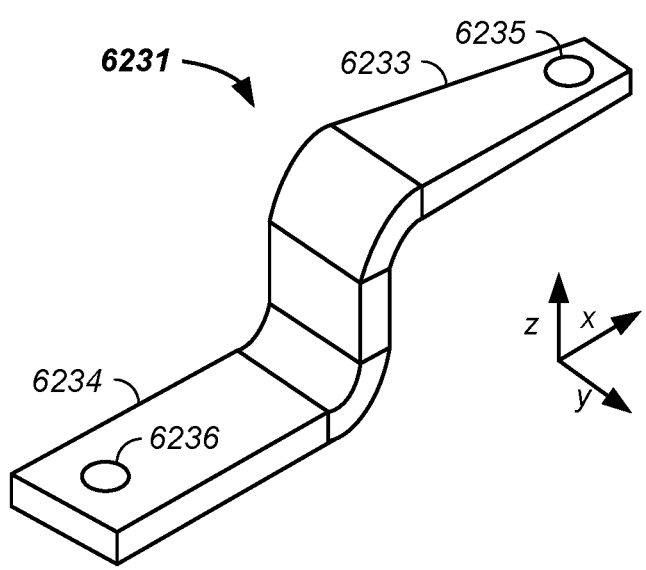

Still referring to FIG. 61 and referring now to FIG. 62A, FIG. 62B, and FIG. 62C, the mechanically assembled winding 6205 is further described. In this example, the mechanically assembled winding 6205 includes two sets of parts: a first set of first parts 6210 and a second set of second parts 6220. More particularly, in this example, the first set of first parts 6210 includes a first C-section 6211, a second C-section 6212, and a third C-section 6213 of n C-sections. Similarly, the second set of second parts 6220 includes a first rod-section 6221, a second rod-section 6222, and a third rod-section 6223 of n rod-sections, where n is a positive integer of greater than 0, 1, 2, 3, 5, 10, 15, 20, 25, 30, 40, or 50. As illustrated in FIG. 61, during assembly the first C-section 6211 is fastened to the first rod-section 6221, such as with any fastening/electrical connection technique. As illustrated in FIG. 62B, each of the C-sections are twisted to allow a first coupling end 6214 of the C-section to connect to a first rod-section, such as the first rod-section 6221, and a second coupling end 6216 of the C-section to connect to a second rod-section, such as the second rod-section 6222. Hence, referring again to FIG. 61, the second C-section 6212 connects to the first rod-section 6221 on the bottom (out of view as illustrated) and to the second rod section 6222 on the top of the inductor core 610. Similarly, the third C-section 6213 connects to the second rod-section 6222 on the bottom (out of view as illustrated) and to the third rod section 6223 on the top of the inductor core 610. This process repeats until the terminal connector sections are reached, as further described infra. More generally, each turn of the mechanically assembled winding 6205 is created from two or more parts that are fastened together to form electrical connections. Referring again to FIG. 62A and FIG. 62B, as illustrated the first rod-section 6221 optionally and preferably contains a rod 6224 that is threaded 6226 for insertion into a tapped hole 6218 of the first coupling end 6214 and a bolt head 6225 for attaching/screwing in, through the rotationally previous C-section second coupling end 6216, the rod 6224 to the tapped hole 6218, where the first coupling end 6214 and the second coupling end 6216 are separated by a relief section 6215. Referring still to FIG. 61 and referring now to FIG. 62C, at the electrical ends of the formed mechanically assembled winding 6205, connectors 6230 are used to connect to input and output lines, such as a via a first connector 6131 connecting to an input and a second connector 6132 connecting to an output. Notably, the input connector 6131 and the output connector 6132 are optionally the same shape, which eases manufacturing the component parts, and are simply flipped during fabrication of the mechanically assembled winding 6205. As illustrated, the input connector 6131 optionally and preferably contains a connector section 6234 with a fastener aperture and/or tapped hole 6236 therein and a winding connector section 6233 and an aperture therethrough, such as for passage of the bolt section/rod 6224 therethrough.

Example II

Still referring to FIG. 61, optionally and preferably each turn of the mechanically assembled winding 6205 is fabricated from at least a first part 6210 and a second part 6220 of n parts where the first and second parts 6210, 6220 are joined to form an electrical connection within the winding, such as via cold welding, joining, welding, electrically joining, and/or a mechanical connection, such as bolting together. The electrical connection is optionally one or more of: a light duty connector for up to 250 volts; a medium duty connector for up to 1000 volts; and a heavy duty connector for up to 300,000 volts. Optionally and preferably, a workstation and/or a multiple part holding guide is used to weld multiple connections at the same time, such as one or more electrical connection per turn.

Example III

Still referring to FIG. 61, the mechanically assembled winding 6205 is constructed of aluminum and/or at least 80, 90, 95, or 99% aluminum, an aluminum alloy, or copper. The winding wire is optionally painted or coated with any coating, such as a rubber coating, a plastic coating, or an anodization.

The mechanically assembled winding 6205 is optionally and preferably used with any system described herein, such as in the inductor in a tube system 6300 described infra.

Inductors in a Tube

Referring now to FIG. 63A, FIG. 63B, and FIG. 63C, an inductor in a tube 6300 system is described. Referring now to FIG. 63A, an elongated tube 6310 forms a housing. Two or more, and preferably three inductors are mounted on a multi-inductor baseplate 6320, such as the baseplate 210. As illustrated in FIG. 63B, a first inductor 237, a second inductor 238, and a third inductor 239 are vertically mounted to the multi-inductor baseplate 6329, such as with the vertical mounting and/or strap tie systems described supra. For example, the first inductor 237, or any inductor, is fastened to the multi-inductor baseplate 6320 prior to insertion into the elongated tube 6310, such as with a vertical mounting tiedown strap 6323 and/or a bolt and clamp mechanism, such as the clamp bar 234/ties 315 combination described supra. Optional spacers 6340 are used to maintain a distance between the inductors. Optionally and preferably, the elongated tube 6310 is longitudinally divided/separated by an elongated gap 6316 and/or the multi-inductor baseplate 6320 running along the length of the elongated tube 6310 into a first section 6312, such as a first half, and a second section 6314, such as a second half. The elongated separations allows mounting of the inductors on the multi-inductor baseplate 6320 followed by placing the parts of the elongated tube 6310 around the inductor/baseplate assembly. Particularly, bringing the elongated tube 6310 together along the y- and/or the z-axes, where the length of the tube is the x-axis, allows for the electrical connections to a three phase power supply to be accessible, such as illustrated in FIG. 63C. Particularly, as illustrated a first pair of contactors 6331 connected to the first inductor 237; a second pair of contactors 6332 connected to the second inductor 238; and a third pair of contactors 6333 connected to the first inductor 239, which would otherwise block insertion of the inductors into the elongated tube 6310 are: (1) insertable as a result of bringing the elongated tube 6310 together laterally and/or (2) accessible for connection to the multi-phase grid. Optionally, the multi-inductor baseplate 6320 is positioned within the elongated tube 6310 or is used as a separator between the first section 6312 and the second section 6314. Optionally, one or more straps 6350 or connectors are used to fasten the first section 6312 to the second section 6314, such as after insertion of the first inductor 237, the second inductor 238, the third inductor 239, and/or the multi-inductor baseplate 6320. Optionally and preferably, an element of the cooling system 240, such as a fan 242 is inserted into the elongated tube 6310, such as with or without mounting to the multi-inductor baseplate. The fan 242 is optionally attached to an end of the elongated tube 6310, such as after bringing the tube sections together to form the tube. More generally, the elongated tube is optionally bent or formed in any elongated shape, such as greater than 80% of a circle. Further, the elongated gap 6316 is optionally an opening that allow insertion of the multi-inductor baseplate 6320 and/or one or more inductors mounted on the baseplate. In this case, the apertures are optionally through a side of the elongated tube 6310 other than where the elongated gap is present. Further, the elongated tube is optionally of any cross-sectional shape, such as oblong, square, or rectangular.

Example I

In a first example, still referring to FIG. 63A, FIG. 63B, and FIG. 63C, ten inch diameter inductors are placed in a twelve inch diameter elongated tube and a two inch slot is cut in the tube for insertion of the multi-inductor baseplate 6320. Optionally, a gap between an outer perimeter of the inductors and the elongated tube of less than 4, 3, 2, 1, or 0.5 inches facilitates cooling airflow from the fan past the inductors.

Example II

In a second example, one or more elements of the harmonic filter 5000 and/or the sine wave filter 3850 are positioned in the elongated tube 6310.

Hip Box

Figure 64A:
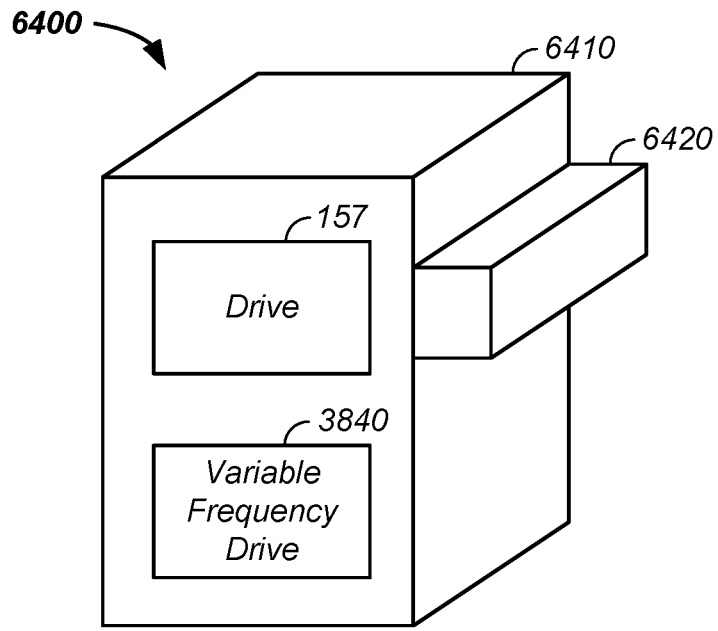
FIG. 64A illustrates a hip cabinet on a drive cabinet and FIG. 64B illustrates accessible inductor filter connectors in the hip cabinet.
Figure 64B:
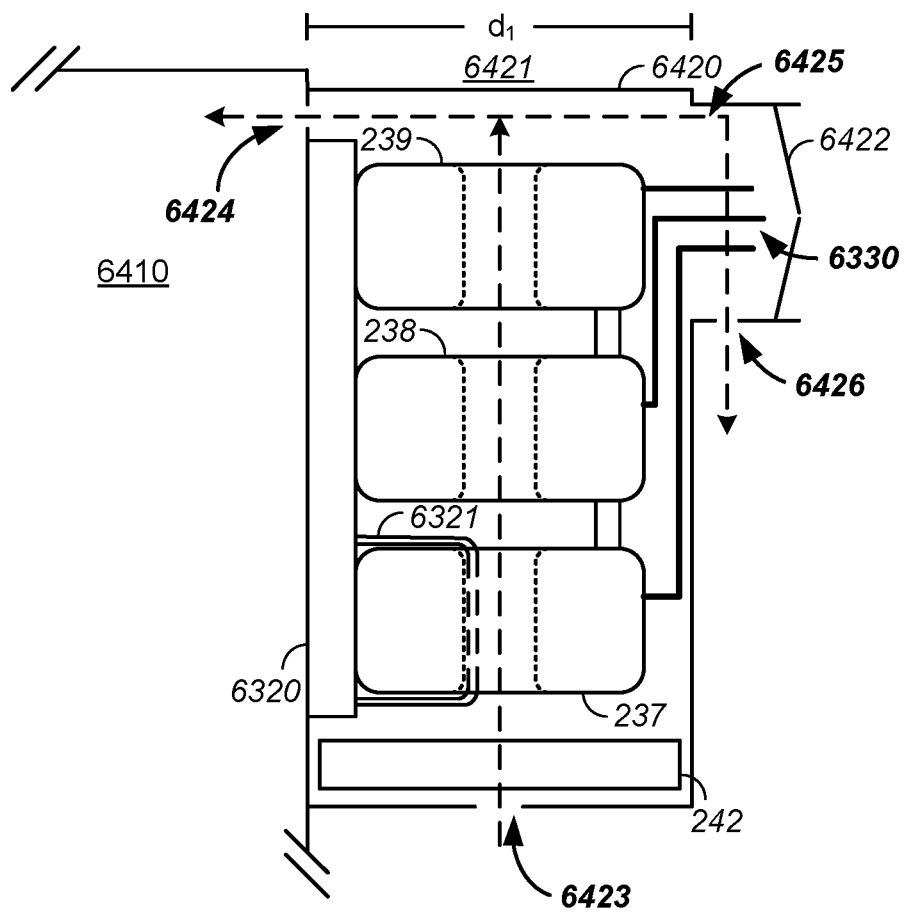

Referring now to FIG. 64A and FIG. 64B, a hip box system 6400 is described. Generally, a drive cabinet 6410 holds a drive 157, such as a variable frequency drive 3840. Traditionally, the filter system was mounted in the drive cabinet 6410, which leads to complications in terms of weight, space, and particularly cooling. The inventors have added a hip box 6420 to the drive cabinet 6410. Optionally and preferably, the hip box 6420 is mounted to a side of the drive cabinet 6410, such as at an accessible height of 3 to 7 feet off of the floor. Any of the filter systems described herein are optionally and preferably mounted in the hip box 6420.

Example I

In a first example, the hip box 6420 houses the inductor in a tube 6300 system, described supra. In this embodiment, the first, second, and third inductors 237, 238, 239 are mounted vertically with the fan 242 pushing air through the inductors. Optionally, the fan 242 pushes air out of a top of the hip box. However, optionally and preferably, air exits are out to the drive cabinet 6410 and/or out an access panel 6422 access door and/or access panel vent 6426, where less than 20, 10, 5, 2, or 1 percent of the air flow from the fan exits into an volume 6421 directly above the hip box 6420. As illustrated, electrical connection lines 6330, such as to the first, second, and third pair of contactors 6331, 6332, 6333 connected to the first, second, and third inductors 237, 238, 239 are accessible through the access panel 6422/access door, which is optionally about five±one or two feet off of the ground. As illustrated, the filter system is accessible without accessing the drive cabinet 6410 and a first cooling system of the filter system is optionally separate from a second cooling system of the drive cabinet.

Optionally, any element of the inductor, such as a winding element is printed using three-dimensional metal printing technology, such as in an additive manufacturing process.

Optionally, any element of the inductor is constructed with a carbon nanotube.

Herein, a set of fixed numbers, such as 1, 2, 3, 4, 5, 10, or 20 optionally means at least any number in the set of fixed number and/or less than any number in the set of fixed numbers.

In still yet another embodiment, the invention comprises and combination and/or permutation of any of the elements described herein.

The particular implementations shown and described are illustrative of the invention and its best mode and are not intended to otherwise limit the scope of the present invention in any way. Indeed, for the sake of brevity, conventional manufacturing, connection, preparation, and other functional aspects of the system may not be described in detail. While single PWM frequency, single voltage, single power modules, in differing orientations and configurations have been discussed, adaptations and multiple frequencies, voltages, and modules may be implemented in accordance with various aspects of the present invention. Furthermore, the connecting lines shown in the various figures are intended to represent exemplary functional relationships and/or physical couplings between the various elements. Many alternative or additional functional relationships or physical connections may be present in a practical system.

In the foregoing description, the invention has been described with reference to specific exemplary embodiments; however, it will be appreciated that various modifications and changes may be made without departing from the scope of the present invention as set forth herein. The description and figures are to be regarded in an illustrative manner, rather than a restrictive one and all such modifications are intended to be included within the scope of the present invention. Accordingly, the scope of the invention should be determined by the generic embodiments described herein and their legal equivalents rather than by merely the specific examples described above. For example, the steps recited in any method or process embodiment may be executed in any order and are not limited to the explicit order presented in the specific examples. Additionally, the components and/or elements recited in any apparatus embodiment may be assembled or otherwise operationally configured in a variety of permutations to produce substantially the same result as the present invention and are accordingly not limited to the specific configuration recited in the specific examples.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

Although the invention has been described herein with reference to certain preferred embodiments, one skilled in the art will readily appreciate that other applications may be substituted for those set forth herein without departing from the spirit and scope of the present invention. Accordingly, the invention should only be limited by the Claims included below.

The invention claimed is:

1. An apparatus, comprising:
   a harmonic filter comprising:
     a delta circuit comprising:
       a first leg connecting to a second leg and a third leg, first circuitry on said first leg matching second circuitry on said second leg, said first circuitry comprising at least two contactors electrically wired in parallel, said harmonic filter magnetically isolating phases of three-phase power.

2. The apparatus of claim 1, said first circuitry comprising:
   at least four contactors electrically wired in parallel.

3. The apparatus of claim 1, said first circuitry further comprising:
   at least two capacitors electrically wired in parallel.

4. The apparatus of claim 3, said first circuitry comprising:
   at least four capacitors electrically wired in parallel.

5. The apparatus of claim 4, a first capacitor of said at least four capacitors further comprising:
   a rolled metallized film construction.

6. The apparatus of claim 1, said delta circuit further comprising:
   a first inductor—coupled inductor pair connected to a first apex of said delta circuit, said first inductor of said first inductor—coupled inductor pair comprising an aperture therethrough, non-infinite rotational symmetry, and at least one of:
     no rotational symmetry;
     $C_2$ rotational symmetry;
     $C_3$ rotational symmetry; and
     $C_4$ rotational symmetry;
   a second inductor—coupled inductor pair connected to a second apex of said delta circuit; and
   a third inductor—coupled inductor pair connected to a third apex of said delta circuit.

7. The apparatus of claim 1, further comprising:
   second circuitry on said third leg not matching said first circuitry.

8. The apparatus of claim 1, further comprising:
   a first electrical contactor and a second electrical contactor positioned within at least two of: said first leg, said second leg; and said third leg.

9. The apparatus of claim 1, said delta circuit further comprising:
   a first inductor coupled to a first apex of said delta circuit, said first inductor comprising:
     a fabricated winding comprising a plurality of turns, at least a first turn of said plurality of turns comprising:
       a first sub-section and a second sub-section electrically connected to said first sub-section with a first electrical connection;
   a second inductor coupled to a second apex of said delta circuit; and
   a third inductor coupled to a third apex of said delta circuit.

10. The apparatus of claim 1, said harmonic filter further comprising:
    at least one inductor electrically coupled to said delta circuit, said inductor comprising a pressed powder core, said core comprising an aperture therethrough.

11. The apparatus of claim 1, said harmonic filter further comprising:
    at least one inductor electrically coupled to said delta circuit, said inductor comprising an inductor core and an inductor winding, said inductor winding comprising:
      a first winding wire, comprising:
        a width extending away from said inductor core;
        an inductor core contact side comprising a height; and
        a width-to-height ratio of at least three.

12. A method for processing three-phase power, comprising the step of:
 filtering the three-phase power with a harmonic filter comprising:
  a delta circuit comprising:
   a first inductor—coupled inductor pair linked to a first apex of said delta circuit;
   a second inductor—coupled inductor pair linked to a second apex of said delta circuit;
   a third inductor—coupled inductor pair linked to a third apex of said delta circuit;
  a first leg connecting to a second leg and a third leg; and
  first circuitry on said first leg matching second circuitry on said second leg, said first circuitry comprising at least two contactors electrically wired in parallel.

13. The method of claim 12, said harmonic filter further comprising the steps of:
 magnetically isolating a first phase from a second phase and a third phase of the three phase electrical power with said harmonic filter; and
 magnetically isolating the second phase from the third phase of the three phase electrical power with said harmonic filter.

14. The method of claim 13, further comprising the step of:
 wiring said first circuitry with a first capacitor and a second capacitor electrically coupled in parallel.

15. The method of claim 14, further comprising the step of:
 alternatingly connecting and disconnecting said delta circuit from the three phase power by opening and closing a first electrical contactor and a second electrical contactor positioned within at least two of: said first leg, said second leg; and said third leg.

16. The method of claim 14, further comprising the step of:
 filtering noise in a phase of the three-phase power with a first capacitor and a second capacitor wired in parallel within said first leg of said delta circuit.

17. The method of claim 14, said step of further comprising the step of:
 passing current of the three-phase power along a winding about said first inductor of said first inductor—coupled inductor pair, said winding comprising at least ten electrical connections formed between winding sections during a winding step of said first inductor.

18. The method of claim 12, further comprising the steps of:
 mounting inductors of said harmonic filter on a first rack and a second rack in a cabinet,
  wherein first apertures of a first three inductors, of said harmonic filter, form a first triangle on said first rack;
  wherein second apertures of a second three inductors, of said harmonic filter, form a second triangle on said second rack, first apexes of said first triangle rotated by at least twenty degrees relative to second apexes of said second triangle; and
 flowing air, driven by a fan, through said cabinet.

\* \* \* \* \*